United States Patent
Abelson et al.

(10) Patent No.: US 10,103,057 B2
(45) Date of Patent: Oct. 16, 2018

(54) USE OF AN INHIBITOR MOLECULE IN CHEMICAL VAPOR DEPOSITION TO AFFORD DEPOSITION OF COPPER ON A METAL SUBSTRATE WITH NO DEPOSITION ON ADJACENT SIO2 SUBSTRATE

(71) Applicant: The Board of Trustees of the University of Illinois, Urbana, IL (US)

(72) Inventors: John Abelson, Urbana, IL (US); Shaista Babar, Hillsboro, OR (US); Elham Mohimi, Urbana, IL (US); Gregory Girolami, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 14/937,790

(22) Filed: Nov. 10, 2015

(65) Prior Publication Data

US 2016/0148839 A1    May 26, 2016

Related U.S. Application Data

(60) Provisional application No. 62/078,139, filed on Nov. 11, 2014.

(51) Int. Cl.
*H01L 21/76*   (2006.01)
*H01L 21/768*   (2006.01)
(Continued)

(52) U.S. Cl.
CPC ........ *H01L 21/76879* (2013.01); *C23C 16/04* (2013.01); *C23C 16/18* (2013.01);
(Continued)

(58) Field of Classification Search
CPC ......... H01L 21/76876; H01L 21/76879; C23C 16/0272
See application file for complete search history.

(56) References Cited

U.S. PATENT DOCUMENTS 5,654,245 A    8/1997 Allen
5,851,367 A    12/1998 Nguyen et al.
(Continued)

FOREIGN PATENT DOCUMENTS

EP    0 989 203    3/2000

OTHER PUBLICATIONS

Norman et al."New OMCVD precursors for selective copper metallization," IEEE, VMIC conference, Jun. 11-12, 1991, pp. 123-129.*

(Continued)

*Primary Examiner* — Julia Slutsker
(74) *Attorney, Agent, or Firm* — Leydig, Voit & Mayer, Ltd.

(57) ABSTRACT

Provided herein are methods for selectively forming layers of metal films on one portion of a substrate while leaving adjacent portions of the substrate uncoated. The methods provide for selectively depositing metal films on a conductive surface, such as ruthenium oxide, disposed on or near an insulating portion of the substrate, such as a silicon dioxide ($SiO_2$) surface. The invention provides methods to simultaneously contact the substrate surface with both the precursor gas and the inhibitor agent leading to the selective formation of metal nuclei on the conductive portion of the substrate. In the methods described, nuclei are selectively formed by a disproportionation reaction occurring on the conductive portion of the substrate but not on the insulating portion of the substrate.

59 Claims, 28 Drawing Sheets

(51) Int. Cl.
H01L 21/285 (2006.01)
C23C 16/04 (2006.01)
C23C 16/18 (2006.01)

(52) U.S. Cl.
CPC .. *H01L 21/28562* (2013.01); *H01L 21/76876* (2013.01); *H01L 21/76885* (2013.01)

(56) References Cited

U.S. PATENT DOCUMENTS

| | | | |
|---|---|---|---|
| 6,110,530 | A | 8/2000 | Chen et al. |
| 6,245,655 | B1 | 6/2001 | Moslehi |
| 6,391,769 | B1* | 5/2002 | Lee .................... H01L 21/28562 257/750 |
| 7,041,596 | B1* | 5/2006 | Dalton ................. C23C 16/0245 257/E21.17 |
| 7,592,254 | B2 | 9/2009 | Abelson et al. |
| 7,943,527 | B2 | 5/2011 | Kumar et al. |
| 8,110,503 | B2 | 2/2012 | Kumar et al. |
| 8,362,220 | B2 | 1/2013 | Girolami et al. |
| 8,846,146 | B2* | 9/2014 | Abelson .............. C23C 16/0272 427/248.1 |
| 2005/0233562 | A1 | 10/2005 | Adetutu et al. |
| 2009/0166867 | A1* | 7/2009 | Simka ................ H01L 21/76831 257/751 |
| 2012/0107503 | A1* | 5/2012 | Abelson .............. C23C 16/0272 427/255.7 |

OTHER PUBLICATIONS

Abelson (Nov. 12, 2014) "Utilizing Inhibitor Molecules in Low Temperature CVD to Control Thin Film Nucleation, Surface Morphology and Conformality in Deep Features," In; The 61$^{st}$ AVS International Symposium & Exhibition. Baltimore, MD.
Alshwawreh et al. (2010) "Recrystallization of Electrodeposited Copper Thin Films During Annealing," Journal of Electronic Materials. 39:2476-2482.
Au et al. (Mar. 17, 2011) "Filling Narrow Trenches by Iodine-Catalyzed CVD of Copper and Manganese on Manganese Nitride Barrier/Adhesion Layers," Journal of the Electrochemical Society. 158:D248-D253.
Awaya et al. (1995) "The Effect of Adding Hexafluoroacetylacetone on Chemical Vapor Deposition of Copper Using Cu(I) and Cu(II) Precursor Systems," Journal of the Electrochemical Society. 142:3173-3179.
Babar et al. (Apr. 8, 2015) "Surface-Selective Chemical Vapor Deposition of Copper Films through the Use of a Molecular Inhibitor," ECS J. Solid State Sci. Technol. 4(7):N60-N63.
Babar et al. (Feb. 18, 2013) "Growth Inhibitor to Homogenize Nucleation and Obtain Smooth HfB2 Thin Films by Chemical Vapor Deposition," Chem. Mater. 25:662-667.
Babar et al. (Mar. 11, 2014) "Chemical Vapor Deposition of Copper: Use of a Molecular Inhibitor to Afford Uniform Nanoislands or Smooth Films," ECS J. Solid State Sci. and Tech. 3(5):Q79-Q83.
Babar et al. (Sep. 9, 2014) "Role of nucleation layer morphology in determining the statistical roughness of cvd-grown thin films," J. Vac. Sci. Technol. A. 32:060601.
Bales et al. (1991) "Macroscopic model for columnar growth of amorphous films by sputter deposition," J. Vac. Sci. Technol. A. 9:145-149.
Basa et al. (1998) "Atomic force microscopy and ellipsometry study of the nucleation and growth mechanism of polycrystalline silicon films on silicon dioxide," J. Vac. Sci. Technol. A. 16, 2466 (1998).
Caro et al. (Jun. 2013) "Selective self-assembled monolayer coating to enable Cu-to-Cu connection in dual damascene vias," Microelectronic Engineering. 106:76-80.
Chan et al. (2007) "Plasmonic Properties of Copper Nanoparticles Fabricated by Nanosphere Lithography," Nano Letters. 7:1947-1952.

Chang et al. (2004) "Influence of surface additives iodine and indium on the initial growth in copper chemical vapor deposition," Appl. Surf. Sci. 236:165-174.
Chi et al. (1997) "Lewis Base Adducts of 1,1,1,5,5,5-Hexafluoro-2,4-Pentandionato-Copper(I) Compounds," Inorg. Syn. 31:289-294.
Chiou et al. (1995) "The Processing Windows for Selective Copper Chemical Vapor Deposition from Cu(hexafluoroacetylacetonate)trimethylvinylsilane," J. Electrochem. Soc. 142:177-182.
Choi et al. (2002) "Effect of the neutral ligand (L) on the characteristics of hexafluoroacetylacetonate (hfac)Cu(I)-L precursor and on the copper deposition process," Thin Solid Films. 409:147-152.
Chung et al. (2001) "Adsorption and chemical reaction of Cu(hfac)(vtms) on Cu(111)," Surface Science. 482:312-317.
Dubois et al. (1992) "Selectivity and copper chemical vapor deposition," Journal of the Electrochemical Society. 139:3295-3299 (1992).
El-Kady et al. (2000) "Metallic photonic crystals at optical wavelengths," Physical Review B. 62:15299.
Farkas et al. (1993) "Etching of copper and copper oxide at high rates via generation of volatile copper species," Materials Science and Engineering B-Solid State Materials for Advanced Technology. 17:93-96.
Friese et al. (1997) "Influence of processing parameters on the selectivity in a CVD-process of copper using Cu(I)(hfac)(TMVS)," Microelectron. Eng. 37-38:157-163.
Gadkari et al. (2005) "Comparison of the agglomeration behavior of thin metallic films on $SiO_2$," J. Vac. Sci. Technol. A. 23:1152-1161.
Gelest "Copper(I)/(II) Hexafluoro-2,4-Pentanedionate—Vinyltrimethylsilane Complex," Gelest, Inc. Accessible on the Internet at URL: shop.gelest.com/Product.aspx?catnum=AKC252. 8&Index=0&TotalCount=31. [Last Accessed Jan. 12, 2016].
George et al. (1995) "Erratum: 'Reaction of 1,1,1,5,5,5-Hexafluoro-2,4-pentanedione (H+hfac) with CuO, $Cu_2O$, and Cu Films' [J. Electrochem. Soc., 142, 961 (1995)]," J. Electrochem. Soc. 142.
George et al. (1995) "Reaction of 1,1,1,5,5,5-Hexafluoro-2,4-pentanedione (H+hfac) with CuO, $Cu_2O$, and Cu Films," J. Electrochem. Soc. 142:961-965.
Girolami et al. (1993) "Mechanistic studies of copper thin-film growth from CuI and CuII beta-diketonates," J. Am. Chem. Soc. 115:1015-1024.
Gladfelter (1993) "Selective metalization by chemical vapor deposition," Chemistry of Materials. 5:1372-1388.
Greef et al. (1990) "Ellipsometric and electrochemical characterisation of the nucleation of mercury on glassy carbon," J. Electroanal. Chem. 280:283-296.
Hampden-Smithet al. (1994) "Chemical Vapor Deposition of Metals: Part 2. Overview of Selective CVD of Metals," Chem. Vap. Deposition. 1(2):39-48 (1995).
Hashemi et al. (May 2, 2014) "A New Resist for Area Selective Atomic and Molecular Layer Deposition on Metal—Dielectric Patterns," J. Phys. Chem. C.118:10957-10962.
Huang et al. (Sep. 9, 2014) "Area-Selective Ald of $TiO_2$ Nanolines with Electron-Beam Lithography," J. Phys. Chem. C. 118:23306-23312.
Hwang et al. (2000) "Surfactant-Assisted Metalorganic CVD of (111)-Oriented Copper Films with Excellent Surface Smoothness," Electrochemical and Solid State Letters. 3:138-140.
Jain et al. (1992) "Control of Selectivity During Chemical Vapor Deposition of Copper From Copper (I) Compounds Via Silicon Dioxide Surface Modification," App. Phys. Lett. 61:2662-2664.
Jain et al. (1996) "Chemical Vapor Deposition of Copper from (hfac)CuL (L = VTMS and 2-Butyne) in the Presence of Water, Methanol, and Dimethyl Ether," Chemistry of Materials. 8:1119-1127.
Jayaraman et al. (2005) "Hafnium diboride thin films by chemical vapor deposition from a single source precursor," J. Vac. Sci. Technol. A. 23:1619-1625.
Jeon et al. (1997) "Additive fabrication of integrated ferroelectric thin-film capacitors using self-assembled organic thin-film templates," Advanced Materials. 9:891-895.

(56) References Cited

OTHER PUBLICATIONS

Jeon et al. (1997) "Selective Chemical Vapor Deposition of Platinum and Palladium Directed by Monolayers Patterned Using Microcontact Printing," Langmuir. 13:3833-3838.

Josell et al. (2002) "Superconformal Deposition by Surfactant-Catalyzed Chemical Vapor Deposition," Electrochemical and Solid State Letters. 5:C44-C47.

Josell et al. (2003) "Interconnect Fabrication by Superconformal Iodine-Catalyzed Chemical Vapor Deposition of Copper," J. Electrochem. Soc. 150:C368-C373.

Joulaud et al. (2002) "Evaluation of (hfac)cu(mhy) for cucvd," Microelectronic Engineering. 64:107-115.

Joulaud et al. (2003) "Structural Comparison Between Cu(hfac)(VTMS) and Cu(hfac)(MHY): An Answer to Differences in Copper Film Deposition," In; The Proceedings of the Electrochemical Society. 2003-08:1268-1274.

Kim et al. (1994) "Selective deposition of copper by chemical vapor deposition using $Cu(HFA)_2$," J. Vac. Sci. Technol. A. 12:153-157.

Kim et al. (1998) "Deposition mechanism of MOCVD copper films in the presence of water vapor," Thin Solid Films. 330:190-195.

Kim et al. (2007) "Comparative study of cu-cvd seed layer deposition on ru and to underlayers," Journal of the Electrochemical Society. 154:G13-G17.

Kim et al. (2008) "Ultrathin CVD Cu Seed Layer Formation Using Copper Oxynitride Deposition and Room Temperature Remote Hydrogen Plasma Reduction," Journal of the Electrochemical Society. 155, H496-H503.

Kodas et al. (1991) "Selective low-temperature chemical vapor deposition of copper from (hexafluoroacetylacetonato)copper(I)trimethylphosphine, $(Hfa)CuP(Me)_3$," Advanced Materials. 3:246-248.

Kumar (2009) "Control of Reaction Surface in Low Temperature CVD to Enhance Nucleation and Conformal Coverage," PhD thesis in Materials Science and Engineering. University of Illinois at Urbana-Champaign, Urbana-Champaign.

Kumar et al. (2008) "Growth inhibition to enhance conformal coverage in thin film chemical vapor deposition," J. Am. Chem. Soc. 130:17660-17661.

Kwak et al. (2002) "Substrate and pretreatment dependence of cu nucleation by metal-organic chemical vapor deposition," Current Applied Physics. 2:205-211.

Li et al. (2006) "Thin, Continuous, and Conformal Copper Films by Reduction of Atomic Layer Deposited Copper Nitride," Chemical Vapor Deposition. 12:435-441.

Lin et al. (1993) "Surface-selective deposition of palladium and silver films from metal-organic precursors: a novel metal-organic chemical vapor deposition redox transmetalation process," J. Am. Chem. Soc. 115:11644-11645.

Lin et al. (1996) "Mechanistic Studies of Palladium Thin Film Growth from Palladium(II) β-Diketonates. 2. Kinetic Analysis of the Transmetalation Reaction of Bis(hexafluoroacetylacetonato)palladium(II) on Copper Surfaces," J. Am. Chem. Soc. 118:5988-5996.

Lin et al. (2002) "Effects of the underlayer substrates on copper chemical vapor deposition," J. Vac. Sci. Technol. B. 20:1111-1117.

Lin et al. (2003) "Via-Filling Capability of Copper Film by CVD," Journal of the Electrochemical Society. 150:C451-C456.

Lindquist et al. (Feb. 13, 2012) "Engineering metallic nanostructures for plasmonics and nanophotonics," Reports on Progress in Physics. 75(3):036501.

Momose et al. (2006) "In Situ Observation of Initial Nucleation and Growth of Chemical Vapor Deposition of Copper by Surface Reflectivity Measurement," Japanese Journal of Applied Physics Part 1. 45(11):8618.

Norman et al. (1991) "New OMCVD precursors for selective copper metallization," Journal De Physique IV. 2(C2):271-278.

Norman et al. (1995) "Chemical additives for improved copper chemical vapour deposition processing," Thin Solid Films. 262:46-51.

Over et al. (2000) "Atomic-Scale Structure and Catalytic Reactivity of the $RuO_2(110)$ Surface," Science. 287:1474-1476.

Pasquale et al. (2008) "Copper electrodeposition from an acidic plating bath containing accelerating and inhibiting organic additives," Electrochimica Acta. 53:5891-5904.

Pedersen et al. (2007) "Surface Plasmon Resonance Spectra of 2.8 ± 0.5 nm Diameter Copper Nanoparticles in Both Near and Far Fields," J. Phys. Chem. C. 111:17493-17499.

Perrine et al. (2010) "Metallic Nanostructure Formation Limited by the Surface Hydrogen on Silicon," Langmuir. 26:12648-12658.

Perrine et al. (Jun. 1, 2012) "Controlling the Formation of Metallic Nanoparticles on Functionalized Silicon Surfaces," J. Phys. Chem. C. 116:14431-14444.

Pyo (2008) "Role of $CH_2I_2$ catalysis in chemically enhanced MOCVD Cu process:.Nature of superfilling in copper thin film growth," Metals and Materials International. 14:767-772.

Rhee et al. (2000) "Property of hexafluoroacetylacetonate Cu(I) (3,3-dimethyl-1-butene) as a liquid precursor for chemical vapor deposition of copper films," Electrochemical and Solid State Letters. 3:135-137.

Saxena et al. (2005) "Kinetics of voiding and agglomeration of copper nanolayers on silica," Physical Review B. 72:115425.

Schmidt et al. (1996) "Mechanic Study of Copper Deposition onto Gold Surfaces by Scaling and Spectral Analysis of In Situ Atomic Force Microscopic Images," Journal of the Electrochemical Society. 143:3122-3132.

Sekiguchi et al. (2000) "Reaction of Copper Oxide and β-Diketone for In situ Cleaning of Metal Copper in a Copper Chemical Vapor Deposition Reactor," Japanese Journal of Applied Physics Part 1. 39(11):6478.

Shin et al. (1992) "Hot-wall chemical vapor deposition of copper from copper(I) compounds. 2. Selective, low-temperature deposition of copper from copper(I) beta-diketonate compounds, (beta-diketonate)CuLn, via thermally induced disproportionation reactions," Chemistry of Materials. 4:788-795.

Simoes et al. (2010) "In situ TEM study of grain growth in nanocrystalline copper thin films," Nanotechnology. 21:145701.

Steger et al. (1999) "Chemical vapor etching of copper using oxygen and 1,1,1,5,5,5-hexafluoro-2,4-pentanedione," Thin Solid Films. 342:221-229.

Susman et al. (Jun. 18, 2012) "Chemical Deposition and Stabilization of Plasmonic Copper Nanoparticle Films on Transparent Substrates," Chem. Mater. 24:2501-2508.

Thompson (Aug. 2012) "Solid-State Dewetting of Thin Films," Annual Review of Materials Research. 42:399-434.

Wang et al. (2004) "Area-selective growth of ruthenium dioxide nanorods on $LiNbO_3(100)$ and Zn/Si substrates," Journal of Materials Chemistry. 14:3503-3508.

Winter et al. (2000) "Selective Nucleation and Area-Selective OMCVD of Gold on Patterned Self-Assembled Organic Monolayers Studied by AFM and XPS: A Comparison of OMCVD and PVD," Chemical Vapor Deposition. 6:199-205.

Wu et al. (2008) "Effects of Hydrogen Plasma Treatments on the Atomic Layer Deposition of Copper," Electrochemical and Solid State Letters. 11:H107-H110.

Xie et al. (Jun. 11, 2014) Selective Deposition of Ru Nanoparticles on $TiSi_2$ Nanonet and Its Utilization for $Li_2O_2$ Formation and Decomposition, J. Am. Chem. Soc. 136:8903-8906.

Yamamoto et al. (2007) "Hydroxyl-Induced Wetting of Metals by Water at Near-Ambient Conditions," J. Phys. Chem. C. 111:7848-7850.

Yang et al. (2002) "Nucleation and film growth during copper chemical vapor deposition using the precursor Cu(TMVS)(hfac)," J. Vac. Sci. Technol. B. 20:495-506.

Yanguas-Gil et al. (2009) "Highly conformal film growth by chemical vapor deposition. II. Conformality enhancement through growth inhibition," J. Vac. Sci. Technol. A. 27:1244-1248.

Yanguas-Gil et al. (2009) "Highly conformal film growth by chemical vapor deposition. I. A conformal zone diagram based on kinetics," J. Vac. Sci. Technol. A. 27:1235-1243.

Zhang et al. (1999) "Optimization of copper CVD film properties using the precursor of Cu(hfac)(tmvs) with variations of additive

(56) References Cited

OTHER PUBLICATIONS content," IEEE International Conference on Interconnect Technology, 1999. San Francisco, CA. p. 170-172.

* cited by examiner

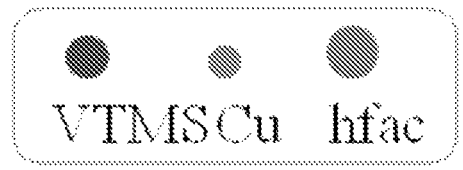
1. $k_d$ (dissociative adsorption)
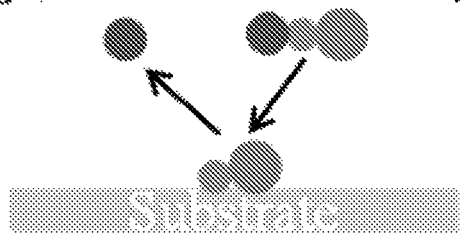
2. $k_r$ (disproportionation)
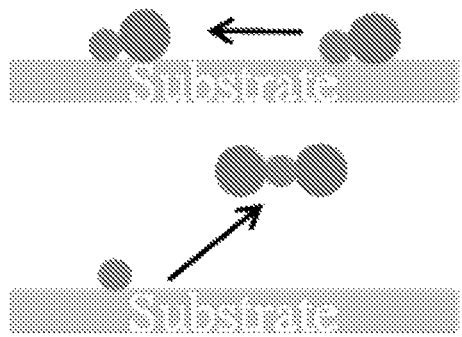
3. $k_a$ (associative desorption)
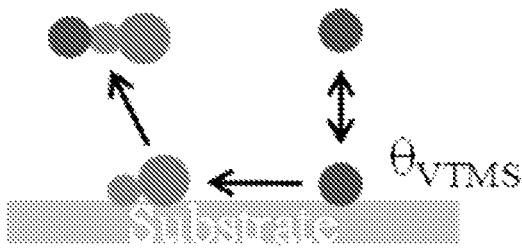
FIG. 10

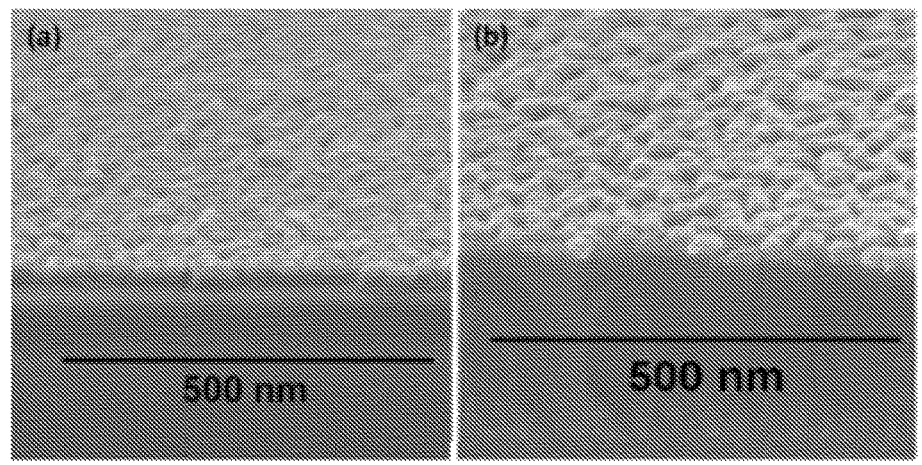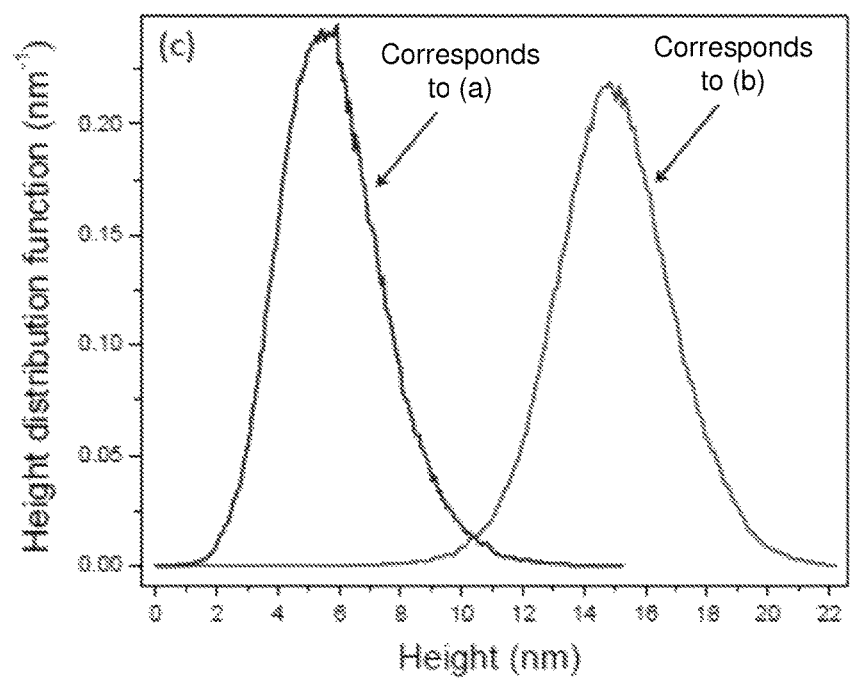
FIG. 26

USE OF AN INHIBITOR MOLECULE IN CHEMICAL VAPOR DEPOSITION TO AFFORD DEPOSITION OF COPPER ON A METAL SUBSTRATE WITH NO DEPOSITION ON ADJACENT SIO2 SUBSTRATE

CROSS-REFERENCE TO RELATED APPLICATIONS

This application claims the benefit of U.S. Provisional Application No. 62/078,139 filed Nov. 11, 2014, which is hereby incorporated by reference in its entirety.

STATEMENT REGARDING FEDERALLY SPONSORED RESEARCH OR DEVELOPMENT

This invention was made with government support under DMR1005715 and 1410209 and CHE 1362931 and 1112360 awarded by the National Science Foundation. The government has certain rights in the invention.

BACKGROUND OF THE INVENTION

As device dimensions are decreasing in the microelectronics industry, selective deposition of metals is becoming critically important. Previous approaches for selective deposition include intrinsic differences in nucleation rates, sacrificial solid state layers, activation of the growth surface, and passivation of the non-growth surface, e.g., by use of a SAM (self-assembled monolayer).

Compared to other metals, Cu is more difficult to pattern because of the lack of an effective etchant. Quite often, even if selective growth is achieved by a selective process, stray nucleation on the non-growth surface still occurs. Such nuclei keep on growing during the deposition and eventually cause a reliability problem and device failure. Ideally, stray nucleation needs to be completely eliminated, or if nuclei happen to form their growth rate needs to be decreased to a very small value to keep the coverage of Cu minimal on the non-growth surface.

Disclosures relating to the deposition of smooth films include: Babar et al., "Chemical Vapor Deposition of Copper: Use of a Molecular Inhibitor to Afford Uniform Nanoislands or Smooth Films," ECS J. Solid State Sci. and Tech. 3(5) Q79-Q83 (2014); Babar et al., "Growth Inhibitor To Homogenize Nucleation and Obtain Smooth $HfB_2$ Thin Films by Chemical Vapor Deposition," Chem. Mater. 25, 662-667 (2013); Hampden-Smith and Kodas, "Chemical Vapor Deposition of Metals: Part 2. Overview of Selective CVD of Metals," Chem. Vap. Deposition 1(2), 39-48 (1995); Jain et al., "Control of Selectivity During Chemical Vapor Deposition of Copper From Copper (I) Compounds Via Silicon Dioxide Surface Modification," App. Phys. Lett. 61, 2662-2664 (1992); and Dubois and Zegarski, "Selectivity and Copper Chemical Vapor Deposition," J. Electrochem. Soc. 139(11), 3295-3299 (1992).

It will be appreciated from the foregoing that there is currently a need in the art for methods to selectively grow metal films, such as copper films. In addition, methods are needed to control morphology during the growth of metal films on challenging substrates, such as oxides.

BRIEF SUMMARY OF THE INVENTION

Provided herein are methods for selectively forming a metal film on one portion of a substrate while leaving adjacent portions of the substrate uncoated. The methods provide for selectively depositing metal films on a conductive surface, such as ruthenium oxide, patterned on an insulating portion of the substrate, such as a thermal silicon dioxide ($SiO_2$) surface. The deposition processes of the invention provide selective deposition in a one step process utilizing a simultaneous application of a precursor gas and an inhibitor agent. The invention provides methods to simultaneously contact the substrate surface with both the precursor gas and the inhibitor agent leading to the selective formation of metal nuclei on the conductive surface of the substrate. In the methods described, nuclei are selectively formed by a disproportionation reaction occurring on the conductive portion but not on the insulating portion of the substrate. In an embodiment, the precursor gas has a net sticking coefficient with respect to formation of the nuclei on the conductive portion of the substrate, and a net sticking coefficient with respect to formation of additional metal growth on the nuclei already on the substrate. The present invention provides that the simultaneous contact of the precursor gas and the inhibitor agent with both the conductive portion and the nuclei results in a decrease of the net sticking coefficient of the precursor gas on the nuclei with respect to the net sticking coefficient on the conductive portion of the substrate by a factor greater than or equal to 1.1, or 1.5, or 2, leading to the growth of smooth films by preferentially forming additional nuclei on the substrate rather than increasing the size of the existing nuclei. In embodiments, the inhibitor agent may be an electron donor molecule, or a neutral molecule, which may limit or prevent formation of nuclei on the conductive portion of the substrate by associating with metal atoms, ions or molecules on the conductive portion of the substrate and causing desorption (i.e., associative desorption), steric site blocking and/or other mechanisms. Methods of the present invention are useful, for example, when the conductive portion and the insulating portion are in direct physical contact, direct thermal contact and/or direct electrical contact, and when the conductive portion and the insulating portion are in indirect physical contact, indirect thermal contact and/or indirect electrical contact. The methods are useful, for example, when the conductive portion and the insulating portion are side-by-side, and when the conductive portion is disposed on a surface of the insulating portion. In some embodiments, methods of the present invention are useful to form smooth metal layers with a surface roughness (rms) selected from the range from 0.1 nm to 10 nm. In some embodiments, the present methods are useful for forming smooth metal layers as conformal or superconformal thin films with a thickness less than or equal to 1000 nm, or less than or equal to 700 nm or less than or equal to 500 nm. In some embodiments, the metal layers are substantially free of pinholes, and can be used as diffusion barriers in electronic devices.

In an aspect, the invention provides a method for selectively forming a layer on a substrate, the method comprising the steps of: providing the substrate having a receiving surface with at least one conductive portion and at least one insulating portion; contacting the receiving surface of the substrate with a precursor gas, wherein accommodation of the precursor gas by the substrate results in selective formation of nuclei of deposited material on the conductive portion of the receiving surface of the substrate; contacting the nuclei on the conductive portion of the receiving surface with the precursor gas; wherein accommodation of the precursor gas by the nuclei, the substrate or both the nuclei and the substrate results in growth of the nuclei at a growth rate; and contacting the nuclei, the substrate or both the nuclei and the substrate with an inhibitor agent, wherein accommodation of the inhibitor agent by the nuclei, the substrate or both the nuclei and the substrate results in selective formation of the layer on the conductive portion of the substrate. In some embodiments, the precursor gas and the inhibitor agent are simultaneously contacted with the receiving surface of the substrate. In some embodiments, nuclei are selectively formed by a disproportionation reaction occurring on the conductive portion but not on the insulating portion of the substrate. In embodiments, the receiving surface of the substrate has a temperature selected from the range of 50° C. to 400° C., or 50° C. to 300° C., or 50° C. to 250° C., or 50° C. to 200° C. In embodiments, the selective formation of the layer occurs at least 100 times faster, or at least 1000 times faster, or at least 10,000 times faster on the conductive portion than on the insulating portion.

In some embodiments, the conductive portion comprises a conductive metal oxide. In an embodiment, the conductive portion has a formula of $M_yO_x$, where M is selected from the group consisting of Ru, Ti, In, Sn, Zn or combinations thereof and x and y are numbers selected from 1 to 3. In an embodiment, the ratio of y:x is selected from the range of 1:1 to 1:3. In an embodiment, the conductive metal oxide portion comprises a compound selected from the group consisting of $RuO_2$, $TiO_2$, $In_2O_3$, $SnO_2$, ZnO and combinations thereof. In an embodiment, the conductive metal oxide portion is prepared by oxidation of a metal layer formed on the insulating portion of the substrate. In an embodiment, the conductive portion has a thickness selected from the range of 0.1 nm to 1000 nm, or 1 nm to 500 nm, or 5 nm to 250 nm, or 10 nm to 100 nm. In an embodiment, the conductive portion covers less than or equal to 99.5% of the receiving surface, or less than or equal to 90% of the receiving surface, or less than or equal to 80% of the receiving surface, or less than or equal to 50% of the receiving surface, or less than or equal to 25% of the receiving surface. In an embodiment, the conductive portion is formed on the substrate via a process selected from the group consisting of physical vapor deposition, chemical vapor deposition, atomic layer deposition, electrochemical deposition, photolithography, shadow masking, ion beam etching, chemical etching and combinations thereof. In an embodiment, the conductive portion is characterized by a conductivity greater than 100 S/m, or greater than 500 S/m, or greater than 800 S/m, or greater than 1000 S/m, or greater than 2500 S/m, or greater than 5000 S/m. In an embodiment, the conductive portion comprises a thin film structure.

In an embodiment, the substrate comprises an insulating portion. In an embodiment, the insulating portion is an oxide, such as a semiconductor oxide, a nitride or combinations thereof. In an embodiment, the insulating portion comprises $SiO_2$ or $SiO_xC_y$, where x is a number between 1 and 2 and y is a number between 0 and 1. In an embodiment, the $SiO_2$ comprises thermal $SiO_2$ or porous, carbon-doped $SiO_2$, or both. In an embodiment, the insulating portion of the substrate is prepared by thermal oxidation or nitridation of a silicon wafer. In an embodiment, the silicon wafer has a (100) orientation. In an embodiment, the insulating portion has a thickness selected from the range of 0.1 nm to 1 mm, or 1 nm to 0.5 mm, or 10 nm to 250 nm. In an embodiment, the insulating portion is characterized by a conductivity less than 100 S/m, or less than 50 S/m, or less than 10 S/m or less than 1 S/m.

In an embodiment, the conductive portion and the insulating portion are in direct physical contact, direct thermal contact and/or direct electrical contact. In an embodiment, the conductive portion and the insulating portion are in indirect physical contact, indirect thermal contact and/or indirect electrical contact. In an embodiment, the conductive portion and the insulating portion are side-by-side. In an embodiment, the conductive portion is disposed on a surface of the insulating portion.

In an embodiment, the precursor gas has a net sticking coefficient with respect to accommodation on the nuclei, and wherein accommodation of the inhibitor agent by the nuclei, the conductive portion of the substrate or both the nuclei and the conductive portion of the substrate results in a decrease of the net sticking coefficient of the precursor gas with respect to accommodation on the nuclei by a factor greater than or equal to 1.1, or 1.5, or 2. In an embodiment, accommodation of the inhibitor agent by the nuclei, or the conductive portion of the substrate or both the nuclei and the conductive portion of the substrate decreases the growth rate of the nuclei sufficiently to form an average areal density of nuclei on the receiving surface of at least $1 \times 10^{10}$ $cm^{-2}$. In an embodiment, the precursor gas has a partial pressure less than or equal to 1000 mTorr, or less than or equal to 500 mTorr, or less than or equal to 250 mTorr. In an embodiment, the precursor gas has a partial pressure selected from the range of 0.1 mTorr to 10 mTorr, or 0.5 mTorr to 8 mTorr, or 1 mTorr to 5 mTorr. In an embodiment, the precursor gas comprises Cu(hfac)(VTMS), Cu(hfac)(MHY), iron complexes, titanium complexes, magnesium complexes, silver complexes and combinations thereof. In an embodiment, the growth rate of the layer decreases as a function of a partial pressure of the inhibitor agent.

In an embodiment, the inhibitor agent has a partial pressure less than or equal to 1000 mTorr, or less than or equal to 500 mTorr, or less than or equal to 250 mTorr. In an embodiment, the inhibitor agent has a partial pressure selected from the range of 0.1 mTorr to 10 Torr, or 0.5 mTorr to 8 Torr, or 1 mTorr to 5 Torr, or 5 mTorr to 1 Torr, or 10 mTorr to 0.5 Torr. In an embodiment, the inhibitor agent is a neutral molecule. In an embodiment, the inhibitor agent is an electron donor molecule. In an embodiment, the inhibitor agent is selected from the group consisting of VTMS, MHY, DMB or combinations thereof. In an embodiment, the inhibitor agent and the precursor gas are a combination selected from the group consisting of: VTMS and Cu(hfac)(VTMS); MHY and Cu(hfac)(VTMS); VTMS and Cu(hfac)(MHY); MHY and Cu(hfac)(MHY) or combinations thereof.

In an embodiment, the layer is an electrical conductor. In an embodiment, the layer comprises a metal. In an embodiment, the layer is a metal. In an embodiment, the layer is selected from the group consisting of copper, ruthenium, titanium, $TiN_x$, $TaN_x$, $HfB_2$ and combinations thereof. In an embodiment, the layer has a surface roughness (rms) selected from the range of 0.1 nm to 10 nm, or 0.5 nm to 5 nm, or 1 nm to 4 nm. In an embodiment, the layer is a conformal or superconformal thin film. In an embodiment, the layer has a thickness less than or equal to 1000 nm or less than or equal to 800 nm, or less than or equal to 500 nm, or less than or equal to 250 nm. In an embodiment, the layer has a thickness selected from the range of 0.1 nm to 1000 nm, or 0.5 nm to 800 nm, or 1 nm to 500 nm, or 5 nm to 250 nm. In an embodiment, the layer is a diffusion barrier in an electronic device. In an embodiment, the layer is substantially free of pinholes. In an embodiment, the layer is a contiguous layer. In an embodiment, the layer is a discontinuous layer.

In an embodiment, the substrate comprises a plurality of relief features. In an embodiment, the surfaces of the conductive portion and the insulating portion are not aligned. In an embodiment, the surface of the conductive portion and the insulating portion are substantially parallel or substantially perpendicular to one another.

In an embodiment, the method includes the step of contacting the substrate, the nuclei or both with at least one additional inhibitor agent, at least one additional precursor gas or both. In an embodiment, the accommodation of the inhibitor agent by the nuclei, the conductive portion of the substrate or both the nuclei and the conductive portion of the substrate decreases the growth rate of the nuclei sufficiently such that the formation, growth and coalescence of additional nuclei on the conductive portion of the receiving surface of the substrate generates the layer, as a smooth layer. In an embodiment, the accommodation of the inhibitor agent by the nuclei, the conductive portion of the substrate or both the nuclei and the conductive portion of the substrate decreases the growth rate of the nuclei by a factor of at least 1.1, or 1.5 or 2 relative to a growth rate of the nuclei in the absence of the inhibitor agent. In an embodiment, the step of exposing the substrate to the precursor is carried out for a duration selected from the range of 1 second to 1 hour, or 5 seconds to 45 minutes, or 30 seconds to 30 minutes, or 1 minute to 15 minutes. In an embodiment, the step of contacting the receiving surface is initiated without any pretreatment of the substrate.

In an aspect, the invention provides a method for selectively forming a Cu layer on a substrate, the method comprising the steps of: providing the substrate having a receiving surface with at least one $RuO_x$ portion and at least one $SiO_2$ portion; contacting the receiving surface of the substrate with Cu(hfac)VTMS gas, wherein accommodation of the Cu(hfac)VTMS gas by the substrate results in selective formation of Cu nuclei on the $RuO_x$ portion of the substrate; contacting the Cu nuclei on the $RuO_x$ portion of the substrate with the Cu(hfac)VTMS gas; wherein accommodation of the Cu(hfac)VTMS gas by the Cu nuclei, the $RuO_x$ portion of the substrate or both the Cu nuclei and the $RuO_x$ portion of the substrate results in growth of the Cu nuclei at a growth rate; and contacting the Cu nuclei, the $RuO_x$ portion of the substrate or both the Cu nuclei and the $RuO_x$ portion of the substrate with VTMS gas, wherein accommodation of the VTMS gas by the Cu nuclei, the $RuO_x$ portion of the substrate or both the Cu nuclei and the $RuO_x$ portion of the substrate results in selective formation of the Cu layer on the $RuO_x$ portion of the substrate.

Without wishing to be bound by any particular theory, there can be discussion herein of beliefs or understandings of underlying principles or mechanisms relating to the invention. It is recognized that regardless of the ultimate correctness of any explanation or hypothesis, an embodiment of the invention can nonetheless be operative and useful.

BRIEF DESCRIPTION OF THE DRAWINGS

FIG. 10 provides a schematic representation of the individual steps in the growth of Cu from Cu(hfac)VTMS. If the disproportionation reaction is faster on $RuO_2$ than on $SiO_2$ or on CDO, then co-flowing VTMS will cause more associative desorption from the latter substrates, thus suppressing the rate of nucleation and growth.

C., $P_{prec.}$=0.04 mTorr, $P_{VTMS}$=3 mTorr. Using the precursor alone, copper growth initiates immediately upon flowing precursor into the chamber. With a co-flow of VTMS inhibitor, no change in Psi occurs during the experimental time of 30 min. The initial increase of ~1° in Psi is likely due to precursor adsorption on the high surface area within the porous CDO.

Figure 13:
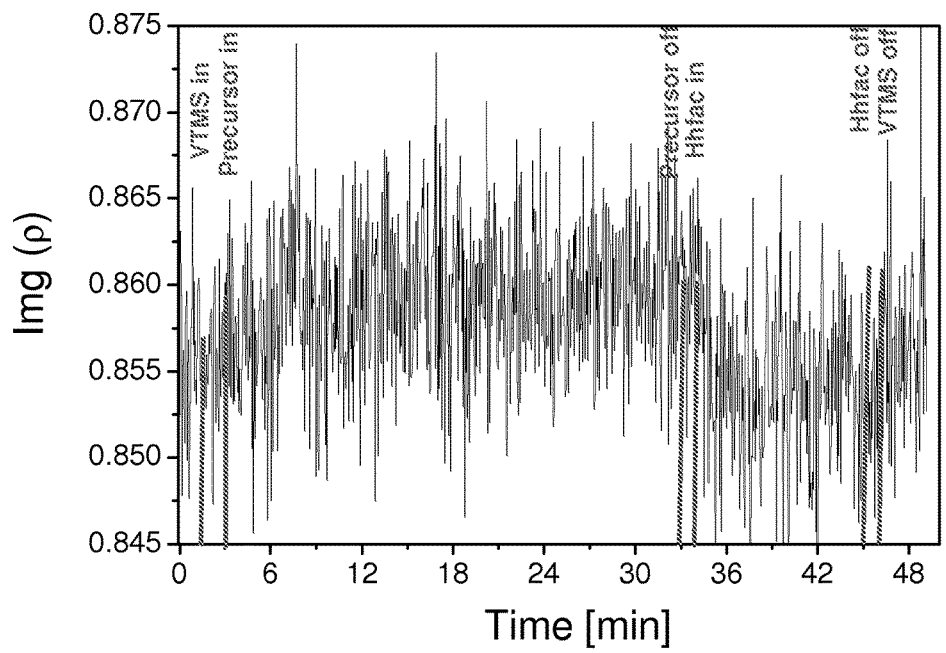

FIG. 13 provides a plot showing real-time ellipsometry including the deposition and etching of copper on thermal $SiO_2$ with $T_{sub.}$=120° C., $P_{prec.}$=0.04 mTorr, $P_{VTMS}$=3 mTorr: (i) VTMS flow turned on; (ii) precursor flow turned on for 30 min, during which time nucleation does not occur but a very low density of Cu atoms is deposited; (iii) precursor turned off; (iv) Hhfac turned on (through a separate delivery tube) with $P_{Hhfac}$=6 mTorr; (v) Hhfac and VTMS flows turned off. The signal after etching by Hhfac (above 36 min) returns to the starting value (up to 3 min). RBS analysis confirms the absence of copper.

Figure 14:
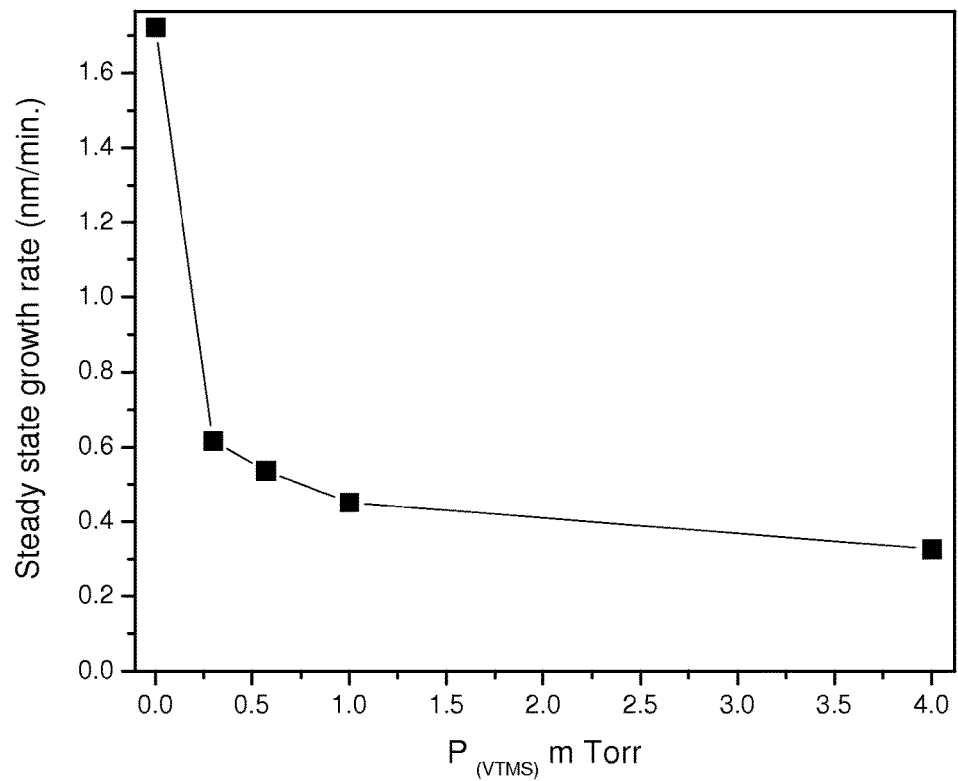

FIG. 14 provides a plot showing the suppression in growth rate of Cu on Cu vs. $P_{VTMS}$, $T_{sub.}$=100° C. and $P_{prec.}$=0.1 mTorr.

Figure 15:
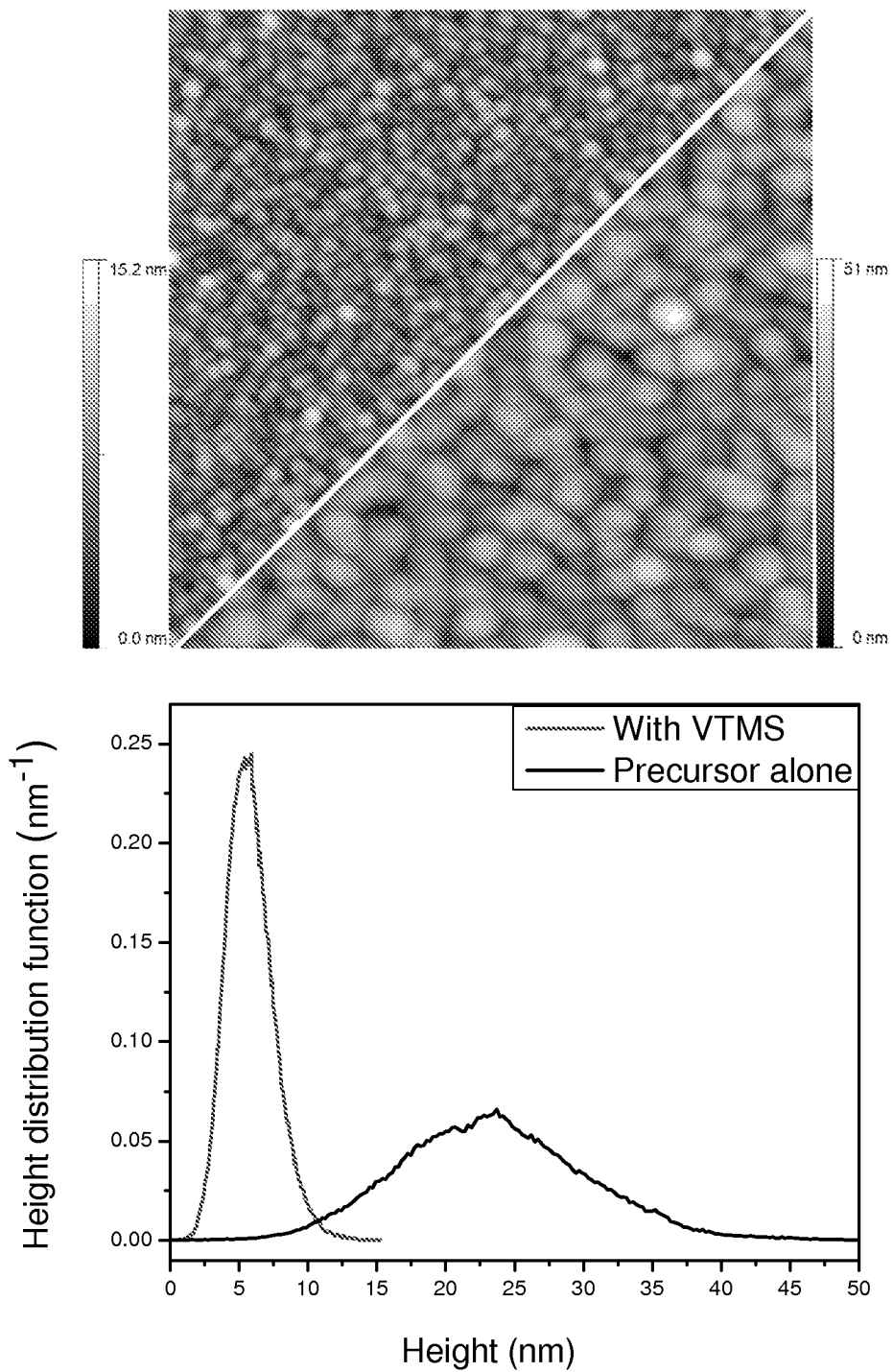

FIG. 15 provides a plot of Cu growth on ~air-exposed Ru/$SiO_2$/Si(100). Top left is AFM image for growth with precursor alone, bottom right is AFM image for growth with 4 mTorr co-flowing inhibitor, and bottom graph is height distribution function corresponding to top images. AFM image size is (2×2) µm in size; note the different height scale bar for left and right image. $T_{sub}$=100° C., and $P_{prec.}$=0.1 mTorr.

Figure 16:
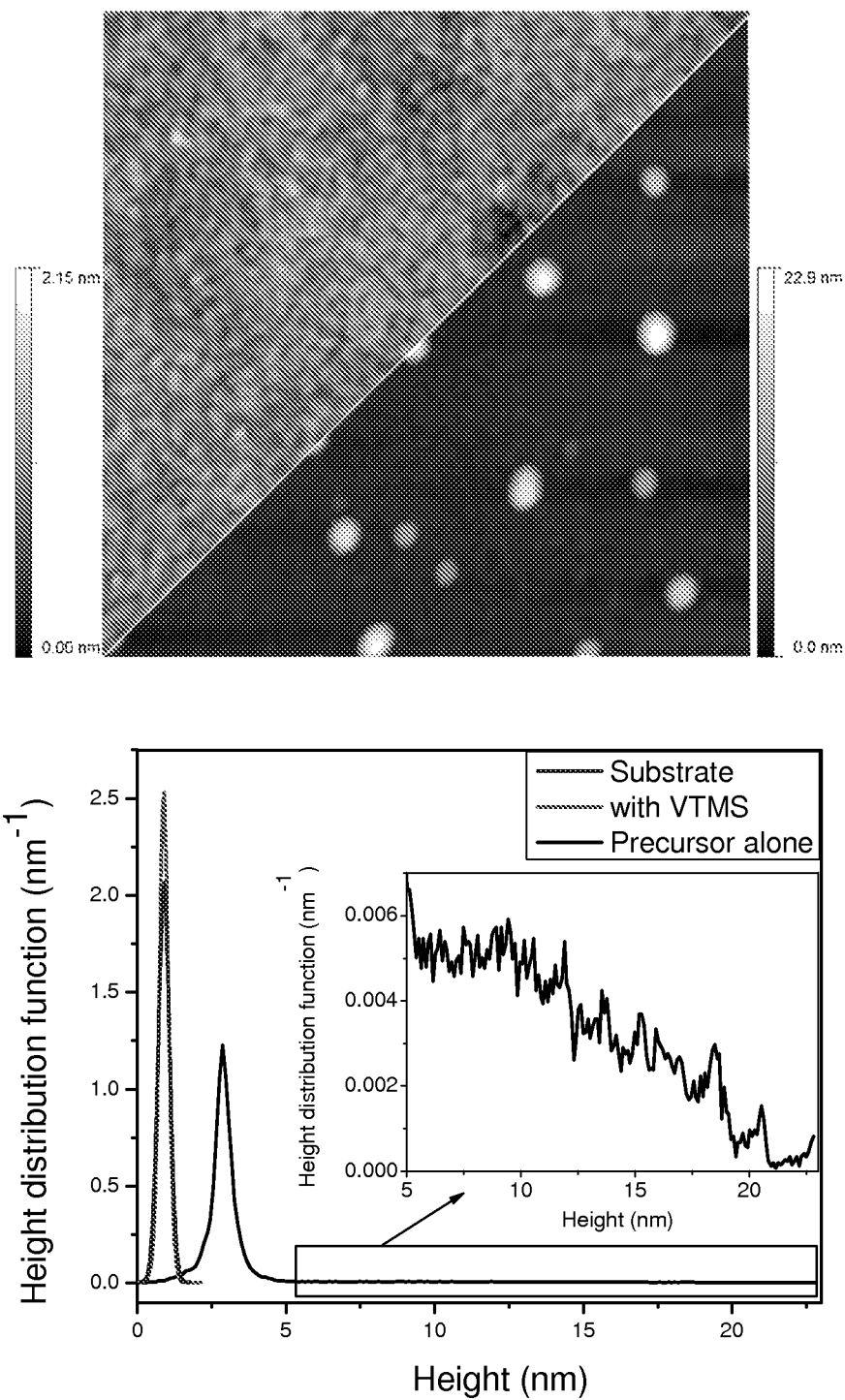

FIG. 16 provides a plot showing the AFM-determined height distributions (bottom) and images (top) of Cu growth on $SiO_2$/Si(100). The bottom right AFM image is for growth with precursor alone, the top left AFM image is for growth with 4 mTorr co-flowing inhibitor, and bottom graph is height distribution function corresponding to the top images. AFM image size is (2×2) µm in size; note the different height scale bar for left and right image. $T_{sub}$=100° C., $t_{growth}$=30 min. and $P_{prec.}$=0.1 mTorr.

Figure 17:
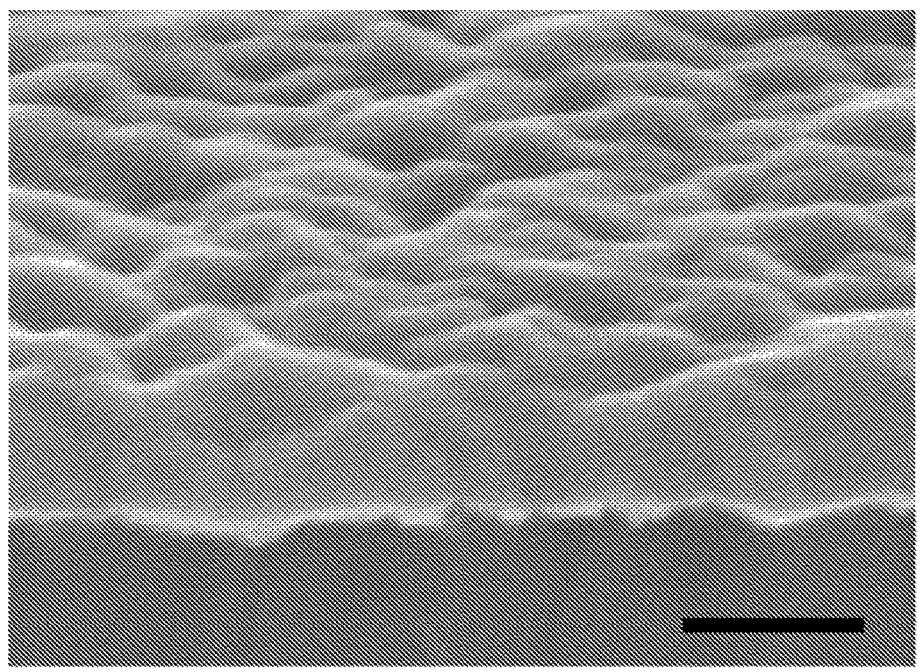

FIG. 17 shows a cross sectional SEM image of Cu film grown on $RuO_x$ with precursor only. Mean thickness 75 nm (measured by RBS), rms roughness 5.7 nm (measured by AFM), sheet resistance 0.1Ω/□. $T_{sub}$=100° C. and $t_{growth}$=30 min. The scale bar represents 100 nm.

Figure 18:
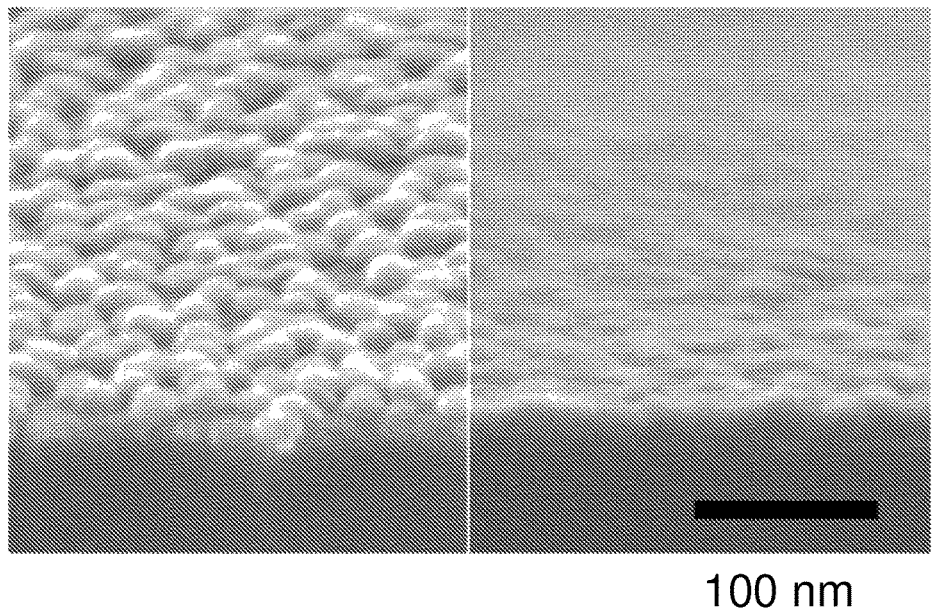

FIG. 18 shows a cross sectional SEM image of copper growth on $RuO_x$ at $T_{sub}$=100° C. and $t_{growth}$=30 min: (a) 8.2 nm effective thickness (measured by RBS), deposited in a co-flow of precursor and 2 mTorr of VTMS inhibitor; (b) 13.5 nm thick Cu film grown with a coflow of 1 mTorr VTMS only after the nucleation stage, sheet resistance 1.9Ω/□. The faintly visible under-layer at the interface is the Ru seed layer. The scale bar represents 100 nm.

Figure 19:
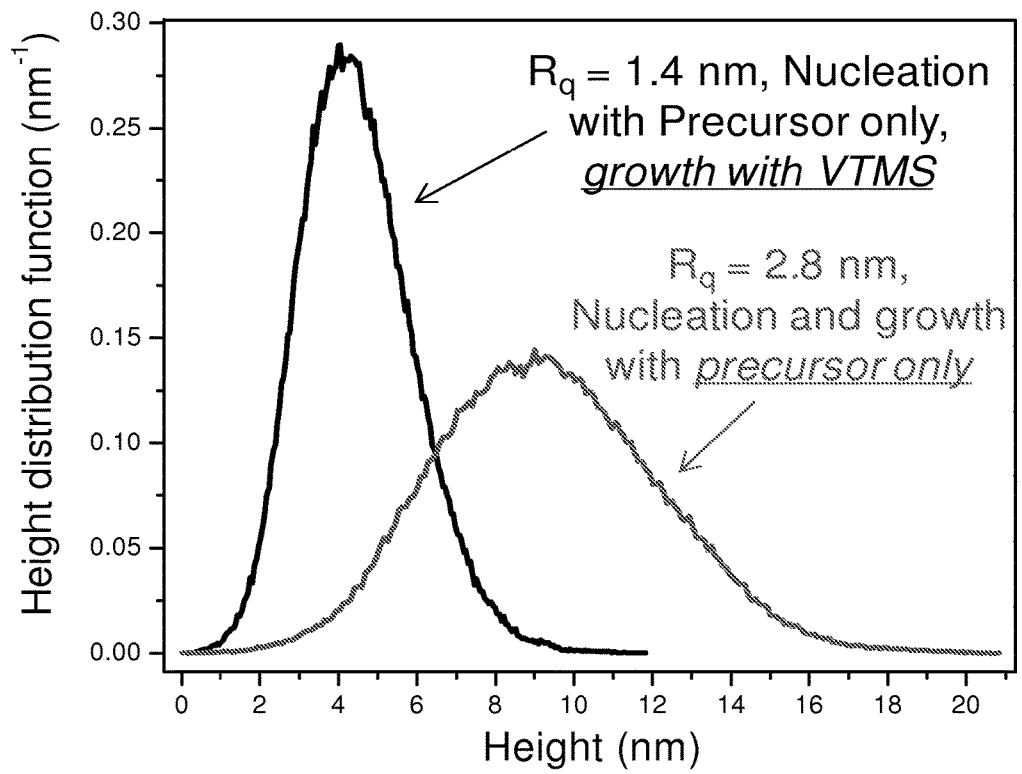

FIG. 19 provides the height distribution functions, derived from AFM data, for films in which the VTMS inhibitor is used only during the growth stage (black curve) and film in which precursor only is used during both the nucleation and growth stages (red curve). For the latter, the substrate temperature and precursor pressure are the same as for FIG. 18; $t_{growth}$=9 min, thickness 20 nm. $R_q$ is the rms surface roughness.

Figure 20:
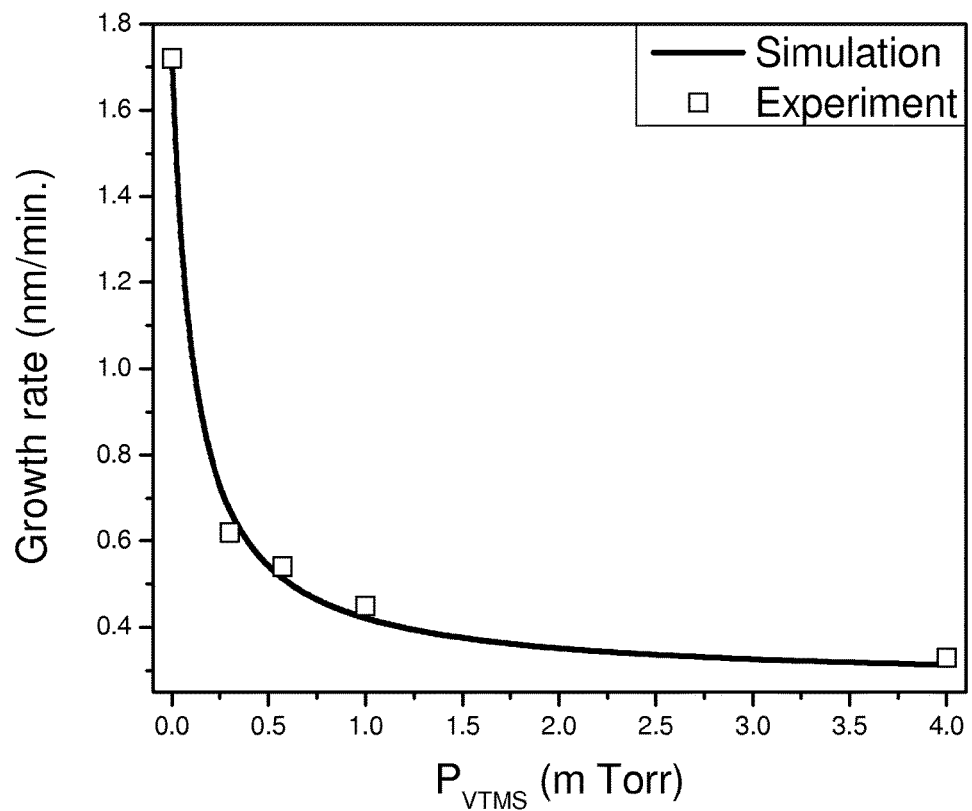

FIG. 20 provides a comparison of experimental growth rate vs. VTMS pressure (squares) with model calculations (solid line) using the parameters given in Example 3.

Figure 21:
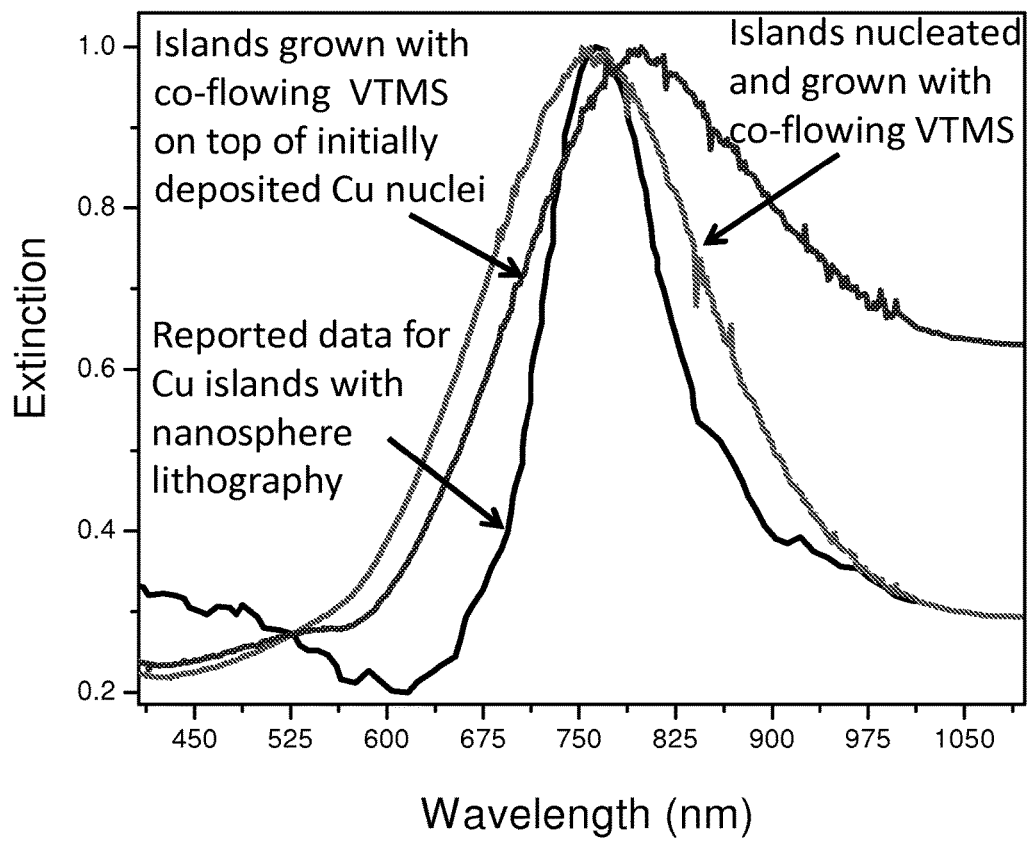

FIG. 21 provides a comparison of symmetry of plasmonic peak: Cu islands fabricated by coflowing VTMS show a sharp and symmetric peak.

Figure 22:
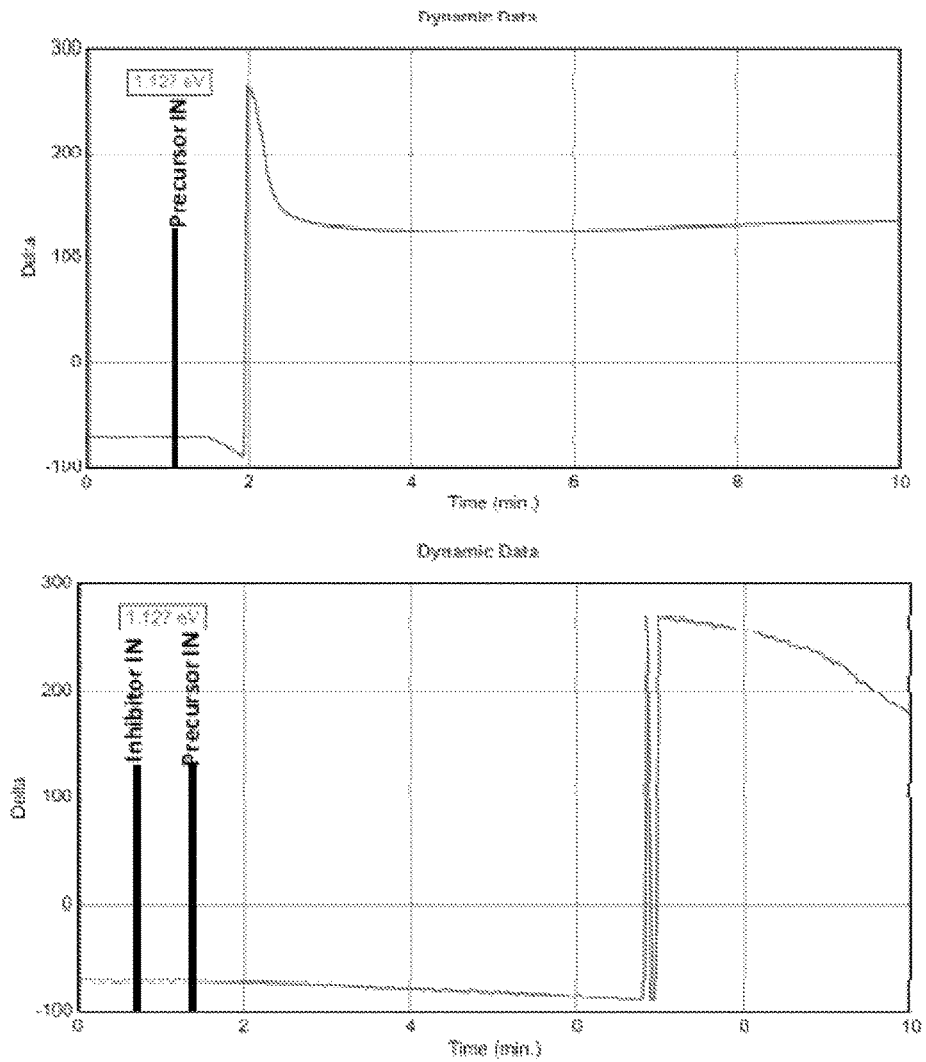

FIG. 22 provides a plot showing in-situ ellipsometry for qualitative detection of the nucleation stage: (top) precursor alone; (bottom) with co-flowing inhibitor. With co-flowing inhibitor incubation time increased from ~25 sec to ~5 min.

Figure 23:
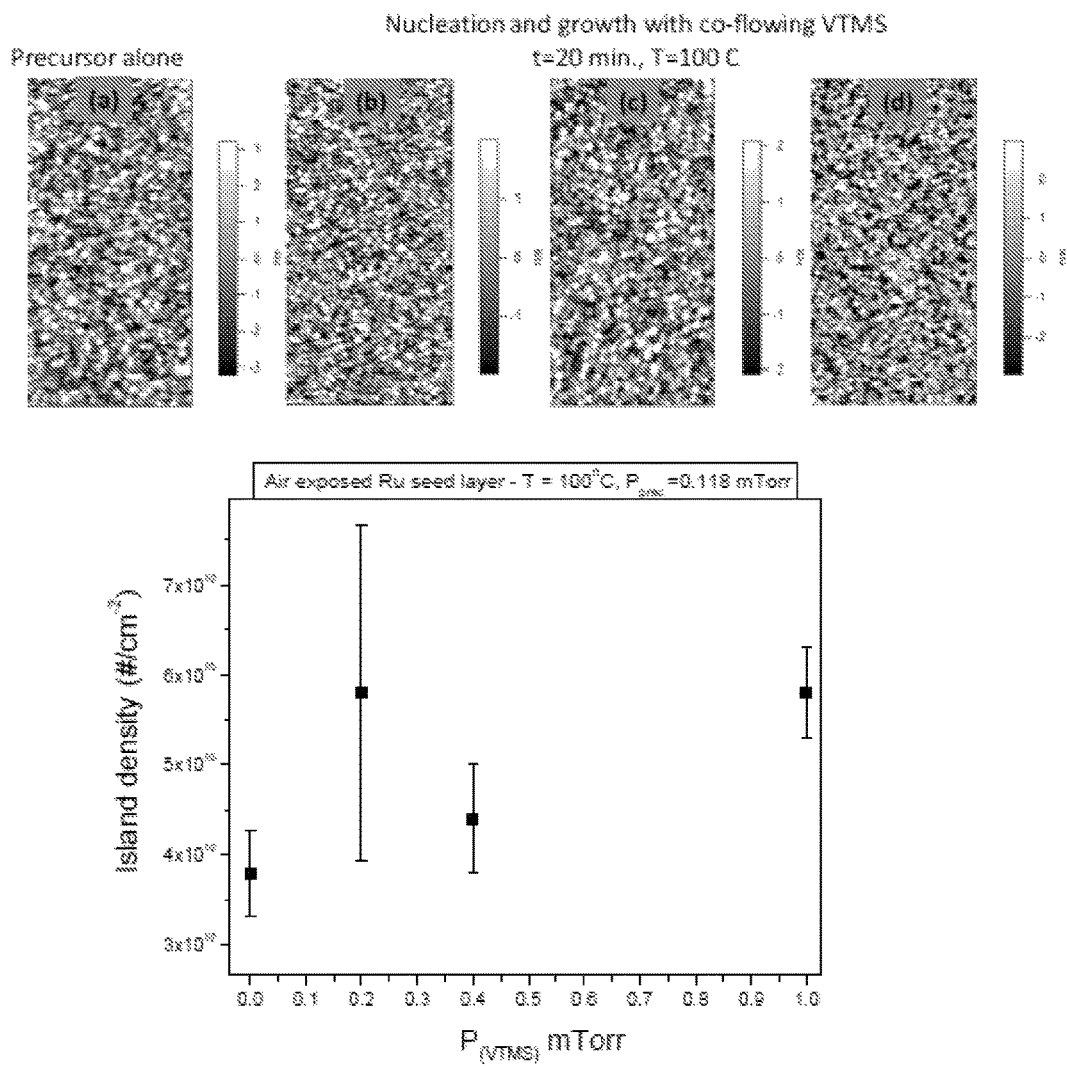

FIG. 23 shows AFM images (top) (1×2) microns in size showing initial Cu islands on the $RuO_x$ substrate as a function of VTMS pressure in mTorr: (a) 0.0; (b) 0.2; (c) 0.4; (d) 1.0; and a plot (bottom) showing aerial density of Cu islands vs. VTMS pressure extracted from the AFM data.

Figure 24:
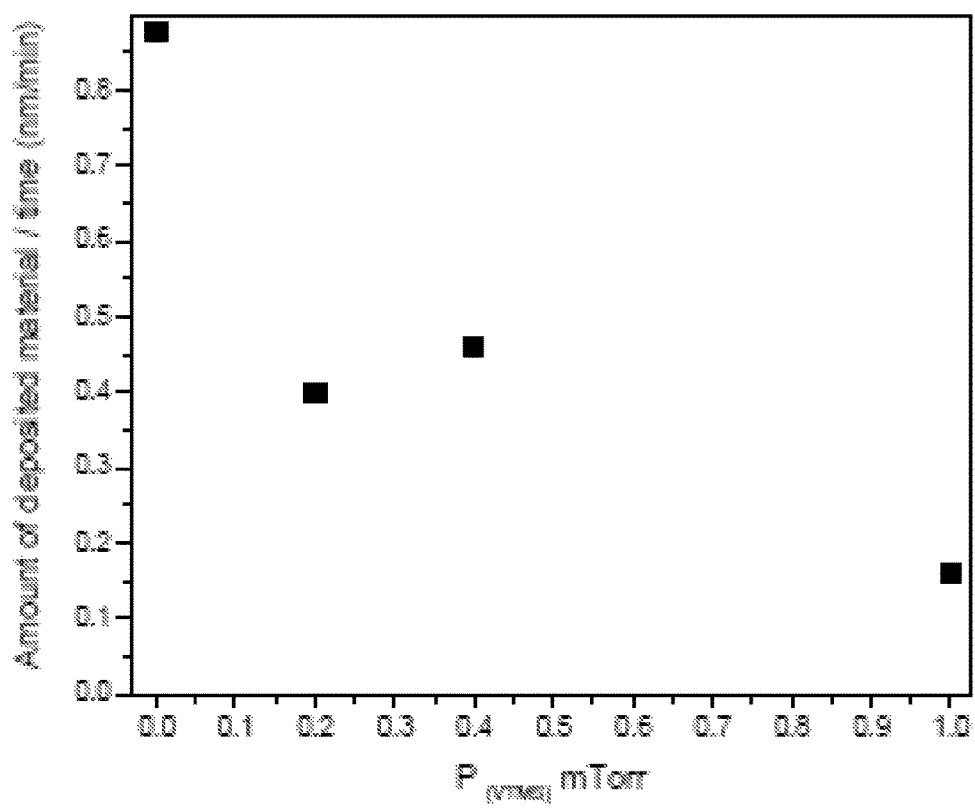

FIG. 24 shows a plot of Cu growth kinetics vs. $P_{VTMS}$, $T_{sub}$=100° C., $P_{pre}$~0.12 mTorr. Growth of initial islands, where the growth was halted after 20 min. and the drop in the amount of deposited material is 5.5× for 1 mTorr of VTMS compared to nucleation using the precursor alone.

Figure 25:
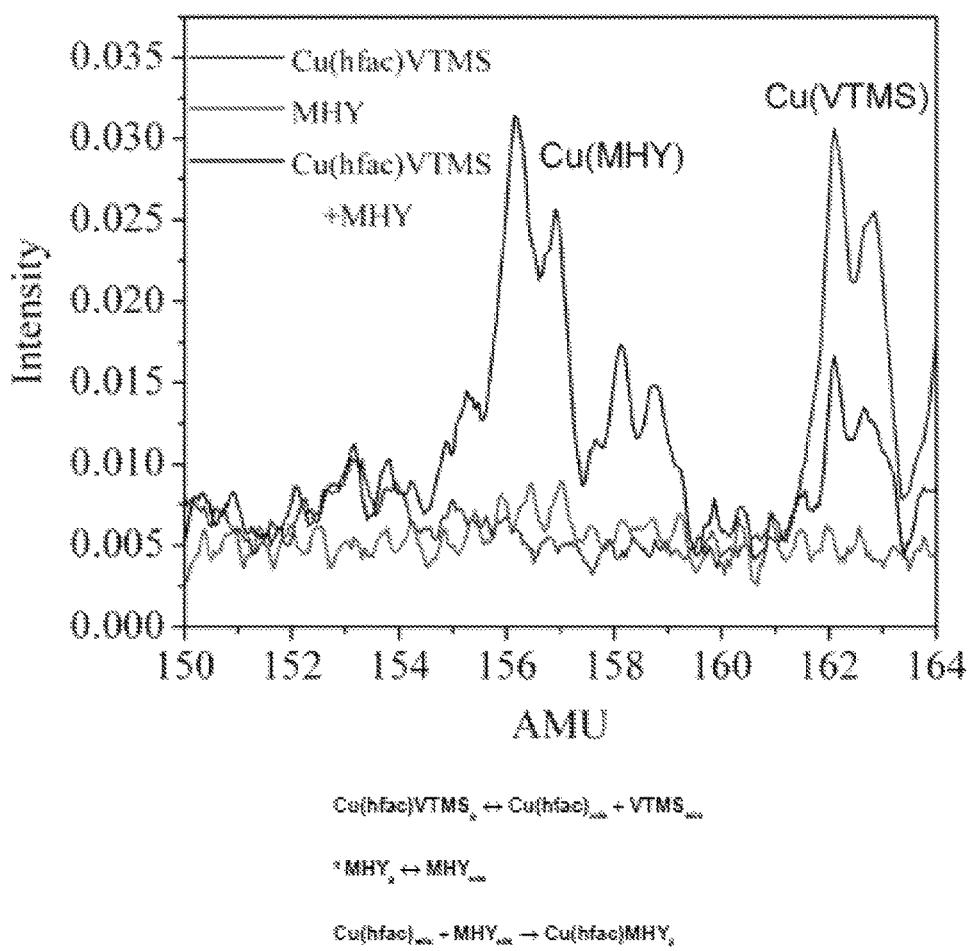

FIG. 25 shows a plot of downstream quadrupole mass spectroscopy data of an experiment in which the alternative neutral ligand MHY was injected through a separate gas line with the Cu(hfac)VTMS precursor, $T_{sub.}$=160° C. Under essentially molecular flow conditions, the mixed molecule Cu(hfac)MHY is detected; in the absence of gas phase collisions, it must have formed via surface association of Cu(hfac) with MHY.

FIG. 26 shows SEM images of: (a) Cu islands grown in the presence of 4 mTorr VTMS on top of initially deposited Cu nuclei, which affords a total deposit of 9.8 nm; (b) Cu islands nucleated and grown without initially deposited Cu nuclei in the presence of 2 mTorr VTMS, which affords a total deposit of 8.2 nm; and (c) the height distribution functions derived from AFM data. $T_{sub}$=100° C., $t_{growth}$=30 min., $P_{prec}$=0.1 mTorr.

Figure 27:
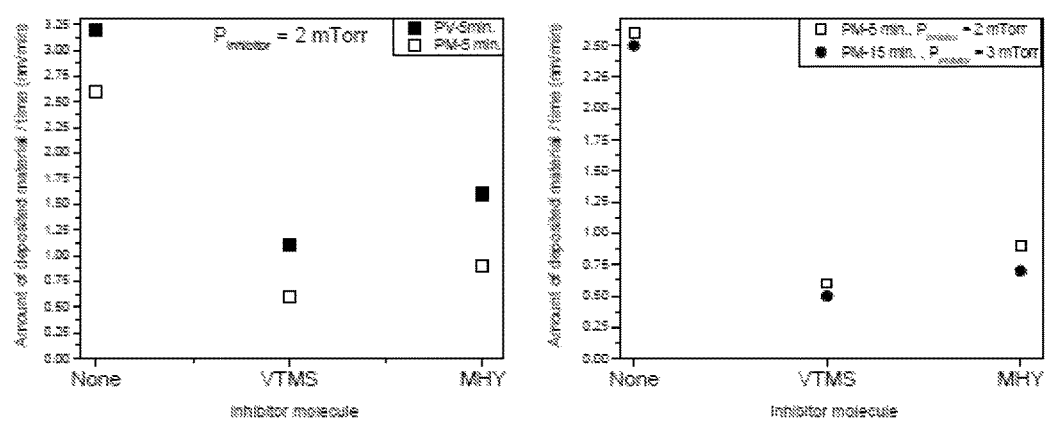

FIG. 27 shows a plot of the effect of different inhibitors on the growth rate of islands as measured by RBS. 'PV' is the precursor Cu(hfac)VTMS and 'PM' is the precursor Cu(hfac)MHY. The substrate surface is 30 nm air exposed, e-beam deposited copper; $T_{sub}$=150° C.

Figure 28:
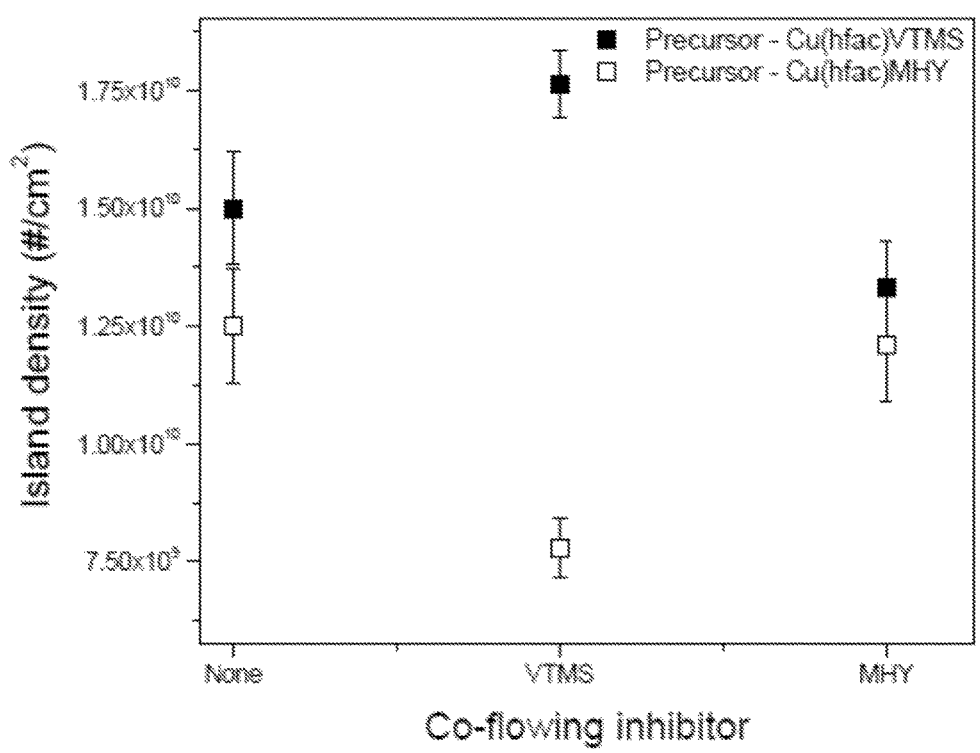

FIG. 28 shows a plot of AFM derived Cu island density vs. the type of inhibitor molecule. The substrate surface is 30 nm air exposed, e-beam deposited copper; $T_{sub}$=150° C., $t_{growth}$=5 min., $P_{inhibitor}$=2 mTorr.

DETAILED DESCRIPTION OF THE INVENTION

In general the terms and phrases used herein have their art-recognized meaning, which can be found by reference to standard texts, journal references and contexts known to those skilled in the art. The following definitions are provided to clarify their specific use in the context of the invention. Referring to the drawings, like numerals indicate like elements and the same number appearing in more than one drawing refers to the same element. In addition, hereinafter, the following definitions apply:

"Molecule" refers to a collection of chemically bound atoms with a characteristic composition. As used herein, a molecule can be neutral or can be electrically charged, such as singly charged and multiply charged ions.

"Complex" refers to a molecule comprising at least one a metal ion and at least one organic ligand that charge balances the metal ion.

"Conformal layer" refers to the physical characteristics of a layer of deposited material, for example, a thin film structure deposited on a substrate. In an embodiment, a conformal layer lacks pinholes, gaps or voids having a volume larger than about $1×10^{-6}$ µm³ within the bulk phase of the conformal layer or positioned between the layer and the surface(s) of a feature coated by the layer. In some embodiments, conformal layers have uniform thickness at any surface of the layer (e.g., with variation less than about 20%). In some embodiments, conformal layers have uniform density throughout the layer (e.g., with variation less than about 20%). Conformal layers in the present invention may have a uniform composition throughout the layer or may have a composition that varies through all or a portion of the layer. The term "superconformal" refers to the result in which the thickness of coating on the bottom of the feature proximate to the bottom of the feature is larger than the thickness of coating on a surface immediately outside of the feature adjacent to its opening.

"Aspect ratio" is a physical characteristic of a feature, such as a recessed feature, equal to the depth of the feature divided by a physical dimension defining the opening size of the feature (i.e. a cross sectional dimension (width or diameter) of the opening). Methods of the present invention are well suited for conformally or superconformally coating and/or uniformly filling high aspect ratio recessed features.

"Feature" refers to a three-dimensional structure or structural component of a substrate. Features may be recessed in which they extend into a substrate surface or may be relief features embossed on a substrate surface. Features include, but are not limited to, trenches, cavities, vias, channels, posts, slots, stands; columns, ribbons, pores, holes, apertures or any combination of these. Features include pores, channels, holes, cavities and apertures in porous and/or fibrous substrates.

"Disproportionation" refers to a redox reaction wherein a species is simultaneously reduced and oxidized to form two different products. For example, a $Cu^{+2}$ molecule may disproportionate to form $Cu^0$ and $Cu^{+1}$ species.

"Accommodation" refers to the processes involved with the loss and/or uptake of a gas to a surface or bulk phase. As used herein, accommodation includes a range of chemical and physical processes involving gas molecules, atomic species and ions and a surface. For example, accommodation may include physisorption, chemisorption, decomposition, chemical reaction, and condensation processes. Accommodation includes reactions of gas molecules, including gas molecules adsorbed or otherwise condensed on a surface, and condensed phase species present on a surface and/or present in the bulk phase.

Figure 3:
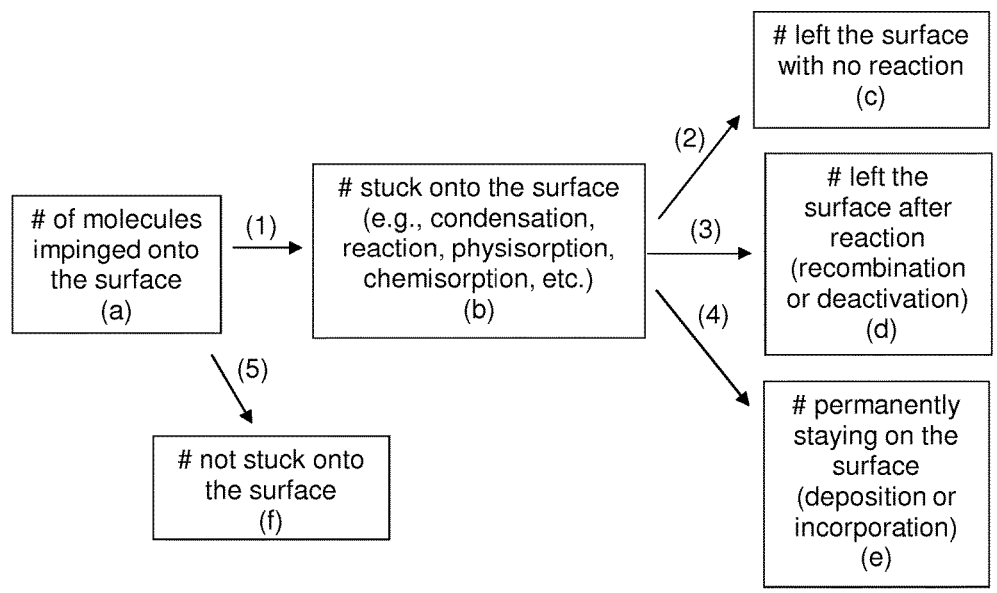
FIG. 3 provides a flow diagram illustrating a range of interrelated physical and chemical processes involved in uptake and reaction of gas phase materials (such as inhibitor agent(s) and/or precursor gas(es)) with surfaces (e.g., substrate surfaces or the surfaces of nuclei).

"Net sticking coefficient" and "net accommodation coefficient" are used synonymously in the present description, and refer to a characteristic of a material, such as a smoothing agent, inhibitor agent or precursor gas, that is the fraction of collisions of an atom or molecule with a surface that result in accommodation (including reactive or non-reactive uptake) by the surface. Thus, the net sticking coefficient is the probability that a molecule or atom colliding with a surface will be lost from the gas phase to the surface or bulk phase. In this context, "lost to the surface" is intended to broadly encompass a wide range of chemical and physical processes including reactive loss, condensation, physiadsorption, chemiadsorption and other forms of surface trapping. FIG. 3 provides a flow diagram illustrating a range of physical and chemical processes involved in uptake and reaction of gas phase materials with surfaces. Using fundamental principles (e.g. mass balance coefficients), a and b can be related to coefficients c, d and e by the following expressions:

$a=b+f$ and $b=c+d+e$.

Surface reaction probability or surface consumption rate is related to these parameters by the expression:

Surface Reaction Probability or Surface Consumption Rate=$(d+e)/a$.

"Flux" refers to the number of molecules or atoms that impinge upon (e.g. collide or otherwise interact with) a surface or that pass through a given area of space per unit time per unit area. Flux may be expressed in units of (number $s^{-1}$ $cm^{-2}$), and is provided by the equation:

$$\text{Flux} = \frac{(\text{\# of molecules impinged on the surface})}{\text{time} \times \text{area}}$$

"Inhibitor agent" refers to molecules and/or atomic species that selectively adjust the relative rates of chemical and/or physical processes involved in the nucleation, formation and growth of layers, such as thin film structures, generated by the deposition and/or accommodation of precursors (and optionally co-reactants), so as to generate a smooth layer. Some smoothing agents of the invention are accommodated by the surfaces of nuclei and/or the substrate and selectively adjust the relative rates of processes involved in nucleation, coalescence and thin film growth, for example, to enhance the density of nuclei in a manner resulting in formation of a smooth layer. In an embodiment, for example, a smooth agent of the invention functions as a nucleation density enhancing, agent. In an embodiment, for example, accommodation of a smoothing agent on a substrate surface and/or the surfaces of nuclei on a substrate surface selectively adjusts the relative rates of nucleation and growth of the nuclei. In an embodiment, accommodation of a smoothing agent on a substrate surface and/or the surfaces of nuclei on a substrate selectively adjusts the relative rates of nucleation and growth of a thin film on a surface(s) of the substrate. Smoothing agents include gases, such as inhibitor gases. In an embodiment, accommodation of a smoothing agent on a substrate surface and/or the surfaces of nuclei on a substrate decreases the growth rate of nuclei and/or a thin film on a surface of the substrate. In some methods of the invention, the smoothing agent is not provided to the substrate surface in the condensed phase (e.g., a solution).

"Inhibitor gases" and "inhibitor agents" include atomic species, molecular species, ionic species or combinations of these that interact with the surfaces of nuclei formed from deposition of a precursor gas to a substrate in a manner so as to decrease the rate of growth of the nuclei relative to that of the rate of formation of new nuclei. In an embodiment, an inhibitor gas reduces the rate of nuclei growth, for example by decreasing the rate of accommodation of precursor gas, and optionally does not significantly affect (e.g., changes less than 20%) the rate of nucleation. Some inhibitor gases of the invention are accommodated by the surfaces of nuclei to generate inhibitor species in the condensed phase on, or within, the nuclei, wherein the presence of such inhibitor species decreases the rate of accommodation of precursor gas by the surface of the nuclei. In some embodiments, for example, interaction between the inhibitor gas and the surfaces of the nuclei results in formation of inhibitor species on the surface and/or within the nuclei, such as inhibitor species physisorbed on the surface of the nuclei, inhibitor species chemisorbed on the surface of the nuclei and inhibitor species on the surface of the nuclei that are products of reaction of the inhibitor gas and nuclei. Inhibitor species include stable species present on the surface of the nuclei and metastable species that undergo reaction and/or are subsequently reintroduced into the gas phase. In some embodiments, processes of accommodation of the inhibitor gas by the surfaces of the nuclei and loss of inhibitor species from the surfaces of the nuclei establish a steady state amount of inhibitor species on the nuclei, for example, a steady state amount of inhibitor species providing a decrease in the rate of growth of nuclei relative to the rate of generation of new nuclei so as to generate a smooth conformal layer on the substrate. Inhibitor gases useful in the present invention may reduce the rate of nuclei growth by decreasing the net sticking coefficient of a precursor gas on the surface of growing nuclei. Inhibitor gases may be neutral or possess an electric charge (i.e. an ion).

As used herein, the phrase "density of nuclei" or the term "density", when it refers to nuclei on a surface, refers to areal density, i.e., density over a two-dimensional area, quantified as the number of nuclei per unit area.

The term "physical dimension" or "dimension" refers to a physical characteristic of a structure, feature of a structure or pattern of structures or features that characterizes how the structure, features or pattern of structures or features is oriented in two or three dimensions and/or occupies space. Physical dimensions of structures, features of structures or patterns of structures or features include, length, width, height, depth, radius, radius of curvature and periodicity. "Nanosized" refers to a physical dimension ranging from 1 nm to 1000 nm and "microsized" refers to a physical dimension ranging from 1 µm to 1000 µm.

"Smooth" refers to a property of a thin film relating to the extent of vertical deviations of a real surface from its ideal form, such as a planar geometry of a thin film. In an embodiment, a smooth film has a low surface roughness, such as a surface root mean squared (rms) surface roughness less than or equal to 20 nm, and in some embodiments a surface root mean squared (rms) surface roughness less than or equal to 10 nm. In an embodiment, an ultrasmooth film has a very low surface roughness, such as a surface root mean squared (rms) surface roughness less than or equal to 1 nm.

"Precursor gas" refers to molecules or atoms that interact with a receiving surface of a substrate in a manner that forms nuclei and/or a deposited layer (i.e. undergoes deposition), such as a thin film layer. Precursor gases interact with a receiving surface, for example, via accommodation to result in nucleation and growth of nuclei. Precursor gases may also interact with the surfaces of nuclei, for example, via accommodation to result in growth of nuclei. Useful precursor gases, for example, are CVD or ALD precursors that react with the surfaces of a substrate to generate a deposited layer having a desired composition via a chemical vapor deposition process or atomic layer deposition process. Alternatively, other useful precursor gases are PVD gases that condense on a substrate surface, are physi-adsorbed and/or are chemi-adsorbed on a substrate surface via a physical vapor deposition process. Useful precursor gases include, but are not limited to, pure elements, and compounds that are combinations of elements (including hydrogen) with one or more of the following functional groups: hydrides, borohydrides, halides, oxides, chalcogenides, nitrides, pnictides, alkyls, aryls, allyls, cyclopentadienyls, alkenes, arenes, silyls, amides, amidinates, amines, phosphides, phosphines, arsines, diazines, alkoxides, alcohols, ethers, siloxides, carboxylates, beta-diketonates, thiolates, selenolates, and tellurolates. The present invention includes methods simultaneously exposing a substrate to a plurality of precursor gases, and methods wherein different precursor gases are sequentially exposed to a substrate undergoing processing (i.e. a first precursor gas(es) is replaced with different precursor gas(es) during processing).

"Fluid communication" refers to the configuration of two or more elements such that a fluid, such as a gas, is capable of flowing in the gas phase or via surface diffusion from one element to another element. Elements may be in fluid communication via one or more additional elements such as openings, tubes, channels, valves, pumps or any combination of these.

"Substrate" refers to a material, layer or other structure having a surface, such as a receiving surface, that is capable of supporting a deposited material, such as a thin film structure or layer. Substrates may optionally have a receiving surface having one or more features, such as nanosized or microsized recessed features including high aspect ratio features.

"Semiconductor" refers to any material that is an insulator at a very low temperature, but which has an appreciable electrical conductivity at an elevated temperature of about 300 Kelvin and/or when suitably modified by alloying with "dopant" atoms that purposefully increase the electrical conductivity. In the present description, use of the term semiconductor is intended to be consistent with use of this term in the art of microelectronics and electronic devices. Useful semiconductors include those comprising elemental semiconductors, such as silicon, germanium and carbon, and compound semiconductors, such as group IV compound semiconductors such as SiC and SiGe, group III-V semiconductors such as AlSb, AlAs, AlN, AlP, BN, BP, BAs, GaSb, GaAs, GaN, GaP, InSb, InAs, InN, and InP, group III-V ternary semiconductor alloys such as $Al_xGa_{1-x}As$, group II-VI semiconductors such as CsSe, CdS, CdTe, ZnO, ZnSe, ZnS, and ZnTe, group I-VII semiconductors such as CuCl, group IV-VI semiconductors such as PbS, PbTe, and SnS, layer semiconductors such as $PbI_2$, $MoS_2$, and GaSe, and oxide semiconductors such as CuO and $Cu_2O$. The term semiconductor includes intrinsic semiconductors and extrinsic semiconductors that are doped with one or more selected materials, including semiconductors having p-type doping materials and n-type doping materials, to provide beneficial electronic properties useful for a given application or device. The term semiconductor includes composite materials comprising a mixture of semiconductors and/or dopants. Specific semiconductor materials useful for some embodiments include, but are not limited to, Si, Ge, Se, diamond, fullerenes, SiC, SiGe, SiO, $SiO_2$, SiN, AlSb, AlAs, AlIn, AlN, AlP, AlS, BN, BP, BAs, $As_2S_3$, GaSb, GaAs, GaN, GaP, GaSe, InSb, InAs, InN, InP, CsSe, CdS, CdSe, CdTe, $Cd_3P_2$, $Cd_3As_2$, $Cd_3Sb_2$, ZnO, ZnSe, ZnS, ZnTe, $Zn_3P_2$, $Zn_3As_2$, $Zn_3Sb_2$, $ZnSiP_2$, CuCl, PbS, PbSe, PbTe, FeO, $FeS_2$, NiO, EuO, EuS, PtSi, TlBr, $CrBr_3$, SnS, SnTe, $PbI_2$, $MoS_2$, GaSe, CuO, $Cu_2O$, HgS, HgSe, HgTe, $HgI_2$, MgS, MgSe, MgTe, CaS, CaSe, SrS, SrTe, BaS, BaSe, BaTe, $SnO_2$, TiO, $TiO_2$, $Bi_2S_3$, $Bi_2O_3$, $Bi_2Te_3$, $BiI_3$, $UO_2$, $UO_3$, $AgGaS_2$, PbMnTe, $BaTiO_3$, $SrTiO_3$, $LiNbO_3$, $La_2CuO_4$, $La_{0.7}Ca_{0.3}MnO_3$, CdZnTe, CdMnTe, $CuInSe_2$, copper indium gallium selenide (CIGS), HgCdTe, HgZnTe, HgZnSe, PbSnTe, $Tl_2SnTe_5$, $Tl_2GeTe_5$, AlGaAs, AlGaN, AlGaP, AlInAs, AlInSb, AlInP, AlInAsP, AlGaAsN, GaAsP, GaAsN, GaMnAs, GaAsSbN, GaInAs, GaInP, AlGaAsSb, AlGaAsP, AlGaInP, GaInAsP, InGaAs, InGaP, InGaN, InAsSb, InGaSb, InMnAs, InGaAsP, InGaAsN, InAlAsN, GaInNAsSb, GaInAsSbP, and any combination of these. Porous silicon semiconductor materials are useful for aspects described herein. Impurities of semiconductor materials are atoms, ions and/or molecules other than the semiconductor material(s) themselves or any dopants provided to the semiconductor material. Impurities are undesirable materials present in semiconductor materials which may negatively impact the electronic properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

"Dielectric" or "insulating" refers to a non-conducting material having a conductivity less than 100 S/m, or less than 50 S/m, or less than 10 S/m or less than 1 S/m. Specific examples of inorganic dielectric materials include, but are not limited to, nitrides, such as silicon nitride, carbides, silicon dioxide and polymers.

"Conductive" and "electrically conductive" refer to a characteristic or physical property of a material that readily conducts electrons. A conductive material has a conductivity greater than 100 S/m, or greater than 500 S/m, or greater than 800 S/m, or greater than 1000 S/m, or greater than 2500 S/m, or greater than 5000 S/m. Specific examples of conductive materials include, but are not limited to, metals, doped semiconductors, doped or off-stoichiometric oxides, and polymers.

"Electronic device" generally refers to a device incorporating a plurality of components, and includes large area electronics, macroelectronic devices, display devices, integrated circuits, memory devices, photovoltaic devices, MEMS, NEMS, microfluidic and nanofluidic devices, and sensors including biological and/or chemical sensors, and physical sensors (e.g., temperature, etc.).

"Coalescence" refers to a process in which formation and growth of nuclei on a substrate leads to the conception of a substantially pinhole-free film, such as a smooth thin film layer or other structure.

As generally understood in the art, "hfac" refers to hexafluoroacetylacetone or an ionic form thereof, e.g., hexafluoroacetylacetonate; "dme" refers to 1,2-dimethoxyethane; "vtms" refers to vinyltrimethylsilane; "mhy" refers to 2-methyl-1-hexen-3-yne; and "tmod" refers to 2,2,7-trimethyloctane-3,5-dione or an ionic form thereof, e.g., 2,2,7-trimethyloctane-3,5-dionate.

In the following description, numerous specific details of the devices, device components and methods of the present invention are set forth in order to provide a thorough explanation of the precise nature of the invention. It will be apparent, however, to those of skill in the art that the invention can be practiced without these specific details.

Figure 1:
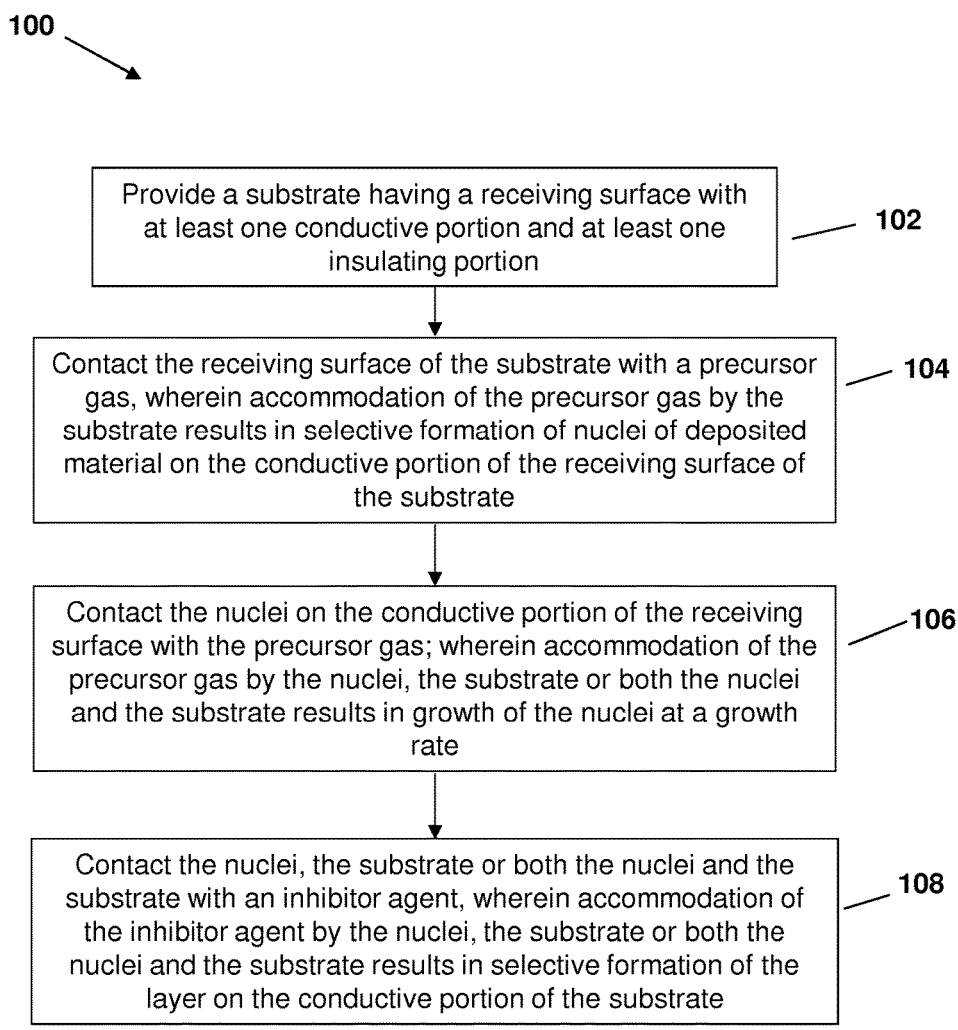
FIG. 1 is a schematic providing a process flow diagram of methods of the invention for making smooth thin film structures.

FIG. 1 provides a flowchart 100 illustrating exemplary steps for a method of using an inhibitor molecule in chemical vapor deposition (CVD) to afford deposition of a metal on a metal substrate with no deposition on an adjacent dielectric substrate, such as a substrate for an electronic device. In step 102, a substrate having a receiving surface with at least one conductive metal oxide portion and at least one dielectric portion is provided, for example, the substrate may be provided in a deposition chamber such as an evaporative, sputtering, CVD or ALD deposition chamber. The dielectric portion of the substrate may be, but is not limited to, thermal silicon dioxide ($SiO_2$), or porous, carbon-doped $SiO_2$ (CDO) The conductive metal oxide portion of the substrate may be, but is not limited to, ruthenium oxide, $RuO_2$, or another metal oxide. The substrate may, in some embodiments, include one or more recessed features—such as a trench, trough, slit, channel, via, hole, void, pore or depression—and the smooth metal layer may fill or coat the recessed feature(s). Optionally, the substrate is heated to facilitate uptake of precursor and nucleation and growth of the thin film. In step 104, the receiving surface of the substrate is contacted with a precursor gas and an inhibitor agent. The precursor gas may, for example, be a high purity gas CVD or ALD precursor gas (e.g., at least 99% pure, at least 99.9% pure, or at least 99.99% pure) injected into a reaction chamber, which is optionally at a low pressure. One example of a precursor gas is Cu(hfac)VTMS. (where hfac=hexafluoroacetylacetonate, and VTMS=vinyltrimethylsilane). One example of an inhibitor agent is the volatile molecule VTMS, which can serve as a growth inhibitor. An inert carrier gas, such as $N_2$, Ar, Xe, or combinations thereof, may be provided to help transport the precursor gas into the deposition chamber.

Still referring to FIG. 1, step 104, accommodation of the precursor gas by the substrate results in selective formation of nuclei of deposited material on the conductive metal oxide portion of the receiving surface of the substrate. In step 106, the nuclei on the conductive metal oxide portion of the receiving surface are contacted with the precursor gas; wherein accommodation of the precursor gas by the nuclei, the substrate or both the nuclei and the substrate results in growth of the nuclei on the conductive metal surface at a growth rate. In step 108, the nuclei, the substrate or both the nuclei and the substrate are contacted with an inhibitor agent, wherein accommodation of the inhibitor agent by the nuclei, the substrate or both the nuclei and the substrate results in selective formation of the smooth layer on the conductive metal oxide portion of the substrate. As described in FIG. 1, steps 104, 106 and 108 may occur simultaneously or sequentially, with any one of the steps occurring first.

Figure 2:
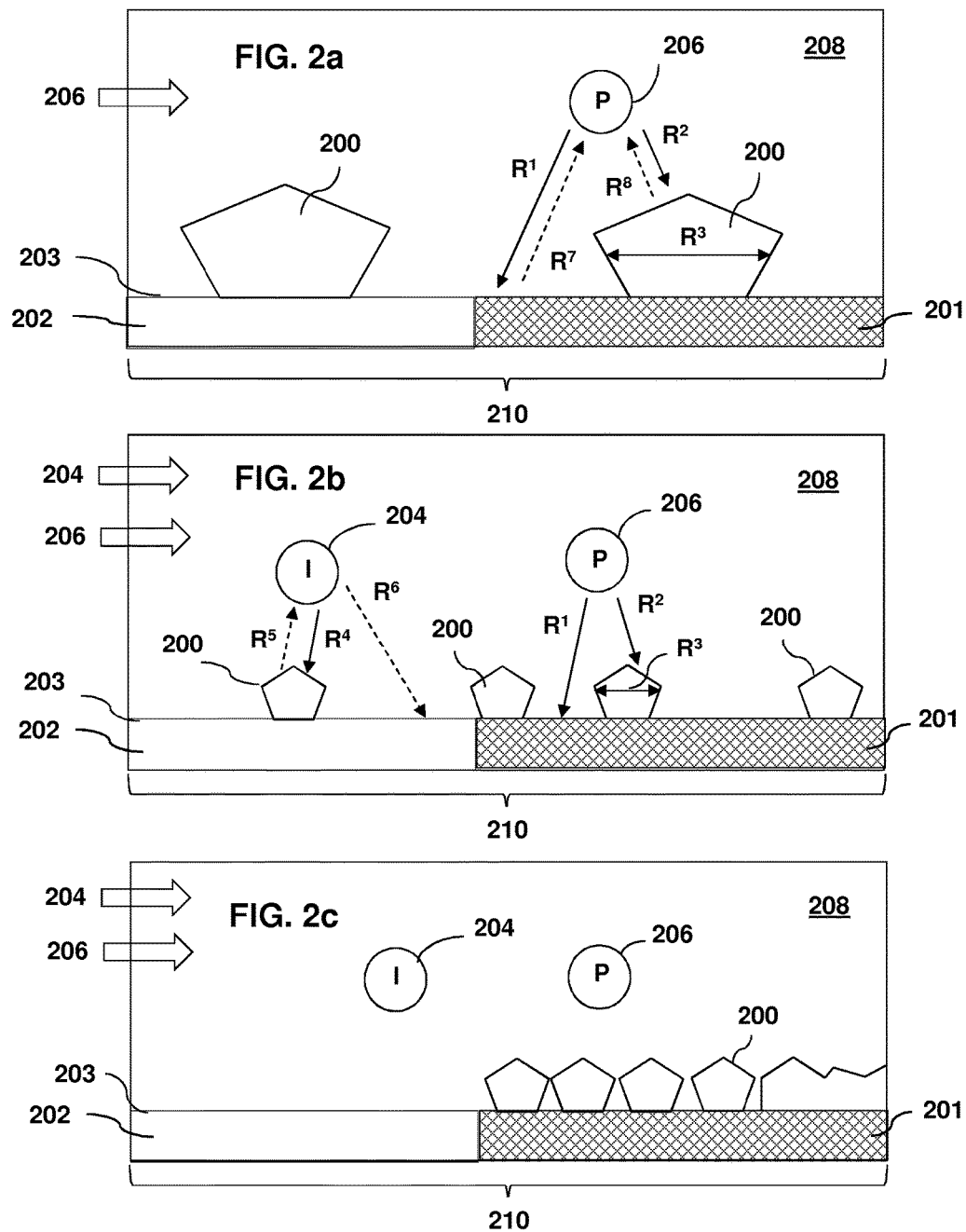
FIGS. 2a, 2b and 2c provide schematic diagrams illustrating deposition processing in a method involving exposure of a substrate to a precursor gas (FIG. 2a) and a method involving simultaneous exposure of a substrate to a precursor gas and a inhibitor agent (FIGS. 2b and 2c).

FIGS. 2a, 2b and 2c show schematic diagrams of the formation and growth of nuclei 200 on a receiving surface 203 of a substrate 210 having a conductive metal oxide portion 201 and a dielectric portion 202. FIG. 2a illustrates conditions wherein a precursor gas 206 is provided in the absence of an inhibitor agent gas 204, and FIG. 2b illustrates conditions wherein a precursor gas 206 and an inhibitor agent 204 are provided together. The arrows shown in FIGS. 2a and 2b are intended to schematically illustrate some processes (e.g., accommodation, chemical reaction, growth of nuclei, desorption, release to gas phase, etc.) involved in formation of a thin film structure. Solid arrows indicate steps in some methods of the invention and dashed arrows indicate processes that may or may not occur depending on the processing conditions (e.g., composition and partial pressure of inhibitor agent, composition and partial pressure of precursor gas, composition of substrate, temperature, etc.). The letter "P" schematically represents precursor gas and the letter "I" schematically represents the inhibitor agent.

In FIG. 2a, a precursor gas 206 is provided to a reaction chamber 208 including a substrate 210 with a conductive metal oxide portion 201 and a dielectric portion 202, such as a deposition chamber having a substrate for an electronic device with at least one conductive metal oxide portion 201 and at least one dielectric portion 202. Introduction of precursor gas 206 to the reaction chamber is schematically shown by the arrow in the left corner of FIG. 2a. A carrier gas (not shown) is optionally provided with the precursor gas. Precursor gas 206 is accommodated by receiving surface 203 of the substrate 210 with a conductive metal oxide portion 201 and a dielectric portion 202 so as to generate nuclei 200 of deposited material on the receiving surface for each portion of the substrate 210, for example, by a nucleation process involving chemically or physically adsorbed precursor gas or reaction products of the precursor gas 206. In some embodiments, for example, accommodation of precursor gas 206 by receiving surface 203 of conductive oxide metal portion 201 and dielectric portion 202 of substrate 210 occurs via chemical reaction on receiving surface 203 of each of the portions, 201 and 202, of the substrate 210, such as a decomposition reaction(s), thereby resulting in formation of nuclei 200 of deposited material at a growth rate and formation of additional nuclei. Precursor gas 206 is also accommodated on the surfaces of nuclei 200 and/or by a receiving surface 203 of conductive metal oxide portion 201 and dielectric portion 202 of substrate 210, thereby resulting in growth of nuclei 200. A representative example of the process of accommodation of precursor gas on a surface is illustrated in FIG. 2a. The process of accommodation of a precursor gas 206 on conductive metal oxide portion 201 of the substrate 210 is shown as $R^1$, the process of desorption of precursor gas 206 from conductive metal oxide portion 201 is shown as $R^7$, the process of accommodation of precursor gas 206 on nuclei 200 is shown as $R^2$, the process of desorption of precursor gas 206 from nuclei 200 is shown as $R^8$, and growth of nuclei 200 from accommodation of precursor gas 206 is shown as $R^3$.

In FIG. 2b, a combination of precursor gas 206 and an inhibitor agent 204 is provided to reaction chamber 208 including receiving surface 203 of conductive metal oxide portion 201 and dielectric portion 202 of substrate 210, such as a deposition chamber having a substrate for an electronic device with one or more recessed features. Introduction of precursor gas 206 and inhibitor agent 204 to reaction chamber 208 is schematically shown by the arrows in the left corner of FIGS. 2b and 2c. Introduction of inhibitor agent 204 into reaction chamber 208 may occur concurrently or sequentially with the introduction of precursor gas 206. A carrier gas (not shown) is optionally provided with the precursor gas and inhibitor agent. Precursor gas 206 undergoes similar processes as described in connection with FIG. 2a, such as accommodation on conductive metal oxide portion 201 and dielectric portion 202, and accommodation on the surfaces of nuclei 200, thereby resulting in formation and growth of nuclei 200 on receiving surface 203 of conductive metal oxide portion 201 and dielectric portion 202 of substrate 210. In addition, inhibitor agent 204 is accommodated by nuclei 200 and/or on receiving surface 203. Optionally, inhibitor agent 204 comprises an inhibitor gas that undergoes accommodation and/or chemical reactions to generate condensed phase inhibitor species on the surface, or in the bulk, of nuclei 200 and/or on receiving surface 203 of a conductive metal oxide portion 202 and a dielectric portion 201 of a substrate 210. Accommodation of inhibitor agent 204 by the surfaces of nuclei 200 is shown by process $R^4$, accommodation of inhibitor agent 204 by receiving surface 203 of dielectric portion 202 is shown by process $R^6$, and release (e.g., desorption) of a condensed phase of the precursor gas species to the gas phase is shown by process $R^7$. In some embodiments, inhibitor agent 204 functions to decrease the rate of nuclei growth (process $R^3$) relative to the rate of formation of nuclei 200 on receiving surface 203 of a conductive metal oxide portion 201. In an embodiment, for example, accommodation of inhibitor agent 204 forms inhibitor species on nuclei 200 which decreases the growth rate of nuclei 200 by reducing the rate of process $R^2$ corresponding to accommodation of precursor gas 206 on nuclei 200.

In an embodiment, accommodation of inhibitor agent 204 on nuclei 200 on the dielectric portion 202 of a substrate 210 decreases the growth rate of nuclei 200 by reducing the rate of process $R^4$ and increasing the rate of process $R^5$. In this case, the rate of process $R^5$ is increased relative to the rate of process $R^4$ such that there is little or no formation of nuclei 200 on dielectric portion 202 of a substrate 210. This is illustrated in FIG. 2c, which shows substrate 210 at a later time after exposure to precursor gas 206 and inhibitor agent 204. As shown in FIG. 2c, receiving surface 203 of conductive metal oxide portion 201 of substrate 210 is covered by additional nuclei which are beginning to coalesce into a thin film, while the receiving surface 203 of dielectric portion 202 of a substrate 210 is free of nuclei 200. As shown in FIG. 2c, receiving surface 203 of the conductive metal oxide portion 201 of substrate 210 is characterized by a larger density of smaller nuclei on receiving surface 203 compared to that shown in FIG. 2a.

The invention may be further understood by the following non-limiting examples.

Example 1: Surface-Selective Chemical Vapor Deposition of Copper Films Through the Use of a Molecular Inhibitor Abstract This Example reports a simple process for the selective deposition of copper films on $RuO_2$, while no Cu nucleation occurs on thermal $SiO_2$ or porous carbon doped oxide (CDO). Using the precursor Cu(hfac)VTMS, selectivity is attained by adding a co-flow of excess VTMS to act as a growth inhibitor. With precursor alone, 52 nm of Cu grows on $RuO_2$; on CDO or on thermal $SiO_2$, nucleation is delayed such that 41 or 1.3 nm are deposited, respectively. Repeating the experiment with the co-flow of VTMS affords a 12 nm thick Cu film on $RuO_2$ with roughness of 1.8 nm. But on CDO or thermal $SiO_2$, the Cu deposition is only 0.10 or ~0.04 nm, respectively. AFM scans of the CDO and $SiO_2$ surfaces are identical to the bare substrates. The small quantity of Cu that is deposited must be finely distributed, presumably on defect sites; it can be etched to below the RBS detection limit using a co-flow of Hhfac and VTMS for a few minutes at the end of the growth. The process window is wide: selective growth occurs for a range of VTMS pressures (0.5-2.0 mTorr), growth times (up to 90 min), and growth temperatures (up to 180° C.).

Introduction

The ability to achieve the selective chemical vapor deposition (CVD) of thin films on one type of substrate but not on others is emerging as a critical need in the fabrication of nanoscale devices[1-4]. One principal advantage of selective deposition is that it simplifies the manufacturing process by eliminating some of the patterning and etching steps. Selective deposition can be achieved if there is a large difference between the nucleation rates of the deposited material on the surfaces in question. This rate difference can be achieved by relying on intrinsic differences between the chemical reactivity of the as-prepared surfaces[5,6], by activating the growth surface[3], or by passivating the non-growth surface, e.g., by covering it with a self-assembled monolayer (SAM)[7-11]. All of these approaches, however, suffer from a common problem: it is difficult to eliminate "stray" nucleation on the intended non-growth surface because defects as small as one impurity atom or dangling bond may be sufficient to initiate film growth[4, 12-15]. These nuclei then grow into islands that can cause device failure or a reliability problem. Therefore, a challenge is to eliminate stray nucleation on the non-growth surface as completely as possible.

Figure 4:
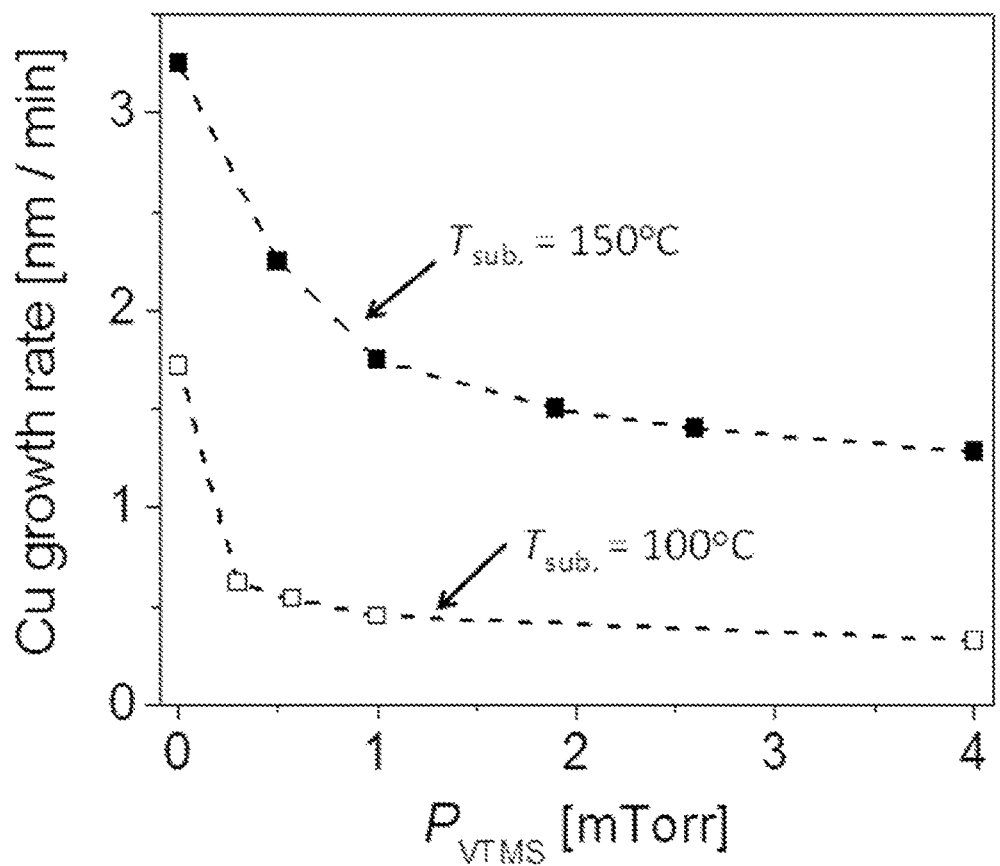
FIG. 4 provides a plot showing the suppression of the steady-state growth rate of Cu on Cu from the Cu(hfac) VTMS precursor vs. $P_{VTMS}$ with $P_{prec.}$=0.1 mTorr and $T_{sub.}$=100° C.[16] or 150° C.[38].

For the CVD of copper from the precursor Cu(hfac) VTMS, where hfac=hexafluoroacetylacetonate, it has been previously shown that the volatile molecule vinyltrimethylsilane (VTMS) serves as a growth inhibitor: addition of VTMS reduces the Cu growth rate on a Cu surface by a factor of four[16] (FIG. 4). Here, it is demonstrated that the magnitude of the rate inhibition by VTMS is much larger on other surfaces and can be used to afford essentially perfect selectivity: there is rapid growth of Cu on $RuO_2$ (generated by air-exposure of Ru) but essentially no growth on thermal SiO$_2$ or porous, carbon-doped SiO$_2$ (CDO). It is also shown that the small amount of Cu that deposits on the non-growth surfaces can easily be etched away using a co-flow of Hhfac and VTMS for a few minutes.

Experiment

CVD experiments are carried out in a cold wall CVD reactor described in detail elsewhere[17]. In-situ spectroscopic ellipsometry (SE) is used to determine the onset of nucleation and the steady state Cu growth rate, as described in earlier studies[16]. The most sensitive response may occur in the amplitude (psi) or phase (delta) data, at a particular wavelength, depending on the combination of the substrate layers and the optical constants of the deposited material[18-20]. Ex-situ atomic force microscopy (AFM) is used to detect the formation of Cu nuclei and to measure the surface height distribution. Rutherford backscattering spectrometry (RBS) is used to determine the areal coverage of copper, which is reported as an equivalent thickness. Cross-sectional scanning electron microscopy (SEM) is used to examine the film morphology. The growth surface is e-beam evaporated Ru subsequently exposed to air, which is a candidate diffusion barrier material with good Cu wettability[21]. A high resolution XPS spectrum indicates that the air-exposed Ru is in the stable oxide form, RuO$_2$. The non-growth surface is porous CDO (results hold on dense CDO as well) or thermally grown SiO$_2$ on Si(100), both of which are typical dielectrics in microelectronics fabrication. The growth temperature is 100, 120, or 180° C.; the partial pressure of the Cu(hfac)VTMS precursor is 0.04 or 0.10 mTorr; the partial pressure of the VTMS inhibitor is 0.5, 1, 2, or 4 mTorr; and the growth time is 10, 30, or 90 min. At the pressures used, gas phase collisions are negligible; all reactions must occur at the film growth surface. No surface pretreatment is performed before the substrates are loaded into the CVD reactor. In the present experiments, the precursor is purified by distillation so that it is free of excess VTMS, as described elsewhere[22]. Note that commercially available precursor typically contains an excess of VTMS or Cu(hfac)$_2$ in order to enhance the shelf life against decomposition on the container walls[23-25].

Results and Discussion

Figure 5:
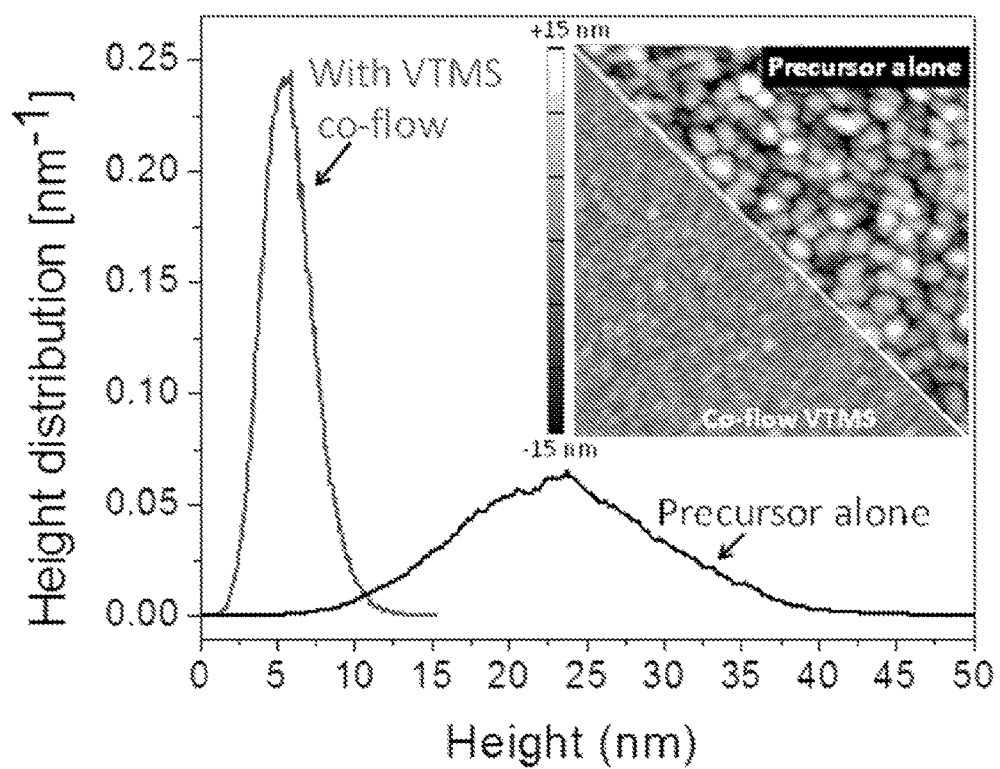
FIG. 5 provides a plot showing the AFM-determined height distributions and images (inset) of a $RuO_2$ surface as a function of sample history: growth with Cu(hfac)VTMS precursor alone and growth with co-flowing VTMS inhibitor. Growth conditions: $T_{sub}$=100° C., $t_{growth}$=3 min, $P_{prec.}$=0.1 mTorr, and $P_{inhi.}$=3 mTorr. The composite AFM image size is 2×2 μm and the gray scale bar applies to both images. With VTMS co-flow, no surface height exceeds 15 nm.

As a reference for comparison with later results, growth of copper films onto RuO$_2$ by chemical vapor deposition from 0.1 mTorr of Cu(hfac)VTMS at 100° C. for 30 min affords a 52 nm thick film with 5.7 nm rms surface roughness (FIG. 5 inset, top right AFM image). If the experiment is repeated but with a co-flow of 3 mTorr VTMS during growth, the resulting film is 12 nm thick and has a rms surface roughness of 1.8 nm (FIG. 5 inset, bottom left AFM image). Thus, adding 3 mTorr of VTMS decreases the total amount of deposited copper by a factor of 4 compared to growth using the Cu(hfac)VTMS precursor alone. This reduction in film thickness is consistent with the inhibitory effect of VTMS on ruthenium oxide that has been described elsewhere[16].

Figure 6:
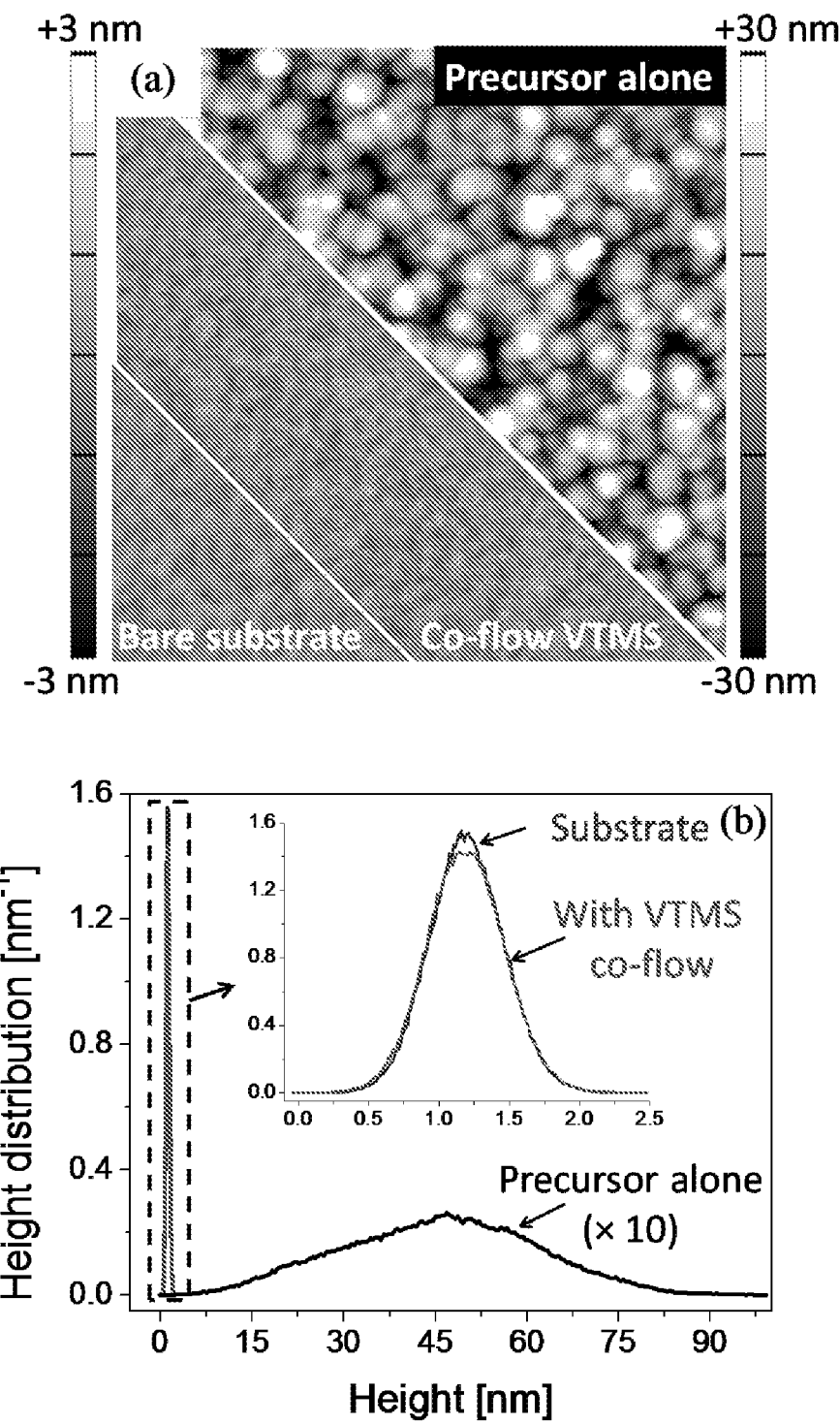
FIG. 6 provides a plot showing the AFM-determined height distributions (b) and images (a) of copper films on porous CDO, the co-flow of VTMS affords perfect selectivity. AFM images (a) for growth with precursor alone (top right), with VTMS co-flow (middle), and bare substrate (bottom left); $T_{sub}$=100° C., $t_{growth}$=30 min, $P_{prec.}$=0.04 mTorr and $P_{inhi.}$=3 mTorr. The composite AFM image is 2×2 μm in size; the gray scale bar on the left corresponds to the bare substrate and the co-flow of VTMS. Height distribution (b) corresponds to the top AFM images. With VTMS co-flow under these conditions, no surface height exceeds 2.5 nm.
Figure 7:
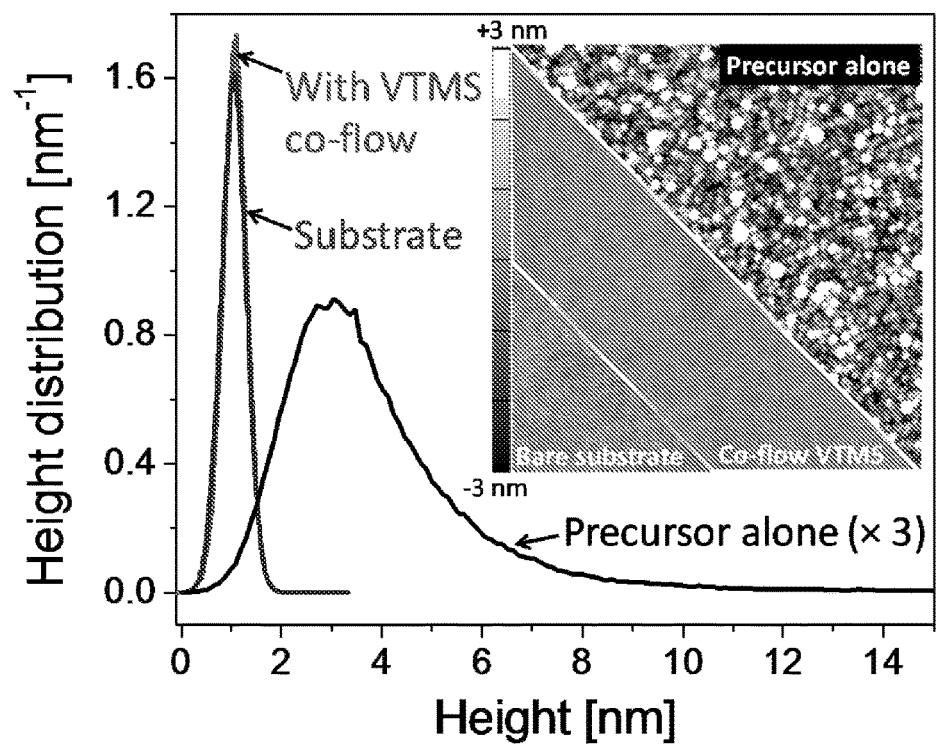
FIG. 7 provides a plot showing the AFM-determined height distributions and images (inset) of a $SiO_2$ surface as a function of sample history: growth with Cu(hfac)VTMS precursor alone, with co-flowing VTMS inhibitor, and bare substrate. Growth conditions: $T_{sub}$=120° C., $t_{growth}$=30 min, $P_{prec.}$=0.04 mTorr, and $P_{inhi.}$=3 mTorr. The composite AFM image is 2×2 μm in size; the gray scale bar applies to all three images. With VTMS co-flow under these conditions, no surface height exceeds 3.5 nm.

The effect of VTMS on the amount of deposited Cu is dramatically larger on CDO and SiO$_2$ surfaces. On CDO, growth from 0.04 mTorr of Cu(hfac)VTMS at 100° C. for 30 min affords 41 nm Cu (FIG. 6, top right). When the experiment is repeated with a co-flow of 3 mTorr VTMS, the Cu film thickness is reduced to 0.10 nm (i.e., a factor of 400 less copper) and the height distribution of the resulting surface is identical to that of the bare substrate (FIG. 6). On electronic grade thermal SiO$_2$, growth from 0.04 mTorr of Cu(hfac)VTMS at 120° C. affords 1.3 nm Cu (FIG. 7 inset, top right AFM image). With a 3 mTorr co-flow of VTMS, the Cu coverage is 0.04 nm and the height distribution is identical to the starting substrate (FIG. 7 inset, bottom left AFM image).

Figure 8:
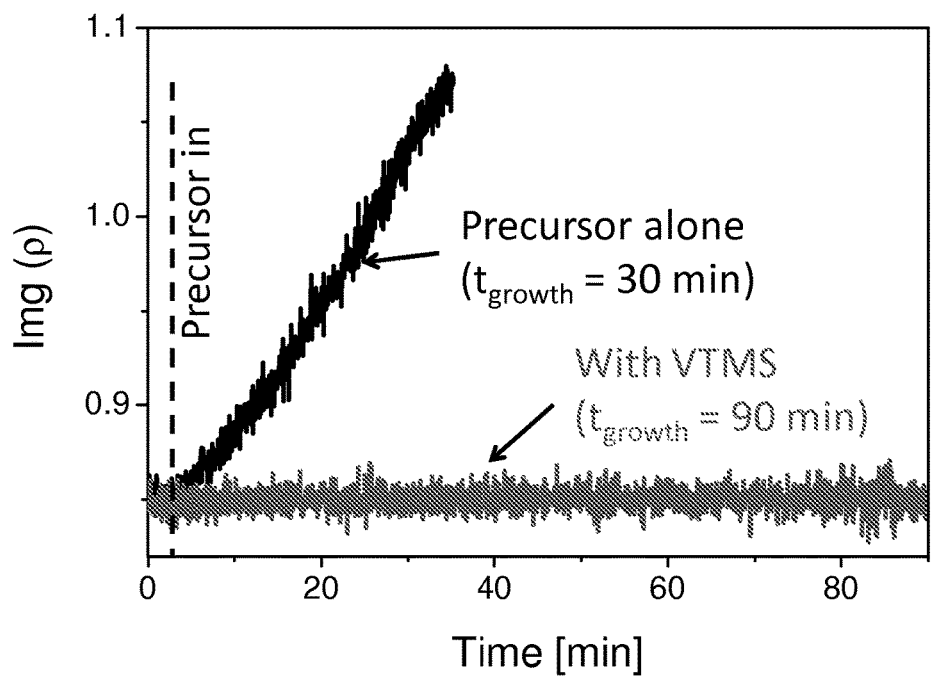
FIG. 8 provides a plot showing real-time ellipsometry data: the imaginary part of the complex reflectivity p at a photon energy of 2.47 eV. Growth on thermal $SiO_2$ under the conditions of FIG. 7. Using the precursor alone, copper growth initiates after ~30 sec; with a co-flow of VTMS inhibitor, no change is detectable through the longest experimental time of 90 min (the change in lmg (ρ)~0.01).

In order to gain additional information about the kinetics, the effect of VTMS on the nucleation delay was investigated; this is because selective growth by definition will take place if the nucleation delay on the non-growth substrate is longer than the growth time of interest on the growth substrate. Using the Cu(hfac)VTMS precursor alone, the nucleation delay as judged by in situ SE is essentially zero on CDO and ~30 sec on SiO$_2$. In the presence of VTMS, Cu nucleation is suppressed for the 30 min duration of the experiment on CDO, and only a tiny change in the SE data occurs for growth times of 30 or 90 min on SiO$_2$, FIG. 8.

Figure 9:
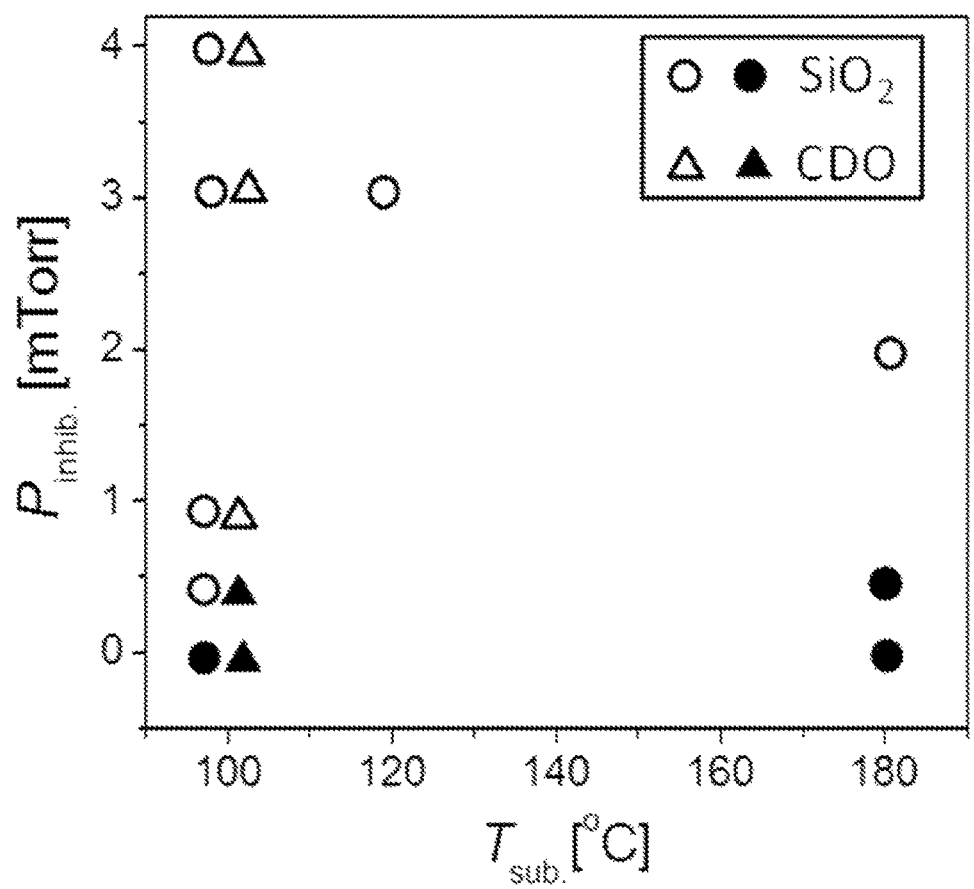
FIG. 9 provides a plot of the formation or lack of formation of Cu nuclei on dielectric substrates in 30 min depositions at a precursor pressure of 0.04 mTorr as a function of the partial pressure of the VTMS inhibitor agent and of the substrate temperature. Open symbols: growth conditions for which no Cu nuclei can be detected by AFM on thermal $SiO_2$ (circles) or on porous CDO (triangles). Filled symbols: conditions that afford Cu islands on those substrates, i.e., perfect selectivity is not achieved.

The results show that a mixture of Cu(hfac)VTMS and VTMS can effect Cu deposition selectively on RuO$_2$ over SiO$_2$ or CDO. Selective deposition is obtained over a broad range of substrate temperatures and inhibitor pressures; the operational boundaries of the process are defined by cases—with low VTMS pressure or high temperature—where stray nucleation can no longer be completely eliminated (FIG. 9).

The mechanistic steps responsible for the deposition of Cu from Cu(hfac)VTMS are well known, and involve (a) reversible adsorption of Cu(hfac)VTMS, (b) dissociation and desorption of VTMS, (c) disproportionation of the resulting Cu(hfac) fragments to Cu and Cu(hfac)$_2$, and (d) desorption of Cu(hfac)$_2$ (FIG. 10)[26-29]. The Cu(hfac) fragments thus have two reaction channels: they can react with VTMS to regenerate the Cu(hfac)VTMS precursor, or they can disproportionate to products. Let us assume that the disproportionation step is irreversible under these low-pressure conditions, and first order in the surface coverage of Cu(hfac) fragments. (Similar conclusions result if it is assumed that the disproportionation is second order in the surface coverage, so that the exact molecularity of this step is not important; first order behavior can result if the assembly of the Cu(hfac)$_2$ product occurs in a stepwise fashion, as it does on copper surfaces[30].) Under these assumptions, the deposition rate will be given by $k_r k_d/(k_r + k_a \theta_{VTMS})$, where $k_r$ is the rate constant for the disproportionation step, $k_d$ is the rate constant for the dissociation of Cu(hfac)VTMS to Cu(hfac) and VTMS, $k_a$ is the rate constant for the associative (reverse) reaction, and $\theta_{VTMS}$ is the surface coverage of VTMS. (The incident precursor flux is contained within $k_d$ and the VTMS coverage $\theta_{VTMS}$ is assumed to be in local equilibrium, independent of $k_a$.) The surface coverage of VTMS is likely to be relatively similar on the three surfaces (RuO$_2$, SiO$_2$, and CDO) because they are all oxides. The inhibitory effect of VTMS on the overall growth rate will therefore depend principally on the ratio of $k_r$ to $k_a$. If the ratio is large (i.e., if disproportionation is relatively fast), then adding VTMS will have a comparatively small effect on the overall growth rate. If the ratio is small (i.e., if disproportionation is relatively slow), then adding VTMS will have a comparatively large effect on the overall growth rate. (Note that for the inhibition of Cu growth on Cu, the rate formalism must be modified to include the saturation of sites available to the inhibitor[16], an effect which accounts for the non-zero growth rate observed at high P$_{VTMS}$ (FIG. 4). That need not be considered here, where the central issue is the ratio of $k_r$ to $k_a$.)

All of the results can be explained if the disproportionation of the Cu(hfac) fragments on the SiO$_2$ and CDO surfaces is relatively slow, but relatively fast on RuO$_2$. It is well known that the activation barrier for the disproportionation reaction is high on SiO$_2$ and CDO compared to that on metals or semiconductors because conductive surfaces catalyze the reaction via charge exchange[31]. Thus Cu(hfac) on a metallic surface (air-exposed Ru or Cu) will disproportionate at a finite rate to afford Cu metal[32], whereas on insulating surfaces ($SiO_2$ or CDO), Cu(hfac) will predominantly recombine with the VTMS inhibitor and desorb as Cu(hfac) VTMS. This huge difference in kinetic rates then affords selective growth. The small amount of Cu deposition seen on the oxide surfaces may be associated with nucleation events on defects or impurities, both of which depend on the processing history of the oxide surface. The very small change in SE signal (Supplementary material) occurs at the onset of growth and then remains constant, which is consistent with Cu attachment on a finite number of pre-existing sites.

Finally, it is found that the small amount of Cu that does deposit on the $SiO_2$ and CDO surfaces in the presence of the VTMS inhibitor (<0.10 nm) can easily be etched away after growth by brief exposure to a mixture of Hhfac and VTMS. In-situ ellipsometry and RBS show that passing a mixture of 6 mTorr of Hhfac and 3 mTorr of VTMS over the oxide surface at 120° C. reduces the amount of Cu to below the detection limit within one minute. The etching step also removes a small amount of the Cu that has been deposited on the $RuO_2$, but the majority of the copper remains. Note that etching cannot be performed during the deposition process because Hhfac promotes the dissociation of Cu(hfac)VTMS, which would degrade the selectivity[33]. The etching reported here probably involves the formation of volatile Cu(hfac)VTMS, either by oxidative addition of Hhfac to the copper surface (with formation of $H_2$), or by co-reaction with the small amount of oxygen in the chamber background (with formation of water). Similar chemistry has been reported for the etching of copper oxides by Hhfac[34,35,36] and the etching of copper metal by a mixture of $Cu(hfac)_2$ and VTMS[37].

Conclusions

Near-perfect selective chemical vapor deposition of Cu from Cu(hfac)VTMS is obtained by adding a co-flow of the growth inhibitor VTMS: Cu deposition occurs on air-exposed Ru but not on thermal $SiO_2$ or on CDO. With respect to Cu growth using the precursor alone, the use of VTMS decreases the deposited thickness of Cu film by a factor of 4 on $RuO_2$ but by a factor of 30-400 on $SiO_2$ or CDO. Selectivity on oxide surfaces is explained by the rate of associative desorption of Cu(hfac)VTMS (which is enhanced by adding VTMS) relative to the rate of Cu(hfac) disproportionation. On non-conductive surfaces the latter reaction is relatively slow, and addition of VTMS greatly forestalls Cu nucleation; by contrast, on conductive surfaces the disproportionation rate is fast and growth persists.

References

1. J. Xie, X. H. Yao, I. P. Madden, D. E. Jiang, L. Y. Chou, C. K. Tsung and D. W. Wang, *Journal of the American Chemical Society*, 136, 8903 (2014).
2. F. S. M. Hashemi, C. Prasittichai and S. F. Bent, *Journal of Physical Chemistry C*, 118, 10957 (2014).
3. M. J. Hampden-smith and T. T. Kodas, *Chemical Vapor Deposition*, 1, 39 (1995).
4. W. L. Gladfelter, *Chemistry of Materials*, 5, 1372 (1993).
5. G. Wang, C. S. Hsieh, D. S. Tsai, R. S. Chen and Y. S. Huang, *Journal of Materials Chemistry*, 14, 3503 (2004).
6. J. Huang, M. Lee, A. Lucero, L. Cheng and J. Kim, *J. Phys. Chem. C*, 118, 23306 (2014).
7. A. M. Caro, Y. Travaly, G. Beyer, Z. Tokei, G. Maes, G. Borghs and S. Armini, *Microelectronic Engineering*, 106, 76 (2013).
8. W. B. Lin, T. H. Warren, R. G. Nuzzo and G. S. Girolami, *Journal of the American Chemical Society*, 115, 11644 (1993).
9. N. L. Jeon, W. B. Lin, M. K. Erhardt, G. S. Girolami and R. G. Nuzzo, *Langmuir*, 13, 3833 (1997).
10. N. L. Jeon, P. Clem, D. Y. Jung, W. B. Lin, G. S. Girolami, D. A. Payne and R. G. Nuzzo, *Advanced Materials*, 9, 891 (1997).
11. C. Winter, U. Weckenmann, R. A. Fischer, J. Kashammer, V. Scheumann and S. Mittler, *Chemical Vapor Deposition*, 6, 199 (2000).
12. K. A. Perrine, J. M. Lin and A. V. Teplyakov, *Journal of Physical Chemistry C*, 116, 14431 (2012).
13. J. C. Chiou, K. C. Juang and M. C. Chen, *Journal of the Electrochemical Society*, 142, 177 (1995).
14. D. H. Kim, R. H. Wentorf and W. N. Gill, *Journal of Vacuum Science & Technology a-Vacuum Surfaces and Films*, 12, 153 (1994).
15. G. Friese, A. Abdul-Hak, B. Schwierzi and U. Hohne, *Microelectronic Engineering*, 37-8, 157 (1997).
16. S. Babar, L. M. Davis, P. Zhang, E. Mohimi, G. S. Girolami and J. R. Abelson, *ECS Journal of Solid State Science and Technology* 3, Q79 (2014).
17. S. Jayaraman, Y. Yang, D. Y. Kim, G. S. Girolami and J. R. Abelson, *Journal of Vacuum Science & Technology A*, 23, 1619 (2005).
18. S. Babar, T. T. Li and J. R. Abelson, *Journal of Vacuum Science & Technology A*, 32, 060601 (2014).
19. R. Greef, P. A. Bobbert and J. Vlieger, *Journal of Electroanalytical Chemistry*, 280, 283 (1990).
20. C. Basa, M. Tinani and E. A. Irene, *Journal of Vacuum Science & Technology a-Vacuum Surfaces and Films*, 16, 2466 (1998).
21. H. Kim and Y. Shimogaki, *Journal of the Electrochemical Society*, 154, G13 (2007).
22. S. Babar, L. M. Davis, P. Zhang, E. Mohimi, G. S. Girolami and J. R. Abelson, *ECS J. Solid State Sci. Technol.*, 3, Q79 (2014).
23. J. A. T. Norman, D. A. Roberts, A. K. Hochberg, P. Smith, G. A. Petersen, J. E. Parmeter, C. A. Apblett and T. R. Omstead, *Thin Solid Films*, 262, 46 (1995).
24. L. Chen, S. Ganguli, C. Marcadal, S. Wilson and B. Zheng, CVD method of depositing copper films by using improved organocopper precursor blend, in, Applied Materials, Inc., Santa Clara, Calif., USA (2000).
25. shop.gelest.com/Product.aspx?catnum=AKC252.8&Index=0&TotalCount=31.
26. G. S. Girolami, P. M. Jeffries and L. H. Dubois, *Journal of the American Chemical Society*, 115, 1015 (1993).
27. J. Farkas, K. M. Chi, M. J. Hampden-smith, T. T. Kodas and L. H. Dubois, *Materials Science and Engineering B-Solid State Materials for Advanced Technology*, 17, 93 (1993).
28. H. K. Shin, K. M. Chi, M. J. Hampden-smith, T. T. Kodas, J. D. Farr and M. Paffett, *Advanced Materials*, 3, 246 (1991).
29. H. K. Shin, K. M. Chi, M. J. Hampden-smith, T. T. Kodas, J. D. Farr and M. Paffett, *Chemistry of Materials*, 4, 788 (1992).
30. W. B. Lin, R. G. Nuzzo and G. S. Girolami, *Journal of the American Chemical Society*, 118, 5988 (1996).
31. S. K. Kwak, K. S. Chung, I. Park and H. Lim, *Current Applied Physics*, 2, 205 (2002).
32. Y. S. Chung, H. S. Lee, Y. S. Lee and S. Kim, *Surface Science*, 482, 312 (2001).
33. N. Awaya, K. Ohno and Y. Arita, *Journal of the Electrochemical Society*, 142, 3173 (1995).

34. M. A. George, D. W. Hess, S. E. Beck, J. C. Ivankovits, D. A. Bohling and A. P. Lane, *Journal of the Electrochemical Society*, 142, 961 (1995).
35. A. Sekiguchi, A. Kobayashi, T. Koide, O. Okada and N. Hosokawa, *Japanese Journal of Applied Physics Part 1-Regular Papers Brief Communications & Review Papers*, 39, 6478 (2000).
36. R. Steger and R. Masel, *Thin Solid Films*, 342, 221 (1999).
37. J. A. T. Norman, B. A. Muratore, P. N. Dyer, D. A. Roberts and A. K. Hochberg, *Journal De Physique IV*, 1, 271 (1991).
38. N. Kumar, PhD thesis in *Materials Science and Engineering*, University of Illinois at Urbana-Champaign, Urbana-Champaign (2009).

Supplementary Material

Figure 11:
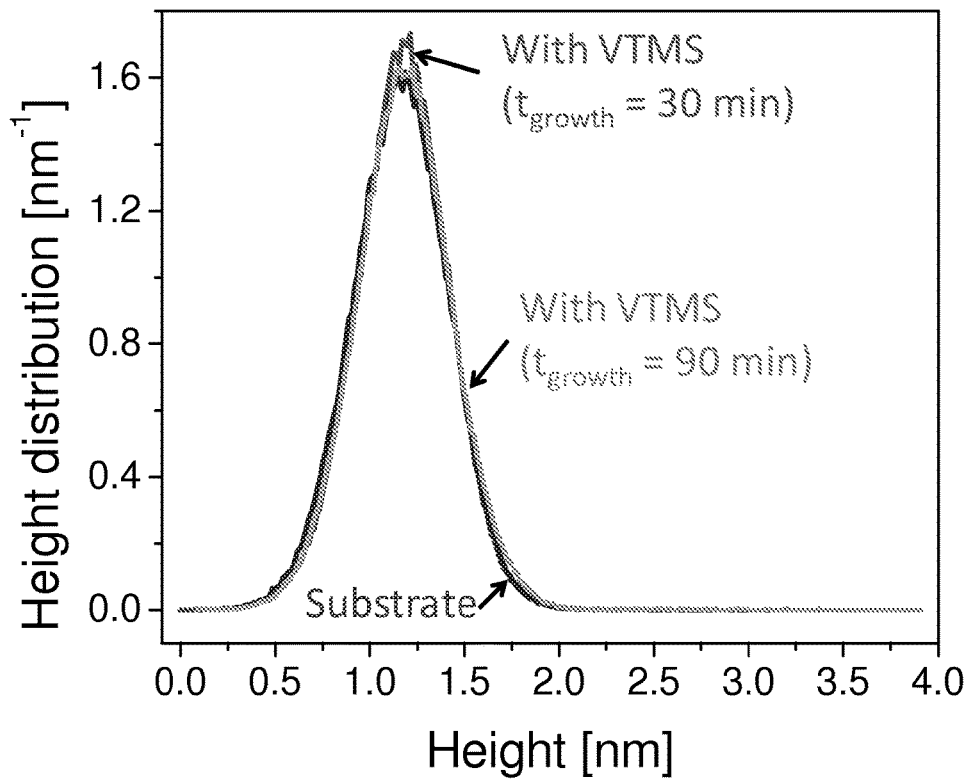
FIG. 11 shows height distribution analysis with the absence of detectable copper growth with co-flowing inhibitor for growth times of 30 or 90 min. The slight differences between the distributions are within experimental error. The substrate is a 300 nm thick thermal $SiO_2$, Tsub=120° C., Pprec=0.04 mTorr, PVTMS=3 mTorr.

FIG. 11 shows height distribution analysis with the absence of detectable copper growth with co-flowing inhibitor for growth times of 30 or 90 min. The slight differences between the distributions are within experimental error. The substrate is a 300 nm thick thermal SiO2, Tsub=120° C., Pprec=0.04 mTorr, PVTMS=3 mTorr.

Figure 12:
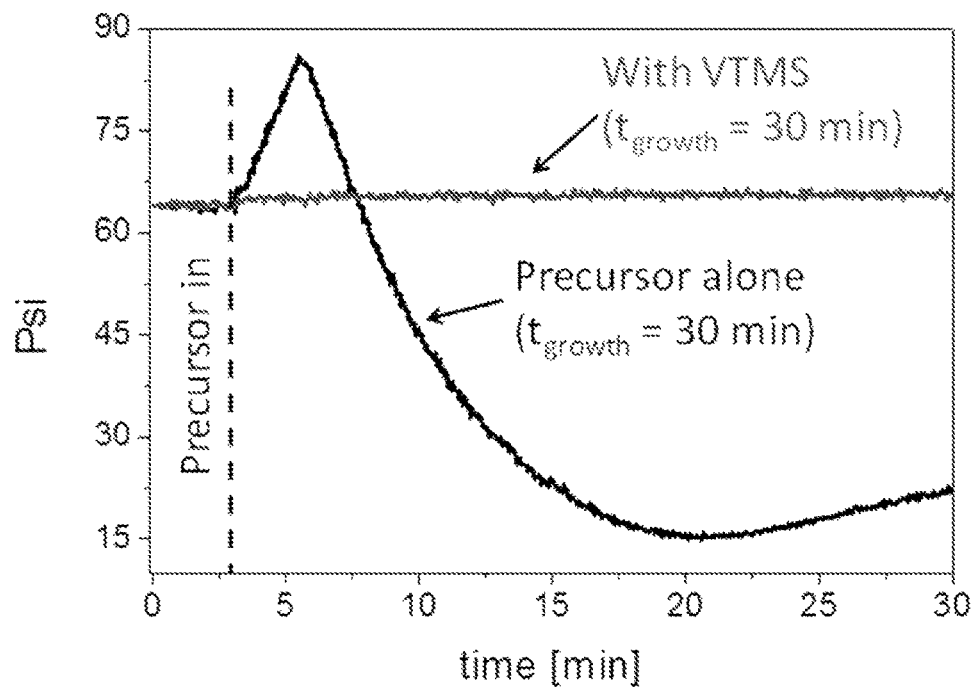
FIG. 12 provides a plot showing real-time ellipsometry data: the ratio of amplitudes Psi at a photon energy of 2.47 eV. Growth on porous carbon doped oxide with $T_{sub}$=100°

FIG. 12 provides a plot showing real-time ellipsometry data: the ratio of amplitudes Psi at a photon energy of 2.47 eV. Growth on porous carbon doped oxide with $T_{sub}$=100° C., $P_{prec}$=0.04 mTorr, $P_{VTMS}$=3 mTorr. Using the precursor alone, copper growth initiates immediately upon flowing precursor into the chamber. With a co-flow of VTMS inhibitor, no change in psi occurs during the experimental time of 30 min. The initial increase of ~1° in psi is likely due to precursor adsorption on the high surface area within the porous CDO.

FIG. 13 provides a plot showing real-time ellipsometry including the copper growth and etching process (on thermal SiO$_2$) with $T_{sub.}$=120° C., $P_{prec.}$=0.04 mTorr, $P_{VTMS}$=3 mTorr: (i) VTMS flow turned on; (ii) precursor flow turned on for 30 min; (iii) precursor turned off; (iv) Hhfac turned on (through a separate delivery tube) with $P_{Hhfac}$=6 mTorr; (v) Hhfac and VTMS flows turned off. The signal after etching by Hhfac (above 36 min) returns to the starting value (up to 3 min). RBS analysis confirms the absence of copper.

Example 2: Use of an Inhibitor Molecule in Chemical Vapor Deposition to Afford Deposition of Copper on a Metal Substrate with No Deposition on Adjacent SiO$_2$ Substrate, i.e., Perfect Surface-Selective Growth Abstract This Example reports a one-step process for selective deposition of Cu on a metallic surface, air-exposed Ru, while no Cu growth at all occurs on adjacent SiO$_2$ surfaces. Selectivity was attained by co-flowing a growth inhibitor, vinyl trimethyl silane (VTMS) along with the stream of the deposition precursor, Cu(hfac)VTMS. With precursor alone, for a growth temperature of 100° C. and a growth time of 30 min., a 52 nm thick Cu film with 6.8 nm rms roughness was formed on air-exposed Ru, and 1×10$^{15}$ Cu atoms/cm$^2$ (as measured by RBS) were deposited on SiO$_2$. Nucleation on SiO$_2$ consisted of islands with an areal density of ~9×10$^8$ cm$^{-2}$ and rms roughness 2.3 nm. The experiment was then repeated, but co-flowing 4 mTorr of VTMS growth inhibitor along with the precursor. In this case, the steady state growth rate of copper on copper decreased four times compared to precursor alone case, and the Cu deposition on SiO$_2$ was undetectable as measured by RBS or by AFM. In 2×2 μm AFM scans of the SiO$_2$ surface, the rms surface roughness was unchanged from that of the original SiO$_2$ substrate (0.2 nm) and no islands (protuberances) were found. But in the same deposition, a 10 nm thick Cu film with rms roughness 1.8 nm was deposited on the air-exposed Ru surface. Thus the co-flow of growth inhibitor provided perfectly selective Cu deposition on the metal surface with respect to the SiO$_2$ surface. This process of selective deposition of Cu is robust: perfect selectivity was also obtained for lower VTMS pressures of 3, 1 and 0.5 mTorr at 100° C.; and the procedure works equally well at a high substrate temperature, T=180° C. with 2 mTorr of VTMS.

Introduction

The aim of the present work is to demonstrate that the approach of using a growth inhibitor in chemical vapor deposition (CVD) of copper is a very successful means to achieve perfect selectivity. The working hypothesis is that the inhibitor suppresses the nucleation stage on the SiO$_2$, however, the result stands without knowledge of the microscopic mechanism(s). Previously it has been shown that VTMS acts as a growth inhibitor in Cu CVD unto Cu using the precursor Cu(hfac)VTMS and that VTMS acts as an agent to control the Cu film morphology [1]. Here, it is shown that co-flowing inhibitor during growth completely eliminates the nucleation and growth of any Cu on a thermal SiO$_2$ surface while depositing a smooth Cu film on air exposed Ru.

Experiment

Selective CVD experiments are carried out in a cold wall CVD reactor described in detail elsewhere [2]. In-situ spectroscopic ellipsometry (SE) is used to determine the onset of nucleation and steady state growth by monitoring the SE data at a particular wavelength as has been described in earlier studies [3]. Ex-situ measurements are done by Atomic Force Microscopy (AFM), Rutherford Backscattering Spectroscopy (RBS) and Scanning Electron Microscopy (SEM). The growth-surface is air-exposed e-beam evaporated Ru, a candidate diffusion barrier material which shows good Cu wettability [4]. The non-growth surface is SiO$_2$ on Si(100), a typical dielectric in microelectronics. The growth temperature is 100° C. or 180° C., the partial pressure of precursor Cu(hfac)VTMS is 0.1 mTorr (process also works for lower precursor pressure, 0.04 mTorr), the partial pressure of growth inhibitor VTMS is 0.5-4 mTorr, and the growth time is 10 min or 30 min. At the pressures used, gas phase reactions are negligible: all processes must occur at the film growth surface. No substrate surface pretreatment was done prior to introducing the substrate in the CVD reactor. In the present experiments, the precursor was purified so that is it free of excess VTMS as described elsewhere in detail.

Results and Discussion

First, suppression in the growth rate of Cu with co-flowing inhibitor VTMS was considered. The growth rate decreases ~4× by co-flowing VTMS compared to the precursor alone case, FIG. 14. As has been described elsewhere, the use of VTMS promotes the formation of copper films that are much smoother than those grown in the absence of VTMS [1]. Here, a co-flow of 4 mTorr of inhibitor during the growth stage gives 10 nm thick Cu film with 1.8 nm rms roughness on the air exposed Ru, FIG. 15(a) top left. For comparison, the film nucleated and grown with precursor alone, FIG. 15(a) bottom right, has larger rms surface roughness, 5.7 nm. Under the same experimental conditions, as for FIG. 15(a) bottom left, with precursor alone Cu nuclei with area density ~9×10$^8$ cm$^{-2}$ and a total of 1×10$^{15}$ Cu atoms/cm$^2$ formed on a thermal SiO$_2$ surface, FIG. 16(a) bottom left. However, when 4 mTorr of VTMS is co-flowed with the precursor, stray nucleation is completely eliminated, FIG. 16(a) top left. Height distribution analysis of AFM data, FIG. 16(b), shows that with co-flowing inhibitor the $SiO_2$ surface is, within measurement error, the same as that of the substrate. By contrast, with precursor alone there is a long tail (inset of FIG. 16(b)) which corresponds to the stray nuclei. The process is robust as the growth done with precursor alone at 180° C. on $SiO_2$ for 10 min. gives 28 nm thick Cu film (as measured by RBS) whereas co-flowing 2 mTorr of VTMS completely shuts down the nucleation and growth (as measured by RBS).

As a working mechanistic hypothesis, considering that there is no report on etching of Cu with VTMS alone, VTMS has to enter in reaction before Cu deposition, the results were interpreted on the basis of a high probability that the VTMS inhibitor serves to promote the associative desorption of adsorbed Cu(hfac) species from the $SiO_2$ surface, whereas the same mechanism is less operative on the air-exposed Ru surface [5-7]. In turn, a significant decrease in the surface coverage of Cu(hfac) on $SiO_2$ in the presence of extra VTMS makes it impossible for Cu to nucleate and grow on $SiO_2$. It is well known that the activation barrier required for the disproportionation reaction of Cu from Cu(hfac)VTMS is high on insulating surfaces compared to on metals or semiconductors, which catalyze the reaction because they facilitate charge exchange [6]. Thus Cu(hfac) on a metallic surface (air-exposed Ru surface or Cu) will disproportionate at a finite rate to afford Cu metal [8], whereas on $SiO_2$, the Cu(hfac) will recombine with the VTMS inhibitor and desorb from the surface as Cu(hfac) VTMS rather than disproportionate to nucleate or grow Cu metal. This process affords perfectly selective growth, i.e., no growth at all on $SiO_2$.

This hypothesis is consistent with the fact that when other available ligands (MHY=2-methyl-1-hexene-3-yne or DMB=3,3-Dimethyl-1-butene, which bind more strongly to Cu(hfac) compared to VTMS [9-13]) were used as growth inhibitors, suppression in the steady state growth rate was similar to that observed with co-flowing VTMS. This indicates the mechanism responsible for the suppression in growth rate is not sensitive to the identity of the ligand, within this family of ligands that are known to afford Cu growth precursors.

Conclusions

It has been demonstrated that perfectly selective deposition of Cu on air-exposed Ru vs on $SiO_2$ can be achieved by injecting the growth inhibitor VTMS along with the Cu(hfac)VTMS precursor. On the air-exposed Ru surface, co-flowing VTMS during growth decreases the growth rate of the film and makes it smoother, with respect to Cu growth using the precursor alone. By contrast, on a $SiO_2$ surface, VTMS completely shuts down the nucleation and growth of Cu. This result implies that growth inhibitors can potentially be used in the growth of other materials to achieve perfect selectivity between dielectric and semiconducting or metallic surfaces.

References

1. Shaista Babar, Luke M. Davis, Pengyi Zhang, Elham Mohimi, Gregory S. Girolami, and J. R. Abelson, "Chemical vapor deposition of copper: Use of a molecular inhibitor to afford uniform nanoislands or smooth films," *ECS Journal of Solid State Science and Technology* 3, Q79-083 (2014). [DOI: 10.1149/2.009405jss]
2. S. Jayaraman, Y. Yang, D. Y. Kim, G. S. Girolami, and J. R. Abelson, "Hafnium diboride thin films by chemical vapor deposition from a single source precursor," *Journal of Vacuum Science & Technology A* 23, 1619-25 (2005). [DOI: 10.1116/1.2049307]
3. Shaista Babar, Tian T. Li, and J. R. Abelson, "Role of nucleation layer morphology in determining the statistical roughness of cvd-grown thin films," *J. Vac. Sci. Technol. A* 32, 060601 (2014).
4. H. Kim and Y. Shimogaki, "Comparative study of cu-cvd seed layer deposition on ru and to underlayers," *Journal of the Electrochemical Society* 154, G13-G7 (2007). [DOI: 10.1149/1.2392984]
5. Shaista Babar, Luke M. Davis, Pengyi Zhang, Elham Mohimi, Gregory S. Girolami, and J. R. Abelson, "Chemical vapor deposition of copper: Use of a molecular inhibitor to afford uniform nanoislands or smooth films: Supplemental material," *ECS J. Solid State Sci. Technol.* 3, Q79-Q83 (2014). [DOI: 10.1149/2.009405jss]
6. S. K. Kwak, K. S. Chung, I. Park, and H. Lim, "Substrate and pretreatment dependence of cu nucleation by metal-organic chemical vapor deposition," *Current Applied Physics* 2, 205-11 (2002). [DOI: 10.1016/s1567-1739(02)00065-2]
7. C. L. Lin, P. S. Chen, and M. C. Chen, "Effects of the underlayer substrates on copper chemical vapor deposition," *Journal of Vacuum Science & Technology B* 20, 1111-7 (2002). [DOI: 10.1116/1.1481863]
8. Y. S. Chung, H. S. Lee, Y. S. Lee, and S. Kim, "Adsorption and chemical reaction of cu(hfac)(vtms) on cu(111)," *Surface Science* 482, 312-7 (2001). [DOI: 10.1016/s0039-6028(00)01019-0]
9. M. Joulaud, C. Angekort, P. Doppelt, T. Mourier, and D. Mayer, "Evaluation of (hfac)cu(mhy) for cucvd," *Microelectronic Engineering* 64, 107-15 (2002). [DOI: 10.1016/s0167-9317(02)00774-8]
10. M. O. Joulaud, L.; Mourier, T.; Mayer, D.; Doppelt, P, in *Proceedings-Electrochemical society*; Vol. 2 (2003), p. 1268-74
11. L. H. Dubois and B. R. Zegarski, "Selectivity and copper chemical vapor deposition," *Journal of the Electrochemical Society* 139, 3295-9 (1992). [DOI: 10.1149/1.2069070]
12. K. K. Choi and S. W. Rhee, "Effect of the neutral ligand (I) on the characteristics of hexafluoroacetylacetonate (hfac)cu(i)-I precursor and on the copper deposition process," *Thin Solid Films* 409, 147-52 (2002).
13. S. W. Rhee, S. W. Kang, and S. H. Han, "Property of hexafluoroacetylacetonatecu(i) (3,3-dimethyl-1-butene) as a liquid precursor for chemical vapor deposition of copper films,"*Electrochemical and Solid State Letters* 3, 135-7 (2000).

Example 3: Chemical Vapor Deposition of Copper: Use of a Molecular Inhibitor to Afford Uniform Nanoislands or Smooth Films Abstract This example reports a method to control the surface morphology of thin copper films during growth by chemical vapor deposition from the precursor Cu(hfac)VTMS. A molecular inhibitor—an additive that modifies the surface attachment kinetics but does not decompose and contribute impurity atoms to the film—is added during the nucleation and/or growth stages of the film. Here we show that the reaction byproduct VTMS can serve as such an inhibitor. If the inhibitor is added during the nucleation stage, when bare substrate surface is still exposed, the inhibitor greatly reduces the rate of coalescence and promotes the formation of a large density of uniformly-sized copper islands. Alternatively, if the film is allowed to nucleate in the absence of the inhibitor, subsequent addition of the inhibitor leads to a continuous copper film that is remarkably smooth on the nm scale.

Introduction

Copper is used in many advanced nanoscale technologies due to its high electrical and thermal conductivity, and its strong surface plasmon resonance when in the form of nanoparticles[1-5]. For continuous films, such as those used as the seed layer for electrodeposition in integrated circuits, the film must be less than 10 nm thick, pinhole-free, and extremely smooth, with an rms roughness of less than 1 nm. For optical devices based on copper nanoparticles, it is important to control the nanoparticle size and morphology[4,6]. Rigorous control of copper growth can be difficult: the surface energy of copper is high and the atomic diffusion rate is significant, so that dewetting often occurs during growth or subsequent annealing[7-12].

Thin films of copper can be deposited by a wide variety of techniques including wet chemical growth, physical vapor deposition, chemical vapor deposition (CVD) and atomic layer deposition (ALD). To deposit copper conformally in substrate architectures such as trenches and vias that have re-entrant or high aspect ratio features, ALD and CVD are preferred techniques because of the ability of the precursor molecules to diffuse throughout the structure[13-17]. A general difficulty arises when the substrate is relatively unreactive, such as an oxide surface: the resulting films tend to be rough owing to a combination of sparse nucleation and the tendency of the deposited material to agglomerate[18]. Once surface roughness on the length scale of the island separation is formed, it cannot be eliminated by the overgrowth of more material[18].

The use of additives to enhance film smoothness is well established in the electrochemical deposition of copper[19,20] but is not common in CVD. For CVD, the morphology of copper films can sometimes be improved by adding a second component to the growth gas. For example, addition of $H_2O$ to a flux of Cu(hfac)VTMS (hfac=hexafluoroacetylacetonate and VTMS=vinyltrimethylsilane) enhances the wettability of the surface and results in the deposition of smoother copper films[21-25]. Unfortunately, the addition of water tends to increase the resistivity of the film because copper oxides are also deposited[21, 22, 26]. Thus, this approach is not suitable for applications that require very thin (<10 nm) copper films with high electrical conductivities, although it can be useful for making thicker films by employing water only during the nucleation stage[27]. Addition of iodine to a flux of Cu(hfac)VTMS enables bottom up filling of deep features due to the surface segregation and catalytic effects of iodine[28-33].

Improved nucleation density and morphology of copper films can also be achieved by employing process variations such as plasma enhanced CVD (or ALD) and pulsed CVD. For example, a surface rms roughness as low as 1.1 nm has been reported by using plasma enhanced ALD[34]. Alternatively, the morphology can be improved by depositing a Cu phase that wets the substrate, such as $Cu_3N$ or CuON, and then chemically converting the phase to Cu metal[35,36]. Thin films with ~1 nm surface roughness have been reported by this method. In high aspect ratio or convoluted structures, however, pulsed processes are limited by the time constant for gas diffusion, and plasma-enhanced processes are limited by the rapid consumption of active species during wall collisions.

As a result, it would be desirable to develop morphology-controlling additives for copper growth that operate in steady-state and that do not change the film composition. Such additives would enable the uniform coating of any feature. Here, we report such a method to control copper film morphology—ranging from uniformly islanded to extremely smooth—by co-flowing a growth inhibitor molecule along with the well-known copper precursor Cu(hfac)(VTMS).

Selection of Growth Inhibitor

This work builds on previous findings that the conformality of other materials, such as metal diborides, grown by low temperature CVD can be improved by adding a molecular inhibitor to the flux of precursor species[14,18]. The inventors' have been able to identify inhibitors able to control the morphology of copper thin films by taking into account the following considerations:

1. The inhibitor should be able to bind strongly enough to the surface to affect the rate of film nucleation and/or the rate of film growth on itself, often by a site blocking mechanism. The film morphology will be modified according to the relative effect on the kinetic rates of nucleation vs. growth. If the growth rate can be reduced relative to the nucleation rate, as in the deposition of $HfB_2$ on $SiO_2$ substrates[18], then the surface will "fill in" with a large density of small nuclei and will coalesce with extremely low surface roughness. Conversely, if the nucleation rate is suppressed relative to the growth rate, then the film will consist of a lower density of larger nuclei (islands).

2. After coalescence of the nuclei has occurred, the inhibitor should bind to the film surface well enough to reduce the sticking coefficient of the precursor, and thus reduce the rate at which the film roughens with increasing thickness. This result derives from the known effect that reducing the effective sticking coefficient of the precursor tends to homogenize the arrival rate of precursor on all surfaces[15,18]. That reduces the instability of the surface morphology to perturbations such as high spots, which would otherwise "shadow" the precursor flux from neighboring areas and grow at a faster rate. A reduction in the sticking coefficient of the precursor also enhances the conformality (step coverage) of the film on high aspect ratio or convoluted structures.

3. The inhibitor should desorb back to the gas phase without decomposition on the surface, such that all possible growth sites are ultimately made available and the surface is not contaminated (or rendered unreactive) by the inhibitor or its fragments. An attractive choice as inhibitor is a neutral byproduct of the CVD process: if high purity thin films can be deposited from the precursor then the decomposition rate of byproducts on the surface must be slow relative to their desorption rate. For example, the inventors have previously shown that the addition of dme (1,2-dimethoxyethane) to a flux of $Ti(BH_4)_3$(dme) slows the growth rate of $TiB_2$ without changing the composition of the deposited film[14]. For an inhibitor that is contained in the precursor, the mechanism could be either site blocking or an increase in the associative desorption rate of precursor, as expected for a dynamic equilibrium[16]. An alternative approach is to employ an inhibitor that is chemically unrelated to the precursor. An example of this approach is the addition of $NH_3$ to the precursor $Hf(BH_4)_4$ for the deposition of $HfB_2$[18]. Mechanistically, an unrelated inhibitor probably acts by blocking surface reactive sites[16,17].

The byproduct VTMS was identified as an excellent choice for the inhibitor (and thus smoothing agent) for copper deposition from the precursor Cu(hfac)VTMS. VTMS is known to bind to Cu with reasonable energies (criteria 1 & 2) and to desorb without decomposition (criterion 3)[37,38].

The use of VTMS in Cu CVD has previously been reported in two respects. First, it enhances the lifetime of the Cu(hfac)VTMS precursor[39,40], which tends to decompose when stored, depositing Cu on the container walls and generating both VTMS and Cu(hfac)$_2$, which accumulate in the container. Presumably, this decomposition is why commercial sources of Cu(hfac)VTMS intentionally contain 10-20% copper(II) and likely contain significant amounts of free VTMS[41]. An earlier means to suppress the decomposition rate was to add excess VTMS to the source (e.g., Schumacher "Blend 2504")[40]. Secondly, there is one phenomenological report that adding 5 wt % VTMS to Cu(hfac)(VTMS) produced deposits with a particulate morphology on TiN surfaces, but relatively smooth films on a copper substrate[22]. However, those films were much thicker (about a micron thick), and no attempt was made to explain the origin of the results. Here, it is shown that VTMS modifies surface kinetics and can afford control of morphology. The use of VTMS as a stabilizer implies that other results may have been influenced by the surface kinetics.

Experimental Section

All films are deposited in a custom-built turbopumped high vacuum chamber described in detail previously[42]. The substrate is heated radiatively with a tungsten filament; the substrate temperature is measured with a K-type thermocouple clamped on top of the mounting platen. A reference thermocouple at the back of heating stage is also used to monitor the temperature. Optical properties are measured by in-situ ellipsometry performed with fixed incident angle of 70° and continuous spectrum of photon energies in the range of 0.75-5.05 eV.

The growth of copper films from Cu(hfac)(VTMS) is carried out on air-exposed e-beam evaporated Ru, a candidate diffusion barrier material which shows good Cu wettability[43]. Growth is done without any pretreatment of the substrate surface. The growth temperature is 100° C., partial pressure of Ar carrier gas is 1 mTorr, and the partial pressure of the Cu(hfac)VTMS precursor is 0.1 mTorr. At these pressures, gas phase collisions are negligible: all processes must occur at the film growth surface. In the present experiments, the precursor is purified so that it is free of excess VTMS as judged by 1H NMR spectroscopy (further details on the substrate surface and precursor composition are given in the supplementary material).

Results and Discussion

Formation of Islands

After the RuO$_x$ substrate is exposed for 1 min to the Cu(hfac)(VTMS) precursor in the absence of added VTMS, the density of initial copper nuclei determined by AFM is somewhat sparse, N~4.7×10$^{10}$ cm$^{-2}$ (not shown). The initial rms surface roughness due to the nuclei, 0.6 nm, is large enough to promote roughening when additional copper is deposited. For example, for a 75 nm thick copper film the rms surface roughness is 5.7 nm (FIG. 17).

Significantly different behavior is seen if growth from Cu(hfac)VTMS is carried out with a co-flow of VTMS. Notably, the incubation time for nucleation increases from ~25 sec using the precursor alone to 5 min with co-flowing VTMS (FIG. 22). The total amount of deposited Cu, measured by RBS, is reduced by a factor of six compared with growth without inhibitor for the same growth times. These results indicate clearly that VTMS is serving as an inhibitor.

After being grown for 30 min in the presence of VTMS, the copper deposit consists of islands with an areal density N~5×10$^{10}$ cm$^{-2}$, essentially identical to the density of nuclei in the absence of VTMS (FIG. 23). The height distribution is narrow and the rms roughness is 2 nm (FIG. 23a). A similar morphology was obtained under the same conditions for a 45 min growth time; thus, although this morphology is not in steady state, it is easy to reproduce experimentally. Similar results are also obtained for precursor pressures within the range 0.05-0.10 mTorr, and growth temperatures between 100 and 120° C. The morphology degrades at higher temperatures: e.g., for T=150° C. and a growth time of 10 min, the density of nuclei has lowered to ~1.3×10$^{10}$ cm$^{-2}$, the height distribution is broader, and the rms surface roughness has more than doubled to 4.4 nm.

It was not possible to deduce from the present data what factor(s) control the absolute density of Cu islands on the air-exposed Ru surface, but it is possible that a pre-existing density of surface defects, which may be a function of the surface preparation, accounts for the observed island density[27, 44-46]. The effect of the VTMS inhibitor on copper growth is very distinct from that of NH$_3$ on growth of HfB$_2$ on SiO$_2$ from Hf(BH$_4$)$_4$, in which the density of nuclei increased continuously with time[18]. Evidently, in the latter system, nucleation is not directed by surface defects.

Additional factors may influence the Cu island morphology, including the surface diffusion of Cu atoms, which ultimately leads to dewetting; and the degree to which added VTMS affects the surface transport and reaction rate of Cu(hfac) adspecies.

Similar film morphologies and rate suppressions are seen when 2-methyl-1-hexen-3-yne (MHY) is employed as the inhibitor instead of VTMS (FIGS. 27 and 28). Both MHY and VTMS can bind to copper; the analogous compound Cu(hfac)(MHY) is a known CVD precursor for copper thin films[47].

The lengthening of the incubation time, the factor of six slowing of the net deposition rate, and the slow change in surface morphology with growth time suggest that VTMS is inhibiting both Cu nucleation on RuO$_x$, and Cu deposition on Cu. Consistent with this view, the inventors have separately measured the effect of VTMS on the steady state growth of copper on copper films, and find that the rate is reduced by a factor of four.

Formation of Ultra-Smooth Films

Alternatively, VTMS can promote the growth of copper films that are much smoother than those grown in the absence of VTMS. This result can be achieved by first initiating growth using the precursor alone for 1 minute to deposit nuclei with an areal density of ~4.7×10$^{10}$ cm$^{-2}$ and a rms roughness of ~0.6 nm. Additional copper is then deposited in the presence of 1 mTorr of VTMS. A 13.5 nm thick film produced in this manner has a rms surface roughness of only 1.4 nm (FIG. 18b). Four-point probe measurements (after exposure to air) indicate a sheet resistance of 1.9Ω/□, which is sufficient to serve as the seed layer for copper electroplating in microelectronics fabrication. For comparison, growth of similarly thick film without the inhibitor has a significantly larger rms surface roughness, 2.8 nm, and a similar sheet resistance (FIG. 19).

Rate Model of Inhibition Effect

As mentioned earlier, the steady state growth rate of copper decreases as a function of VTMS pressure, FIG. 20. Interestingly, the rate does not fall towards zero, but tends towards a saturated rate of ~0.3 nm/min for VTMS pressures above 1 mTorr. Similar behavior was found[48] for the growth of TiB$_2$ using the inhibitor dme, a component of the precursor Ti(BH$_4$)$_3$(dme). The incomplete inhibition can be explained in a kinetic model that takes into account the competitive adsorption equilibria for precursor and for VTMS together with the saturation of available surface sites (FIG. 20).

The equilibrium approximation for Cu growth from Cu(hfac)VTMS considers that the local equilibria corresponding to Eq. 1, 2, 3 and 5 are fast but that the disproportionation reaction (Cu deposition) corresponding to Eq. 4 is slow, which is consistent with the reported literature for metallization from Cu(hfac)VTMS. Desorption of VTMS and of Cu(hfac)$_2$ is known to be facile[37,38].

$$Cu(hfac)L_g \longleftrightarrow Cu(hfac)L_{ads} \quad (1)$$

$$L_g \longleftrightarrow L_{ads} \quad (2)$$

$$Cu(hfac)L_{ads} \longleftrightarrow Cu(hfac)_{ads} + L_{ads} \quad (3)$$

$$2Cu(hfac)_{ads} \rightarrow Cu + Cu(hfac)_{2ads} \quad (4)$$

$$Cu(hfac)_{2\,ads} \longleftrightarrow Cu(hfac)_{2g} \quad (5)$$

The functional form of the Cu growth rate vs. inhibitor pressure can be obtained by adding the assumption that the inhibitor coverage is limited to a maximum surface concentration [VTMS]$_{max}$. This in turn limits the inhibitor effect, such that the growth rate is finite at high inhibitor pressure. This is certainly not the only possible model that is capable of fitting the data; however, it is the simplest and most physically obvious model the inventors are aware of that rationalizes the experimental observations and requires no additional mechanisms. The fitting parameters α and β correspond to the desorption activation energy of VTMS from the Cu growth surface and the saturated growth rate, respectively.

$$GR = \frac{GR_{max}}{\left(1 + \frac{\beta}{\left(1 + \frac{1}{\alpha \times P}\right)}\right)}$$

$$GR_{max} = k_r \times Cu(I)_{tot} \text{ and } \beta = \frac{[(VTMS)_{max}]}{K_{eq}}$$

At $P = 0$, $GR = GR_{max}$; at $P = \infty$, $GR = \frac{GR_{max}}{(1+\beta)}$ $$E_d = (k_B T) \times \ln\left(\left(\frac{\alpha \times N_s \times v}{\delta}\right) \times \sqrt{2\pi m k_B T}\right)$$

$E_d$ = Desorption energy, $\delta$ = sticking co-efficient $N_s$ = adsorption site density A first estimate of β can be made from the ratio of experimentally measured $GR_{max}$ to $GR_{satu}$. Using α=1.4 from the fit, δ=0.05 from the experiment, and assuming $N_s$=10$^{19}$ m$^{-2}$ and v=10$^{12}$ Hz, the VTMS desorption energy $E_d$~0.75 eV is estimated. The reported values for VTMS desorption are 0.61 to 0.65 eV[38]. This is comparable to the estimate considering that the values of the constants influence the desorption activation energy as kT times their natural logarithm, hence, a factor of 10 uncertainty in the constants would change the estimate by 0.1 eV.

Plasmonic Effects

Control of Cu morphology on the nanoscale has technical importance because copper exhibits plasmonic peaks in the optical energy range <2 eV. The symmetry of the plasmonic peak is a sensitive function of the micromorphology (FIG. 21): Cu islands grown in the presence of co-flowing VTMS on top of the nucleation layer (blue); Cu islands nucleated and grown in the presence of VTMS (red); and an array of Cu islands produced by nanosphere lithography (black, adapted from Ref. 4). Cu islands fabricated by coflowing VTMS show a sharp and symmetric peak at λ~764 nm (red curve) as measured by in-situ ellipsometry. The peak is broader than the reported data for Cu nanoparticles fabricated by nanosphere lithography[4], but no patterning at all has been used in the present case. The data also shows that the islands are isolated: when the islands are coalesced, e.g., by growing on top of initially deposited Cu nuclei (blue curve), the peak shape is no longer symmetric. Thus, the control of morphology via the inhibitor may potentially enable the synthesis of plasmonic surfaces without the use of lithography.

Conclusions

This Example has demonstrated that VTMS serves as a growth inhibitor for copper CVD from the Cu(hfac)VTMS precursor. On air-exposed Ru substrates, the VTMS affects the rates of nucleation and of steady state growth. Use of the VTMS inhibitor during the nucleation stage leads to the growth of discrete Cu islands with a relatively uniform size distribution. By contrast, nucleation in the absence of inhibitor, followed by growth with a co-flow of the inhibitor, affords continuous films with a rms roughness of <2 nm. The former could be of interest in the production of textured films for photonic applications; the latter could be useful for the deposition of very thin and very smooth copper films for use in the microelectronics industry.

References

1. D. B. Pedersen and S. Wang, *Journal of Physical Chemistry C*, 111, 17493 (2007).
2. ITRS, The International Technology Roadmap for Semiconductor, in (2012).
3. M. D. Susman, Y. Feldman, A. Vaskevich and I. Rubinstein, *Chemistry of Materials*, 24, 2501 (2012).
4. G. H. Chan, J. Zhao, E. M. Hicks, G. C. Schatz and R. P. Van Duyne, *Nano Letters*, 7, 1947 (2007).
5. N. C. Lindquist, P. Nagpal, K. M. McPeak, D. J. Norris and S. H. Oh, *Reports on Progress in Physics*, 75, 036501 (2012).
6. I. El-Kady, M. M. Sigalas, R. Biswas, K. M. Ho and C. M. Soukoulis, *Physical Review B*, 62, 15299 (2000).
7. C. V. Thompson, in *Annual Review of Materials Research*, Vol 42, D. R. Clarke Editor, p. 399 (2012).
8. D. J. H. J. Connolly, S. Rushworth, I. Povey, R. Nagle, M. Pemble, P. Ma, in *ALD 2013, 13th International Conference on Atomic Layer Deposition*, p. 227, San Diego, Calif. (2013).
9. P. R. Gadkari, A. P. Warren, R. M. Todi, R. V. Petrova and K. R. Coffey, *Journal of Vacuum Science & Technology A*, 23, 1152 (2005).
10. R. Saxena, M. J. Frederick, G. Ramanath, W. N. Gill and J. L. Plawsky, *Physical Review B*, 72, 115425 (2005).
11. N. Alshwawreh, M. Militzer and D. Bizzotto, *Journal of Electronic Materials*, 39, 2476 (2010).
12. S. Simoes, R. Calinas, M. T. Vieira, M. F. Vieira and P. J. Ferreira, *Nanotechnology*, 21, 145701 (2010).
13. C. L. Lin, P. S. Chen, Y. C. Lin, B. Y. Tsui and M. C. Chen, *Journal of the Electrochemical Society*, 150, C451 (2003).
14. N. Kumar, A. Yanguas-Gil, S. R. Daly, G. S. Girolami and J. R. Abelson, *Journal of the American Chemical Society*, 130, 17660 (2008).
15. G. S. Bales and A. Zangwill, *Journal of Vacuum Science & Technology A*, 9, 145 (1991).
16. A. Yanguas-Gil, N. Kumar, Y. Yang and J. R. Abelson, *Journal of Vacuum Science & Technology A*, 27, 1244 (2009).
17. A. Yanguas-Gil, Y. Yang, N. Kumar and J. R. Abelson, *Journal of Vacuum Science & Technology A*, 27, 1235 (2009).

18. S. Babar, N. Kumar, P. Zhang and J. R. Abelson, *Chemistry of Materials*, 25, 662 (2013).
19. W. U. Schmidt, R. C. Alkire and A. A. Gewirth, *Journal of the Electrochemical Society*, 143, 3122 (1996).
20. M. A. Pasquale, L. M. Gassa and A. J. Arvia, *Electrochimica Acta*, 53, 5891 (2008).
21. A. Jain, T. T. Kodas, T. S. Corbitt and M. J. Hampden-Smith, *Chemistry of Materials*, 8, 1119 (1996).
22. A. K. M. Zhang, T. Koide, A. Sekiguchi, O. Okada, and N. Hosokawa, *IEEE International Conference*, p. 170 San Francisco, Calif. (1999).
23. S. Yamamoto, K. Andersson, H. Bluhm, G. Ketteler, D. E. Starr, T. Schiros, H. Ogasawara, L. G. M. Pettersson, M. Salmeron and A. Nilsson, *Journal of Physical Chemistry C*, 111, 7848 (2007).
24. J. Y. Kim, Y. K. Lee, H. S. Park, J. W. Park, D. K. Park, J. H. Joo, W. H. Lee, Y. K. Ko, P. J. Reucroft and B. R. Cho, *Thin Solid Films*, 330, 190 (1998).
25. T. Momose and Y. Shimogaki, *Japanese Journal of Applied Physics Part 1-Regular Papers Brief Communications & Review Papers*, 45, 8618 (2006).
26. Y. S. Tue Nguyen, M. Kobayashi, L. J. Charneski, S. T. Hsu, EP 0, 989, 203 A1 (2000).
27. D. Yang, J. Hong, D. F. Richards and T. S. Cale, *Journal of Vacuum Science & Technology B*, 20, 495 (2002).
28. D. Josell, D. Wheeler and T. P. Moffat, *Electrochemical and Solid State Letters*, 5, C44 (2002).
29. E. S. Hwang and J. Lee, *Electrochemical and Solid State Letters*, 3, 138 (2000).
30. T. Y. Chang, J. J. Tze and D. S. Tsai, *Applied Surface Science*, 236, 165 (2004).
31. Y. Au, Y. B. Lin and R. G. Gordon, *Journal of the Electrochemical Society*, 158, D248 (2011).
32. S. G. Pyo, *Metals and Materials International*, 14, 767 (2008).
33. D. Josell, S. Kim, D. Wheeler, T. P. Moffat and S. G. Pyo, *Journal of the Electrochemical Society*, 150, C368 (2003).
34. L. Wu and E. Eisenbraun, *Electrochemical and Solid State Letters*, 11, H107 (2008).
35. H. Kim, H. B. Bhandari, S. Xu and R. G. Gordon, *Journal of the Electrochemical Society*, 155, H496 (2008).
36. Z. W. Li and R. G. Gordon, *Chemical Vapor Deposition*, 12, 435 (2006).
37. G. S. Girolami, P. M. Jeffries and L. H. Dubois, *Journal of the American Chemical Society*, 115, 1015 (1993).
38. Y. S. Chung, H. S. Lee, Y. S. Lee and S. Kim, *Surface Science*, 482, 312. (2001).
39. J. A. T. Norman, D. A. Roberts, A. K. Hochberg, P. Smith, G. A. Petersen, J. E. Parmeter, C. A. Apblett and T. R. Omstead, *Thin Solid Films*, 262, 46 (1995).
40. S. G. Ling Chen, C. Marcadal, S. Wilson, B. Zheng, U.S. Pat. No. 6,110,530 (2000).
41. shop.gelest.com/Product.aspx?catnum=AKC252.8&Index=0&TotalCount=31.
42. S. Jayaraman, Y. Yang, D. Y. Kim, G. S. Girolami and J. R. Abelson, *Journal of Vacuum Science & Technology A*, 23; 1619 (2005).
43. H. Kim and Y. Shimogaki, *Journal of the Electrochemical Society*, 154, G13 (2007).
44. H. Over, Y. D. Kim, A. P. Seitsonen, S. Wendt, E. Lundgren, M. Schmid, P. Varga, A. Morgante and G. Ertl, *Science*, 287, 1474 (2000).
45. K. A. Perrine and A. V. Teplyakov, *Langmuir*, 26, 12648 (2010).
46. S. K. Kwak, K. S. Chung, I. Park and H. Lim, *Current Applied Physics*, 2, 205 (2002).
47. M. Joulaud, C. Angekort, P. Doppelt, T. Mourier and D. Mayer, *Microelectronic Engineering*, 64, 107 (2002).
48. N. Kumar, Ph.D Thesis (2009).

Supplementary Material

Experimental Details

The substrate is a Ru film, 5.3 nm thick, air exposed on top of 300 nm of thermally grown $SiO_2/Si(100)$. A high resolution XPS spectrum indicates that air-exposed Ru is in the stable oxide form, $RuO_2$.

$^1H$ NMR spectra of the precursor are obtained on a Varian Unity-400 spectrometer at 9.4 T. Chemical shifts are reported in $\delta$ units (positive shifts to higher frequency) relative to TMS.

VTMS is purchased from Gelest, distilled in house and stored under argon before use. MHY is purchased from Alfa Aesar, distilled in house and stored under argon before use. The pale yellow liquid precursor Cu(hfac)VTMS is prepared by a literature route[1], and handled and stored under argon or in vacuum. Source containers are loaded in an argon-filled glove box.

Purity of prepared Cu(hfac)VTMS. Comparing the integrated resonances corresponding to the hfac proton at $\delta$ 6.15 in $C_6D_6$, the vinyl protons at $\delta$ 3.9-4.2, and the trimethylsilyl protons at $\delta \sim 0.05$ suggests that free VTMS is typically $\leq 2$ mole %. The error between the vinyl and trimethylsilyl integrations is itself typically ca. 2 mole %. Other impurities, primarily the purification solvent pentane, are $\leq 1$ mole %.

FIG. 22 provides a plot showing in-situ ellipsometry for qualitative detection of the nucleation stage: (top) precursor alone; (bottom) with co-flowing inhibitor. With co-flowing inhibitor incubation time increased from ~25 sec to ~5 min.

FIG. 23 shows AFM images (top) (1×2) microns in size showing initial Cu islands on the $RuO_x$ substrate as a function of VTMS pressure in mTorr: (a) 0.0; (b) 0.2; (c) 0.4; (d) 1.0; and a plot (bottom) showing aerial density of Cu islands vs. VTMS pressure extracted from the AFM data:

FIG. 24 shows a plot of Cu growth kinetics vs. $P_{VTMS}$, $T_{sub}$=100° C., $P_{pre}$~0.12 mTorr. Growth of initial islands, where the growth was halted after 20 min. and the drop in the amount of deposited material is 5.5× for 1 mTorr of VTMS compared to nucleation using the precursor alone. Bottom: steady state growth rate of copper.

FIG. 25 shows a plot of downstream quadrupole mass spectroscopy data of an experiment in which the alternative neutral ligand MHY was injected through a separate gas line with the Cu(hfac)VTMS precursor, $T_{sub.}$=160° C. Under essentially molecular flow conditions, the mixed molecule Cu(hfac)MHY is detected; in the absence of gas phase collisions, it must have formed via surface association of Cu(hfac) with MHY.

FIG. 26 shows SEM images of: (a) Cu islands grown in the presence of 4 mTorr VTMS on top of initially deposited Cu nuclei, which affords a total deposit of 9.8 nm; (b) Cu islands nucleated and grown in the presence of 2 mTorr VTMS, which affords a total deposit of 8.2 nm; and (c) the height distribution functions derived from AFM data. $T_{sub}$=100° C., $t_{growth}$=30 min., $P_{prec}$=0.1 mTorr.

FIG. 27 shows a plot of the effect of different inhibitors on the growth rate of islands as measured by RBS. 'PV' is the precursor Cu(hfac)VTMS and 'PM' is the precursor Cu(hfac)MHY. The substrate surface is 30 nm air exposed, e-beam deposited copper; $T_{sub}$=150° C.

FIG. 28 shows a plot of AFM derived Cu island density vs. the type of inhibitor molecule. The substrate surface is 30 nm air exposed, e-beam deposited copper; $T_{sub}$=150° C., $t_{growth}$=5 min., $P_{inhibitor}$=2 mTorr.

Comparison of Different Ligand Groups. For all (precursor, inhibitor) combinations, the growth rate decreases with co-flowing inhibitor. It was not possible to deduce from the data set of FIG. 27 which microscopic rate(s) are responsible for the observed trends.

References

1. K.-M. S. Chi, H.-K; Hampden-Smith, M. J.; Kodas, T. T., *Inorg. Syn.* 31, 289 (1997).

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components and method steps set forth in the present description. As will be obvious to one of skill in the art, methods and devices useful for the present methods can include a large number of optional composition and processing elements and steps. In addition, the steps of a method according to the invention can be carried out in any order, simultaneously or sequentially.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individually or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Many of the molecules disclosed herein contain one or more ionizable groups [groups from which a proton can be removed (e.g., —COOH) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this invention for a given application. In specific applications, the selection of a given anion or cation for preparation of a salt may result in increased or decreased solubility of that salt.

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when compositions of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element, elements, limitation or limitations which is/are not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method for selectively forming a layer on a substrate, the method comprising:
    (a) providing the substrate having a receiving surface with at least one conductive portion and at least one insulating portion;
    (b) contacting the receiving surface of the substrate with a precursor gas, wherein accommodation of the precursor gas by the substrate results in formation of nuclei of deposited material on the conductive portion of the receiving surface of the substrate;
    (c) contacting the nuclei on the conductive portion of the receiving surface with the precursor gas; wherein accommodation of the precursor gas by the nuclei, the substrate or both the nuclei and the substrate results in growth of the nuclei at a growth rate; and
    (d) contacting the nuclei, the substrate or both the nuclei and the substrate with an inhibitor agent, wherein accommodation of the inhibitor agent by the nuclei, the substrate or both the nuclei and the substrate provides for selective formation of the layer on the conductive portion of the substrate and the growth rate being at least 100 times faster on the conductive portion than on the insulating portion; wherein:
    step (d) is capable of being performed independently of step (b);
    a partial pressure of said inhibitor agent above said receiving surface is greater than a partial pressure of said precursor gas above said receiving surface by a factor greater than or equal to 5; and
    when said partial pressure of said inhibitor agent above said receiving surface is less than or equal to 2 mTorr, said receiving surface has a temperature less than or equal to 180° C.

2. The method of claim 1, wherein said precursor gas and said inhibitor agent are simultaneously contacted with said receiving surface of said substrate.

3. The method of claim 1, wherein said nuclei are selectively formed by a disproportionation reaction occurring on said conductive portion but not on said insulating portion of said substrate.

4. The method of claim 1, wherein said receiving surface has a temperature selected from the range of 50° C. to 400° C.

5. The method of claim 1, wherein said layer is a contiguous layer or a discontinuous layer.

6. The method of claim 1, wherein the conductive portion comprises a conductive metal oxide.

7. The method of claim 6, wherein said conductive portion has a formula of $M_yO_x$, where M is selected from the group consisting of Ru, Ti, In, Sn, Zn or combinations thereof and x and y are numbers selected from 1 to 3.

8. The method of claim 7, wherein a ratio of y:x is selected from 1:1 to 1:3.

9. The method of claim 6, wherein said conductive metal oxide portion comprises a compound selected from the group consisting of $RuO_2$, $TiO_2$, $In_2O_3$, $SnO_2$, ZnO and combinations thereof.

10. The method of claim 6, wherein said conductive metal oxide portion is prepared by oxidation of a metal layer formed on said insulating portion of the substrate.

11. The method of claim 1, wherein said conductive portion has a thickness selected from the range of 0.1 nm to 1000 nm.

12. The method of claim 1, wherein said conductive portion covers less than or equal to 99.5% of said receiving surface.

13. The method of claim 1, wherein said conductive portion is formed on said substrate via a process selected from the group consisting of physical vapor deposition, chemical vapor deposition, atomic layer deposition, electrochemical deposition, photolithography, shadow masking, ion beam etching, chemical etching and combinations thereof.

14. The method of claim 1, wherein said conductive portion is characterized by a conductivity greater than 100 S/m.

15. The method of claim 1, wherein said conductive portion comprises a thin film structure.

16. The method of claim 1, wherein said insulating portion is an oxide, a nitride or combinations thereof.

17. The method of claim 1, wherein said insulating portion comprises $SiO_2$ or $SiO_xC_y$, where x is a number between 1 and 2 and y is a number between 0 and 1.

18. The method of claim 17, wherein said $SiO_2$ comprises thermal $SiO_2$ or porous, carbon-doped $SiO_2$, or both.

19. The method of claim 1, wherein said insulating portion of the substrate is prepared by thermal oxidation or nitridation of a silicon wafer.

20. The method of claim 1, wherein said insulating portion has a thickness selected from the range of 0.1 nm to 1 mm.

21. The method of claim 1, wherein said insulating portion is characterized by a conductivity less than 100 S/m.

22. The method of claim 1, wherein said conductive portion and said insulating portion are in direct physical contact, direct thermal contact or direct electrical contact.

23. The method of claim 1, wherein said conductive portion and said insulating portion are in indirect physical contact, indirect thermal contact or indirect electrical contact.

24. The method of claim 1, wherein said conductive portion and said insulating portion are side-by-side.

25. The method of claim 1, wherein said conductive portion is disposed on a surface of said insulating portion.

26. The method of claim 1, wherein the precursor gas has a net sticking coefficient with respect to accommodation on the nuclei, and wherein accommodation of the inhibitor agent by the nuclei, the conductive portion of the substrate or both the nuclei and the conductive portion of the substrate results in a decrease of the net sticking coefficient of the precursor gas with respect to accommodation on the nuclei by a factor greater than or equal to 1.1.

27. The method of claim 1, wherein the precursor gas has a partial pressure less than or equal to 1000 mTorr.

28. The method of claim 1, wherein the precursor gas has a partial pressure selected from the range of 0.1 mTorr to 10 mTorr.

29. The method of claim 1, wherein the precursor gas comprises Cu(hfac)(vtms), Cu(hfac)(MHY), iron complexes, titantium complexes, magnesium complexes, silver complexes and combinations thereof.

30. The method of claim 1, wherein a growth rate of said layer decreases as a function of a partial pressure of said inhibitor agent.

31. The method of claim 1, wherein the inhibitor agent has a partial pressure less than or equal to 1000 mTorr.

32. The method of claim 1, wherein the inhibitor agent has a partial pressure selected from the range of 0.1 mTorr to 10 Torr.

33. The method of claim 1, wherein said inhibitor agent is a neutral molecule.

34. The method of claim 1, wherein said inhibitor agent is selected from the group consisting of VTMS, MHY, DMB and combinations thereof.

35. The method of claim 1, wherein the inhibitor agent and the precursor gas are a combination selected from the group consisting of:
VTMS and Cu(hfac)(VTMS);
MHY and Cu(hfac)(VTMS);
VTMS and Cu(hfac)(MHY);
MHY and Cu(hfac)(MHY); and
combinations thereof.

36. The method of claim 1, wherein said layer is an electrical conductor.

37. The method of claim 1, wherein said layer comprises a metal.

38. The method of claim 37, wherein said metal is selected from the group consisting of copper, ruthenium, titanium, $TiN_x$, $TaN_x$, $HfB_2$ and combinations thereof.

39. The method of claim 1, wherein said layer is a metal.

40. The method of claim 39, wherein said metal is selected from the group consisting of copper, ruthenium, titanium and combinations thereof.

41. The method of claim 1, wherein the layer has a surface roughness (rms) selected from the range of 0.1 nm to 10 nm.

42. The method of claim 1, wherein the layer is a conformal or superconformal thin film.

43. The method of claim 1, wherein the layer has a thickness less than or equal to 1000 nm.

44. The method of claim 1, wherein the layer has a thickness selected from the range of 0.1 nm to 1000 nm.

45. The method of claim 1, wherein the layer is a diffusion barrier in an electronic device.

46. The method of claim 1, wherein the layer is substantially free of pinholes.

47. The method of claim 1, wherein said substrate comprises a plurality of relief features.

48. The method of claim 1, further comprising the step of contacting the substrate, the nuclei or both with at least one additional inhibitor agent, at least one additional precursor gas or both.

49. The method of claim 1, wherein accommodation of the inhibitor agent by the nuclei, the conductive portion of the substrate or both the nuclei and the conductive portion of the substrate decreases the growth rate of the nuclei sufficiently such that the formation, growth and coalescence of additional nuclei on the conductive portion of the receiving surface of the substrate generates the layer.

50. The method of claim 1, wherein accommodation of the inhibitor agent by the nuclei, the conductive portion of the substrate or both the nuclei and the conductive portion of the substrate decreases the growth rate of the nuclei by a factor of at least 1.1 relative to a growth rate of the nuclei in the absence of the inhibitor agent.

51. The method of claim 1, wherein the step of exposing the substrate to the precursor is carried out for a duration selected from the range of 1 second to 1 hour.

52. The method of claim 1, wherein the step of contacting the receiving surface is initiated without any pretreatment of the substrate.

53. A method for selectively forming a Cu layer on a substrate, the method comprising:
(a) providing the substrate having a receiving surface with at least one $RuO_x$ portion and at least one $SiO_2$ portion, wherein x is 1-3;
(b) contacting the receiving surface of the substrate with Cu(hfac)VTMS gas, wherein accommodation of the Cu(hfac)VTMS gas by the substrate results in formation of Cu nuclei on the $RuO_x$ portion of the substrate;
(c) contacting the Cu nuclei on the $RuO_x$ portion of the substrate with the Cu(hfac)VTMS gas; wherein accommodation of the Cu(hfac)VTMS gas by the Cu nuclei, the $RuO_x$ portion of the substrate or both the Cu nuclei and the $RuO_x$ portion of the substrate results in growth of the Cu nuclei at a growth rate; and
(d) contacting the Cu nuclei, the $RuO_x$ portion of the substrate or both the Cu nuclei and the $RuO_x$ portion of the substrate with VTMS gas, wherein accommodation of the VTMS gas by the Cu nuclei, the $RuO_x$ portion of the substrate or both the Cu nuclei and the $RuO_x$ portion of the substrate results in selective formation of the Cu layer on the $RuO_x$ portion of the substrate; wherein:
step (d) is capable of being performed independently of step (b);
a partial pressure of said inhibitor agent above said receiving surface is greater than a partial pressure of said precursor gas above said receiving surface by a factor greater than or equal to 5; and
when said partial pressure of said inhibitor agent above said receiving surface is less than or equal to 2 mTorr, said receiving surface has a temperature less than or equal to 180° C.

54. The method of claim 1, wherein step (d) is started after step (b) is started.

55. The method of claim 53, wherein step (d) is started after step (b) is started.

56. The method of claim 1, wherein said accommodation of the inhibitor agent by the nuclei, the substrate or both the nuclei and the substrate provides for a nucleation delay of said nuclei on said insulating portion of at least 30 minutes.

57. The method of claim 1, wherein said accommodation of the inhibitor agent by the nuclei, the substrate or both the nuclei and the substrate provides for an increase in a nucleation delay of said nuclei on said insulating portion by a factor of at least 60 compared to said nucleation delay in absence of step (d).

58. The method of claim 53, wherein said accommodation of the VTMS gas by the Cu nuclei, the $RuO_x$ portion of the substrate or both the Cu nuclei and the $RuO_x$ portion of the substrate provides for a nucleation delay of said Cu nuclei on said $SiO_2$ portion of at least 30 minutes.

59. The method of claim 53, wherein said accommodation of the VTMS gas by the Cu nuclei, the $RuO_x$ portion of the substrate or both the Cu nuclei and the $RuO_x$ portion of the substrate provides for an increase in a nucleation delay of said Cu nuclei on said $SiO_2$ portion by a factor of at least 60 compared to said nucleation delay in absence of step (d).

* * * * *